(12) United States Patent
Tsuji et al.

(10) Patent No.: US 7,112,967 B2
(45) Date of Patent: Sep. 26, 2006

(54) CIRCUIT BASED TESTING APPARATUS AND METHOD FOR TESTING A CIRCUIT BOARD

(75) Inventors: Yoshio Tsuji, Kyoto (JP); Masayoshi Yamada, Shiga-cho (JP)

(73) Assignee: Nidec-Read Corporation, Kyoto (JP)

(*) Notice: Subject to any disclaimer, the term of this patent is extended or adjusted under 35 U.S.C. 154(b) by 0 days.

(21) Appl. No.: 10/918,425

(22) Filed: Aug. 16, 2004

(65) Prior Publication Data
US 2005/0017729 A1    Jan. 27, 2005

Related U.S. Application Data

(62) Division of application No. 10/076,458, filed on Feb. 19, 2002, now Pat. No. 6,777,949.

(30) Foreign Application Priority Data

Feb. 19, 2001 (JP) ............... 2001-42356
Apr. 10, 2001 (JP) ............... 2001-111132
Apr. 10, 2001 (JP) ............... 2001-111133

(51) Int. Cl.
*G01R 31/00* (2006.01)
*G01R 31/302* (2006.01)
*G01R 31/305* (2006.01)

(52) U.S. Cl. ............... 324/501; 324/750; 324/751
(58) Field of Classification Search ........... 324/501, 324/750, 751, 752, 713, 46
See application file for complete search history.

(56) References Cited

U.S. PATENT DOCUMENTS

| | | | |
|---|---|---|---|
| 4,578,279 A | 3/1986 | Zingher | 427/10 |
| 4,967,152 A | 10/1990 | Patterson | 324/752 |
| 5,517,110 A | 5/1996 | Soiferman | 324/158.1 |
| 5,781,017 A | 7/1998 | Cole et al. | 324/751 |
| 5,999,005 A | 12/1999 | Fujii et al. | 324/750 |
| 6,369,590 B1 | 4/2002 | Cugini et al. | 324/752 |
| 6,369,591 B1 | 4/2002 | Cugini et al. | 324/752 |

FOREIGN PATENT DOCUMENTS

| | | |
|---|---|---|
| EP | 0 264 481 A | 4/1988 |
| EP | 0 424 270 A | 4/1991 |
| EP | 1 022 573 A | 7/2000 |
| EP | 1 109 029 A | 6/2001 |
| JP | 8-278342 A | 10/1996 |
| JP | 3080158 B2 | 6/2000 |

*Primary Examiner*—Vincent Q. Nguyen
*Assistant Examiner*—John Teresinski
(74) *Attorney, Agent, or Firm*—Smith Patent Office

(57) ABSTRACT

A circuit board testing apparatus for testing continuity and/or short-circuit of wirings formed on a circuit board, includes an electromagnetic wave irradiator which irradiates first terminals of the wirings with an electromagnetic wave so that electrons are discharged from the first terminals by photoelectric effect. Discharged electrons are trapped by an electrode which is electrically biased to have a higher potential than that of the second terminals of the wirings, thereby causing an electric current to flow through the wirings via the electrode. Existence of open-circuit and/or short-circuit of the wirings is judged based on the current flowing the wirings.

19 Claims, 26 Drawing Sheets

FIG. 10
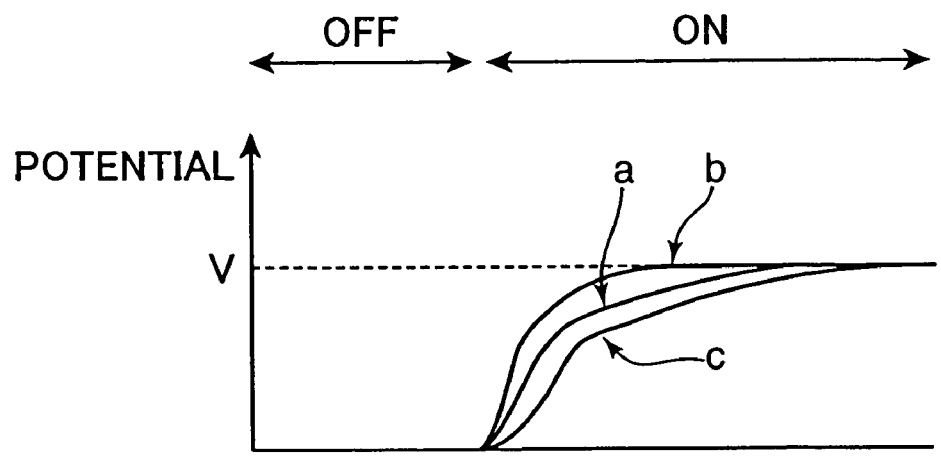
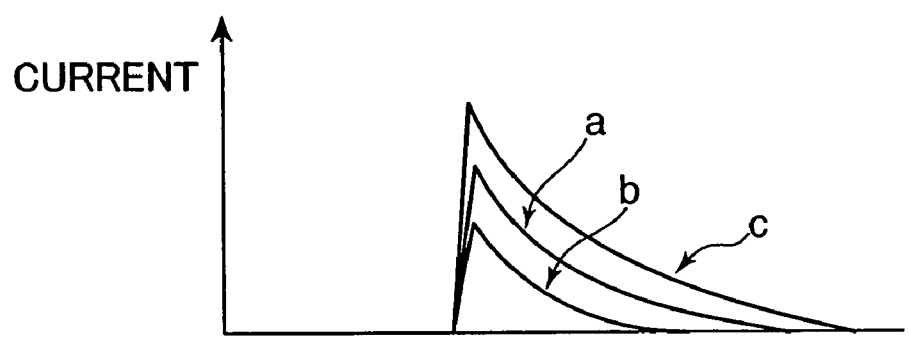
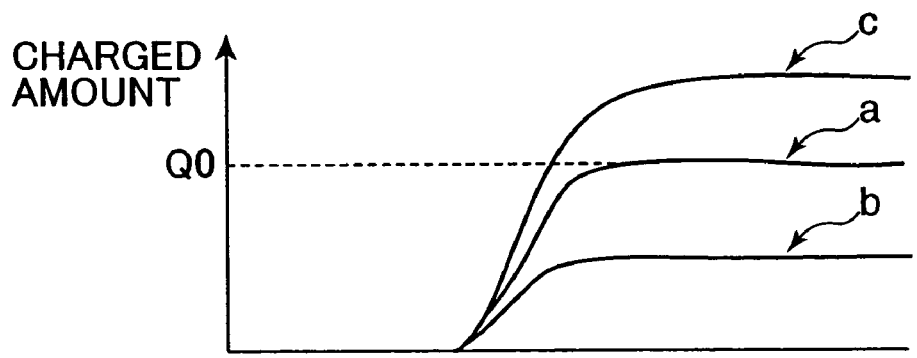

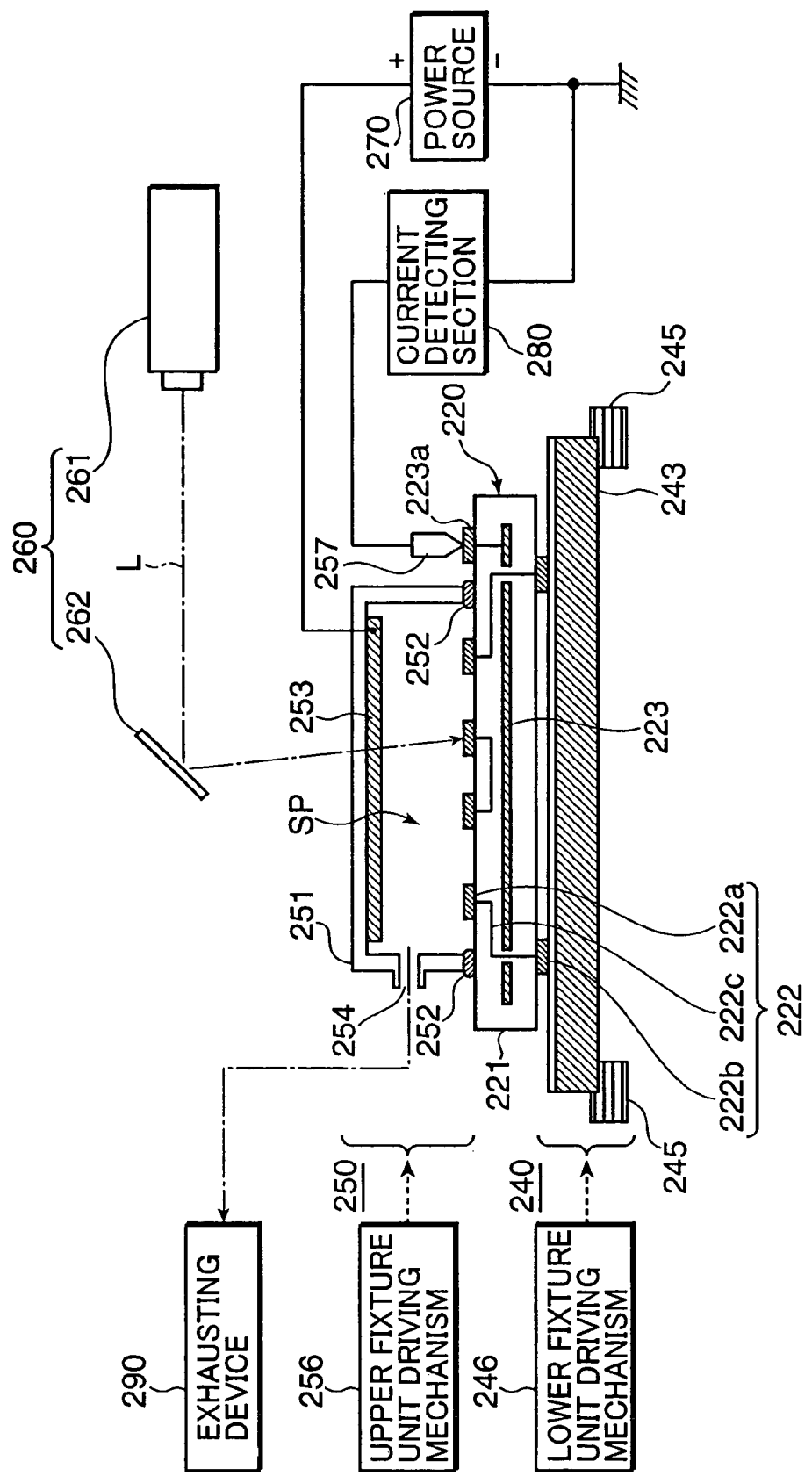

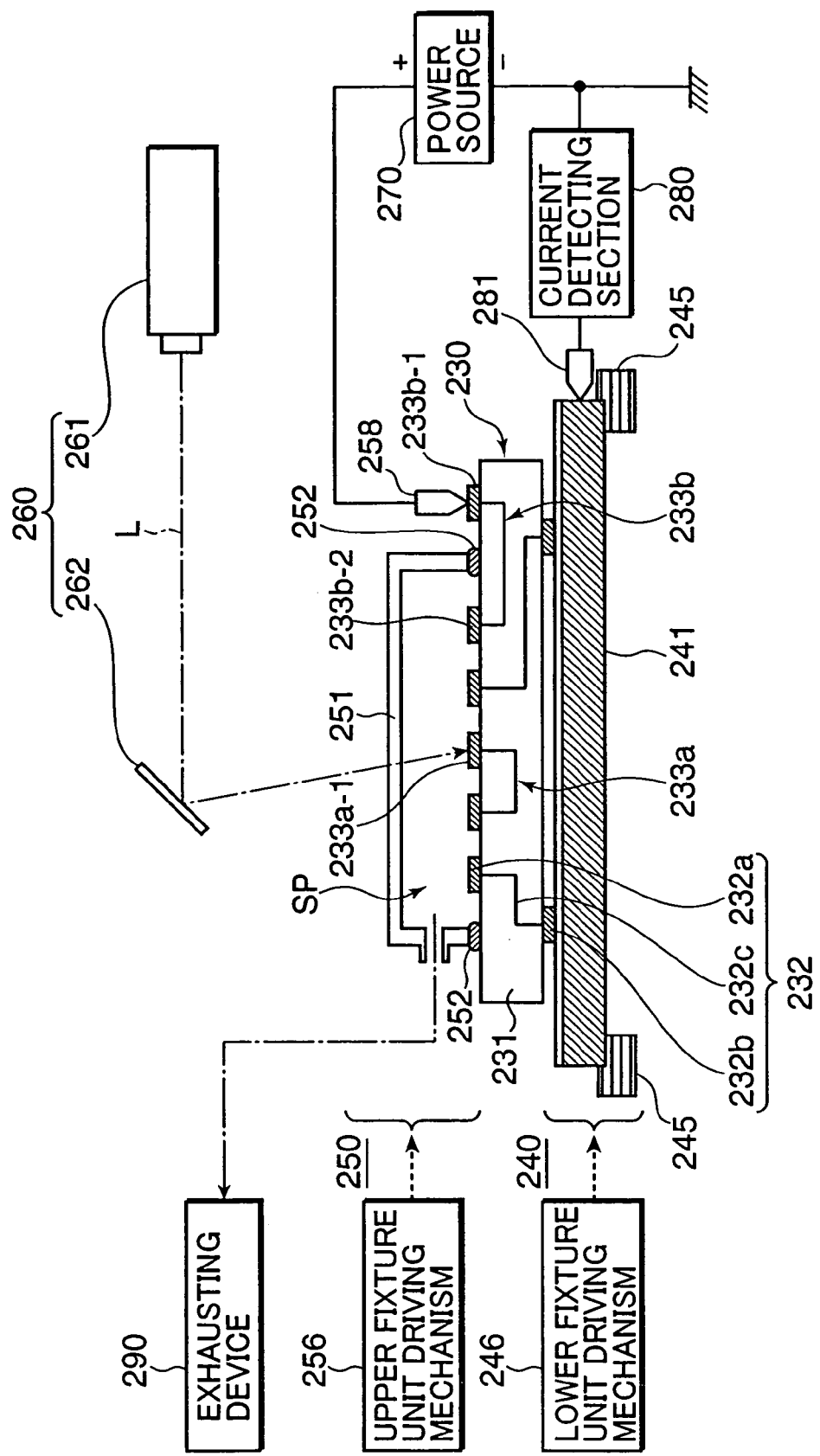

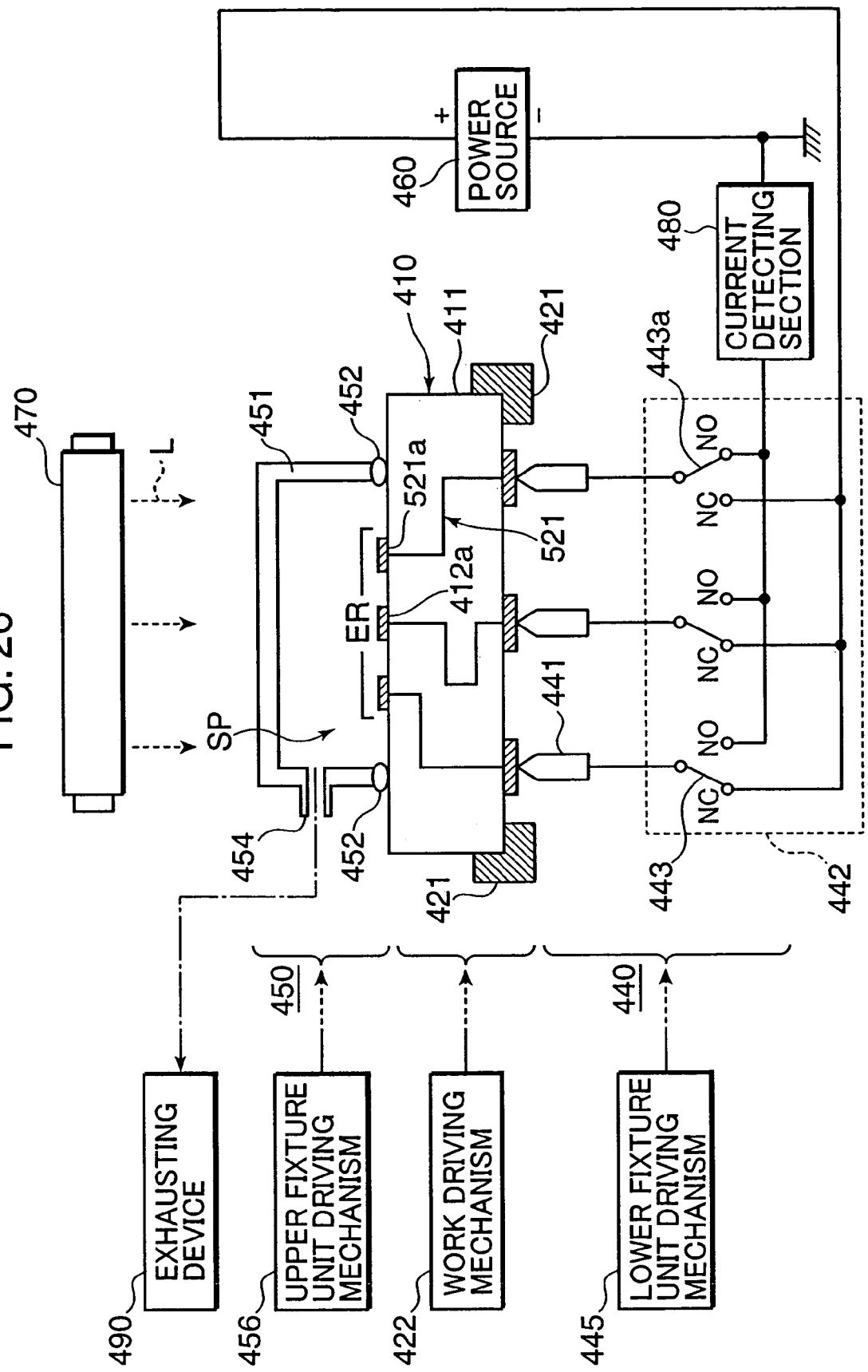

CIRCUIT BASED TESTING APPARATUS AND METHOD FOR TESTING A CIRCUIT BOARD

CROSS REFERENCE TO RELATED APPLICATIONS

This application is a divisional of U.S. patent application Ser. No. 10/076,458 filed on Feb. 19, 2002, which issued on Aug. 17, 2004 as U.S. Pat. No. 6,777,949. This application is incorporated herein by reference.

BACKGROUND OF THE INVENTION

This invention relates to a circuit board testing apparatus and method for testing such electric state as continuity, open-circuit, short-circuit, of a number of wirings formed on a circuit board.

It should be appreciated that this invention is applicable to testing of electric state of wirings formed on any of a variety of circuit boards or substrates such as printed circuit boards, flexible circuit boards, multi-layer circuit boards, glass substrates for use in liquid crystal display or plasma display panels, and film carriers for use in semiconductor packages, and that the term "circuit boards" as used in this specification may be any of these variety of boards.

Circuit boards are formed with a wiring pattern by a number of wirings thereon. There have been proposed a number of testing apparatus to test whether the wiring pattern has been formed as designed. Recent trend of making small-sized and light-weighted electronic devices necessitates arranging a wiring pattern in a complex manner in a small area. Thus, it is difficult to test open-circuits and short-circuits of wirings by direct contact of probes with the circuit board. Therefore, there has been proposed a contactless testing apparatus to test electric state of a wiring pattern such as open circuit without causing direct contact of probes with a minute conductive pad.

For example, Japanese Patent No. 3080158 discloses this type of apparatus which is adapted for testing an open or short-circuit of a wiring formed on a circuit board. In the apparatus, specifically, an electromagnetic wave is irradiated onto a pad connected to each wiring of a circuit pattern formed on a circuit board to thereby cause discharge of electrons from the pad owing to photoelectric effect. The open or short-circuit of the wiring is tested based on an electric current which is caused by discharged electrons to run into a ground (GND) plane or external metallic plate capacitively coupled.

Japanese Unexamined Patent Publication No. 8-278342 discloses a printed board testing apparatus which detects electrons discharged in a space owing to photoelectric effect to test continuity or open-circuit of wirings of the printed board. Specifically, an electric charge sensor and an electromagnetic wave generator are movably provided above the printed board with a specified gap or distance therebetween. The electric charge sensor and the electromagnetic wave generator are relatively moved over the printed board to scan discharged electrons. The electric state of wirings are judged based on detected changes of the electric current.

The aforementioned conventional arts are suffered from the following drawbacks. In the conventional art, an electromagnetic wave is merely irradiated onto a pad or wirings. Electrons which are discharged owing to photoelectric effect upon irradiation are returned to the pad and wirings, or dispersed in the space without being utilized for the testing.

Further, discharged electrons form a spatial charge region, and lower the electron discharging efficiency of the photoelectric effect. Even if electrons are discharged instantaneously owing to photoelectric effect, accordingly, current flowing in the ground plate or external metallic plate cannot be measured with reliability. Thus, it is difficult to accomplish stable and precise test efficiency.

In the apparatus of Japanese Unexamined Patent Publication No. 8-278342, further, the electric charge sensor and the electromagnetic wave generator are moved relatively to the printed board to scan discharged electrons, which consequently increases the size of the apparatus. It will be seen that in the case of producing a vacuumed space between the printed board and the electric charge sensor and the electromagnetic wave generator, a larger-sized vacuuming unit is required.

SUMMARY OF THE INVENTION

It is an object of the present invention to provide a circuit board testing apparatus and testing method which are free from the problems residing in the prior art.

It is another object of the present invention to provide a circuit board testing apparatus and testing method which can judge the continuity and/or short-circuit of wirings formed on a circuit board accurately and stably.

It is still another object of the present invention to provide a circuit board testing apparatus and testing method which can assure more efficient testing of the continuity and/or short-circuit of wirings formed on a circuit board.

It is yet another object of the present invention to provide a circuit board testing apparatus which is small in size and enables test of wirings in a short time.

It is still further object of the invention to provide a circuit board testing apparatus and testing method that enables testing of wirings formed on the circuit board with the test signals being derived from the circuit board without mechanical mechanic contact at least on one side of the circuit board.

According to an aspect of the present invention, a circuit board testing apparatus is adapted for testing continuity and/or short-circuit of wirings formed on a circuit board. First terminals of the wirings are irradiated with an electromagnetic wave so that electrons are discharged from the first terminals by photoelectric effect. Discharged electrons are trapped by an electrode which is electrically biased to have a higher potential than that of the second terminals of the wirings, thereby causing an electric current to flow through the wirings via the electrode. Existence of an open-circuit and/or a short-circuit in the wirings is judged based on the current flowing the wirings. According to an embodiment of the invention, the first terminals are irradiated with the electromagnetic wave alternatively, one at a time. Also, the second terminals of the wirings are supplied with voltage one at a time. Alternatively, a voltage may be supplied to the second terminal of a wiring adjacent to a selected wiring of which first terminal is irradiated by the electromagnetic wave.

For the testing of a circuit board having wirings including a pair of terminals formed on a surface of the circuit board and an electric conductor formed on the surface of the circuit board or inside the circuit board and connected to the pair of terminals, there may be preferably provided a second electrode to be capacitively coupled to the electric conductor. The continuity of the electric conductors is judged based on a current value when the first terminal of a target wiring is irradiated and another current value when the second terminal of the target wiring is irradiated.

For the testing of a circuit board including wirings having electric conductors formed on the surface or inside of the circuit board and electrically connected to respective first and second terminals, there may be preferably provided a second electrode to be capacitively coupled to the electric conductors. The short-circuit between wirings is judged based on a current value when the one of the first terminals is irradiated and another current value when another of the first terminals is irradiated.

Alternatively, the electromagnetic wave may be collectively irradiated onto the first terminals of the wirings. In this case, it may be preferable to provide a power source having a first pole connected to the electrode and a second pole connected to the second terminal of a wiring selected for the test. The second terminals of the wirings other than the target wiring may be connected to the first pole of the power source.

Alternatively, the second terminal of a target wiring may be connected to the second pole of the power source by way of a current detector for detecting a current of the target wiring while the second terminals of the wirings other than the target wiring are connected to the second pole of the power source bypassing the current detector.

It may be preferable to enclose the first terminals of the wirings within an airtight closed space, and depressurize the closed space. The degree of depressurization is preferably $10^{-2}$ atm.

A circuit board testing apparatus or method according to the present invention provide accuracy and efficiency in the testing of the continuity and/or short-circuit of wirings on a circuit board because electrons discharged by photoelectric effect are captured by the electrically biased electrode and cause an enhanced electric current through the wirings connected with the electrode.

These and other objects, features, aspects, and advantages of the present invention will become more apparent from the following detailed description of the preferred embodiments/examples with reference to the accompanying drawings.

BRIEF DESCRIPTION OF THE DRAWINGS

FIG. 10 are graphs respectively showing changes of a potential at a wiring, a current detected by a current detecting section, and an amount of electric charges charged at a capacitor upon irradiation of an electromagnetic wave shown in FIG. 8;

FIG. 15 is a diagram showing a circuit board testing apparatus as a first modification of the second embodiment;

FIG. 16 is a diagram showing a circuit board testing apparatus as a second modification of the second embodiment;

FIG. 26 is a diagram showing a testing apparatus as a fourth modification of the third embodiment.

DETAILED DESCRIPTION OF THE PREFERRED EMBODIMENTS

Figure 1:
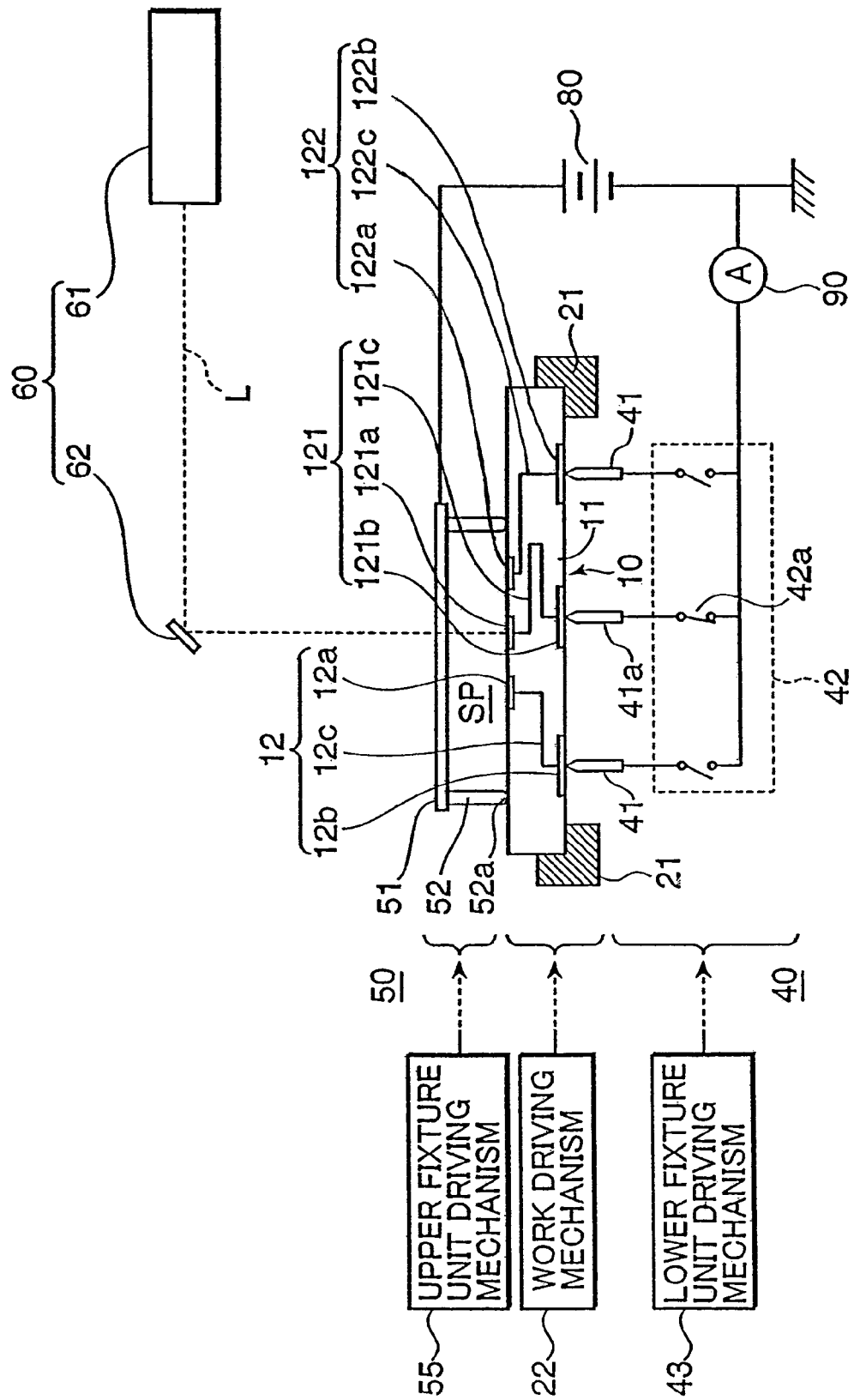
FIG. 1 is a diagram showing a circuit board testing apparatus in accordance with a first embodiment of the present invention.
Figure 2:
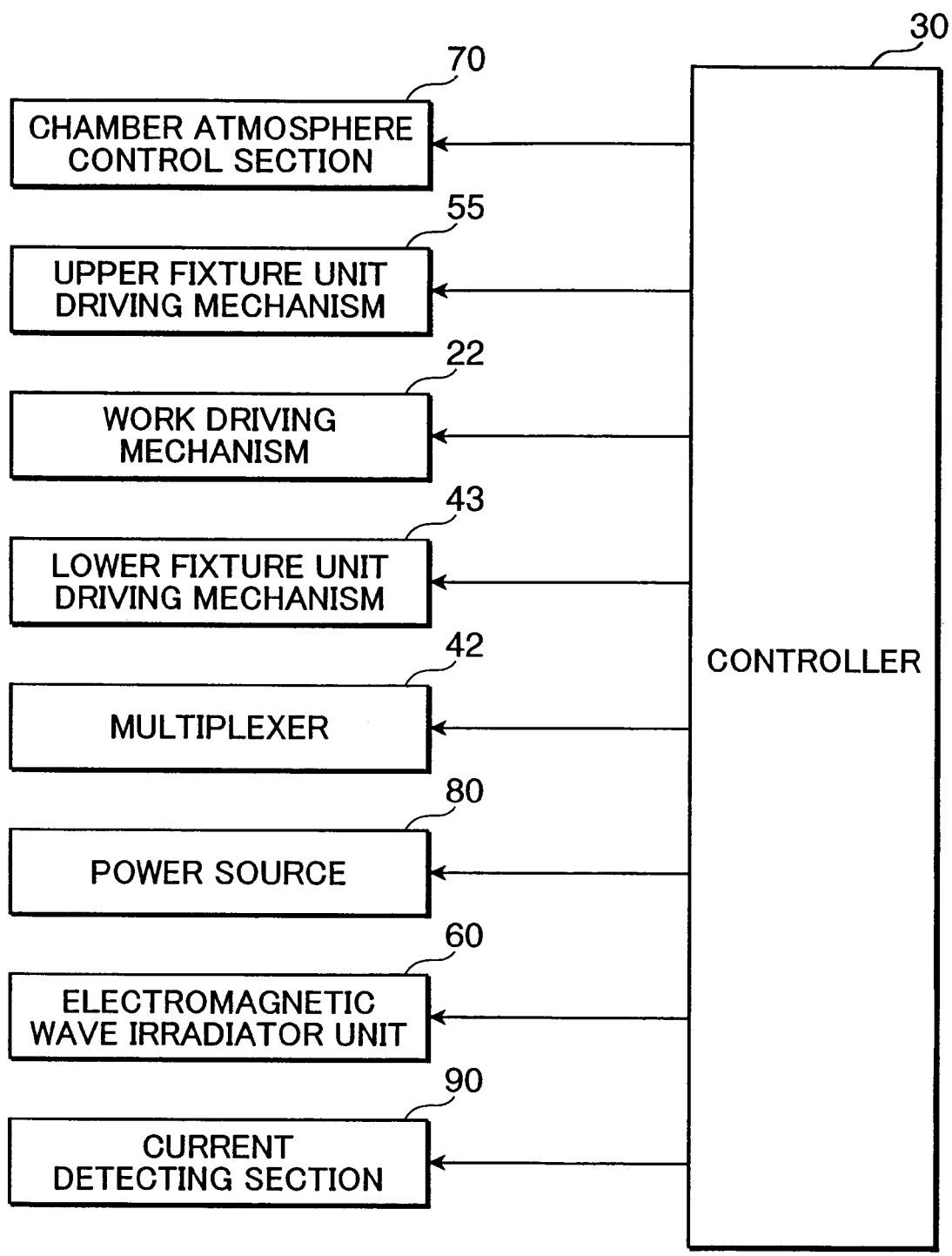
FIG. 2 is a block diagram showing an electric arrangement of the testing apparatus shown in FIG. 1.

Referring to FIGS. 1 and 2 showing a circuit board testing apparatus in accordance with a first embodiment of the invention, a circuit board testing apparatus is adapted to test a circuit board 10 on which a semiconductor chip is to be mounted according to C4 (Controlled Collapse Chip Connection) package method.

As shown in FIG. 1, the circuit board 10 is formed with a number of wirings 12, 121, 122 on a base plate 11. Each wiring 12, 121 or 122 includes a pad portion 12a, 121a or 122a which is formed on one or upper surface of the base plate 11 in correspondence to a pad portion to which a semiconductor chip is connected, a ball grid portion 12b, 121b or 122b which is formed on the opposite or bottom surface of the base plate 11, and a conductive portion 12c, 121c or 122c which extends through the base plate 11 to electrically connect the pad portion 12a, 121a or 122a and the ball grid portion 12b, 121b or 122b. (For the simplicity of explanation, description will be made from now on with reference to the pad portion 12a, ball grid portion 12b and conductive portion 12c as representative of the above mentioned pads and conductors, unless it is required to refer to other pads and conductors for particular purpose.)

The pad portions 12a are arranged at a small pitch to adapt to the pads connected to semiconductor chips, whereas the ball grid portions 12b are arranged at a larger pitch as compared with the pitch of the pad portions 12a. In this embodiment, the circuit board 10 having the above construction is referred to as a work to be tested by the apparatus. However, it is needless to say that a circuit board to be tested by the apparatus is not limited to the above mentioned type. It should be noted that although the drawing shows only three wirings for clarification, actual circuit boards are formed with a great number of wirings on the top and bottom surfaces or in the inside or on both of the two surfaces and the inside of the circuit board.

The apparatus is provided with a work holder 21 to carry one piece of a circuit board as a work 10. The work holder 21 is movable between a test position (position shown in FIG. 1) where the work 10 is tested and a load/unload position (not shown) where the work 10 is loadable to the work holder 21 or unloadable from the work holder 21. A work driving mechanism 22 drivingly reciprocates the work holder 21 back and forth between the test position and the load/unload position in accordance with a control signal from a controller 30 which controls an overall operation of the apparatus.

A lower fixture unit 40 is provided below the work 10 at the test position. The lower fixture unit 40 includes a plurality of conductive spring probes 41 which are arranged in correspondence to the ball grid portions 12b of the respective wirings 12. The lower fixture unit 40 further include a multiplexer 42, and a lower fixture base (not shown) which is movable toward and away from the work 10 while carrying the probes 41 and the multiplexer 42 thereon. The lower fixture base is coupled to a lower fixture unit driving mechanism 43. The lower fixture unit driving mechanism 43 drivingly moves the lower fixture base toward and away from the work 10 in response to a control signal from the controller 30.

An upper fixture unit 50 is provided above the work 10 at the test position. The upper fixture unit 50 includes a cap-like housing which is so configured as to cover a certain region on one surface of the work 10. The housing includes a plate electrode 51 made of a transparent electrode and shielding members 52 made of, e.g., a rubber. The upper fixture unit 50 is movable toward and away from the work 10 as an integral unit. With this arrangement, when an upper fixture unit driving mechanism 55 coupled to the upper fixture unit 50 is actuated in response to a drive command from the controller 30, the upper fixture unit 50 is moved to the work 10. When an end portion 52a of the shielding members 52 come into contact with the surface of the work 10 the shielding member deforms and abuts against the surface of the work 10 due to counter pressure. The end portion 52a serves to make airtight the enclosure surrounded by the housing 50 and the work 10. In this embodiment, the end portion 52a of the shielding member 52 itself is deformable for the sealing of the enclosure. However, this invention is not limited to this arrangement. A seal member may be provided between the shielding member 52 and the work 10 as the case may be.

An atmosphere controller 70 is operatively connected to the housing 50 to depressurize the closed space SP. When the work is tested, the closed space SP is preferably held at a vacuum degree of $10^{-2}$ atm. In the case of a vacuum degree lower than $10^{-2}$ atm, the electron discharge rate decreases. On the other hand, higher vacuum degree increases the electron discharge rate. However, a longer time is required until the closed space SP reaches a desired higher vacuum degree, consequently increasing the test time. According to experiments of the inventors, it was confirmed that sufficient photo-electrons are discharged under the pressure of $10^{-2}$ atm which can be attained in a relatively short time.

The housing 50 may preferably have such a size as to cover the region on the work 10 within which the pad portions 12a of the wiring to be tested are located. With this arrangement, the closed space SP which needs depressurization can be minimized. As a result, the apparatus as a whole can be made small, and the time required for depressurization can be shortened.

An electromagnetic wave irradiator 60 is provided in the apparatus to irradiate an electromagnetic wave onto one terminal or pad of the wiring under test, i.e. selected one of a number of wirings 12 formed on the work 12. The electromagnetic wave irradiator 60 includes an electromagnetic wave emitting section 61 which emits an electromagnetic wave L in response to an operation command from the controller 30. An electromagnetic wave scanning section 62 directs the electromagnetic wave L to a desired location on the work 10 in response to an operation command from the controller 30. According to the present embodiment, electromagnetic wave emitting section 61 is constructed so as to emit ultraviolet laser light beams having a wavelength of 266 nm. Also, the electromagnetic wave emitting section 61 is provided with an optical system to focus the laser light beams on the pad portion 12a of a target wiring 12.

In this embodiment, the electromagnetic wave emitting section 61 emits ultraviolet laser light beams for the purpose of causing the photoelectric effect. However, this invention is not limited to the arrangement of the embodiment, and visible light beams, infrared light beams or its equivalent may be used.

It is generally known that the photoelectric effect comes into being under the following condition:

Photon Energy≧Work Function Specific to Material: Energy for Discharging Electron from Material.

Thus, light energy should be given to the material to satisfy the above mentioned inequality.

The electromagnetic wave emitting section 61 is so constructed as to be driven based on a pulse signal with use of a Q switching element and the like. The electromagnetic wave scanning section 62 includes a galvanometer for the control of the direction of the electromagnetic wave.

A direct current (DC) power source 80 is provided in the apparatus to apply a potential difference or a voltage between the plate electrode 51 and the ball grid 12b as the opposite terminal of the wiring under test. According to the present embodiment, the application of a voltage in the above manner enhances capturing of the electron by the electrode 51 and enables efficient testing of the wiring by means of photo-electron caused by projection of the electromagnetic wave such as a laser beam while suppressing return and dispersion of discharged electrons and formation of a spatial space of electric charges as well as was seen in the prior arts.

Further, a current detecting section 90 is provided in a conductive circuit pathway through which a current runs from one terminal of the power source 80 to the opposite terminal thereof via the plate electrode 51 and the target wiring to detect the current running in the circuit pathway. Specifically, the plus terminal of the power source 80 is electrically connected to the plate electrode 51. The minus terminal of the power source 80 is connected to one terminal of the multiplexer 42 via the current detecting section 90, while the opposite terminal of the multiplexer 42 is connected to a number of probes 41 which are in contact with respective corresponding ball grid portions 12b of the wirings 12.

In this embodiment, when one wiring is selected from the number of wirings 12 by switching over switch portions constituting the multiplexer 42 in response to a selection command from the controller 30 with an output voltage from the power source 80 being applied between the ball grid portion 12b of the wiring under test and the plate electrode 51.

Subsequently, the electromagnetic wave irradiator 60 irradiates an electromagnetic wave L which, in turn, is projected onto the pad portion 12a of the target wiring, to thereby discharge electrons from the surface of the pad portion 12a due to photoelectric effect. The discharged electrons are electrically attracted by the plate electrode 51 aided by the voltage applied thereto. This arrangement eliminates a likelihood that electrons discharged once may be returned to the pad portion or dispersed to the other pad portion(s), or form a spatial region of electric charges, as occurred in the conventional arrangement.

In this embodiment, electrons are discharged from the surface of the pad portion 12a which is connected to the ball grid portion 12b. Accordingly, when the wiring under test is continuous and has no open-circuit portion, a conductive circuit pathway is established from the plus terminal of the power source 80 to the minus terminal of the power source 80 via the plate electrode 51, the target wiring 12, the probe 41, the multiplexer 42, and the current detecting section 90. The current detecting section 90 measures a current running in the pathway, and outputs an analog signal corresponding to the measured current. Thus, in this embodiment, the plate electrode 51 serves as an electrode portion, and the current detecting section 90 serves as a current detector.

In the embodiment mentioned above with reference to FIG. 1, one 42a of a number of switch portions constituting the multiplexer 42 is connected to the opposite terminal of the power source 80, a voltage is applied to the probe 41a connected to the switch portion 42a, and an electromagnetic wave L is projected onto a pad portion 121a connected to the probe 41a. In this case, a wiring 121 is a target wiring or wiring under test. If the wiring 121 is in a normal continuous state, a certain value of a current runs through the aforementioned conductive circuit pathway due to the electrons discharged from the surface of the pad portion 121a. On the other hand, if the wiring 121 is in a discontinuity or open-circuited, a current value detected by the current detecting section 90 is zero or exceedingly lower than a current value detected in the case where the wiring 121 is in continuity. This arrangement enables the controller 30 to determine whether the target wiring 121 is in continuity or in discontinuity based on the current detected by the current detecting section 90. Thus, in this embodiment, the controller 30 has a function of determining the state of the tested wiring as well as other various operation control function.

When an open circuit test with respect to the target wiring 121 is completed, and the connection of the switch portions is switched over to another probe. When a new target wiring is selected by the switch portions and an electromagnetic wave is projected onto a pad portion of the new target wiring, an open circuit test of the new target wiring is performed in the same manner as mentioned above. Thus, in this embodiment, the multiplexer 42 serves as a selector.

In this embodiment, the switch connection by the multiplex 42 and selective irradiation of the pad portion also enables testing of short-circuit between a pair of wirings. Here, description is made for a case where the wiring 12 provided on the left side of the work 10 in FIG. 1 is referred to as "first target wiring", and the wiring 121 provided substantially transversely in the middle of the work 10 is referred to as "second target wiring", and a test is performed as to whether there is a short-circuited portion between the wiring pair 12 and 121. In this case, for example, a middle switch portion 42a which is electrically connected to the second target wiring 121 is connected to the opposite terminal of the power source 80. An electromagnetic wave L is irradiated onto the pad portion 12a of the first target wiring 12.

Under the above mentioned condition, an electric field is generated between the plate electrode 51 and the pad portion 12a (one end) of the first target wiring 12 by application of a voltage to the plate electrode 51 and the second target wiring 121. Electrons discharged by the irradiation of the laser beam, from the pad portion 12a of the first target wiring 12 are electrically attracted by the plate electrode 51. In the case where a short-circuited portion exists between the first target wiring 12 and the second target wiring 121, a conductive pathway is established through which a current runs from the power source 80 and returns thereto via the plate electrode 51, the first target wiring 12, the short-circuited portion, and the second target wiring 121. Thus, a current running through the target wiring pair 12 and 121 is measured by the current detecting section 90.

On the other hand, in the case where the target wiring pair 12 and 121 is not in a short circuit state, the aforementioned conductive pathway is not established, and the current value detected by the current detecting section 90 is zero or exceedingly lower than the current value detected when the target wiring pair 12 and 121 is in a short circuit state. This arrangement for the detection of a current running in the target wiring pair enables efficient and stable determination whether the target wiring pair is in a short circuit state or not. Test can be performed with respect to the other wiring pairs in the similar manner as mentioned above. For instance, when the pad portion of the wiring located on the right side of the work 10 in FIG. 1 is irradiated with an electromagnetic wave L in the state shown in FIG. 1, determination is made whether there is a short-circuited portion between the second target wiring 121 and the right-side wiring.

Figure 3:
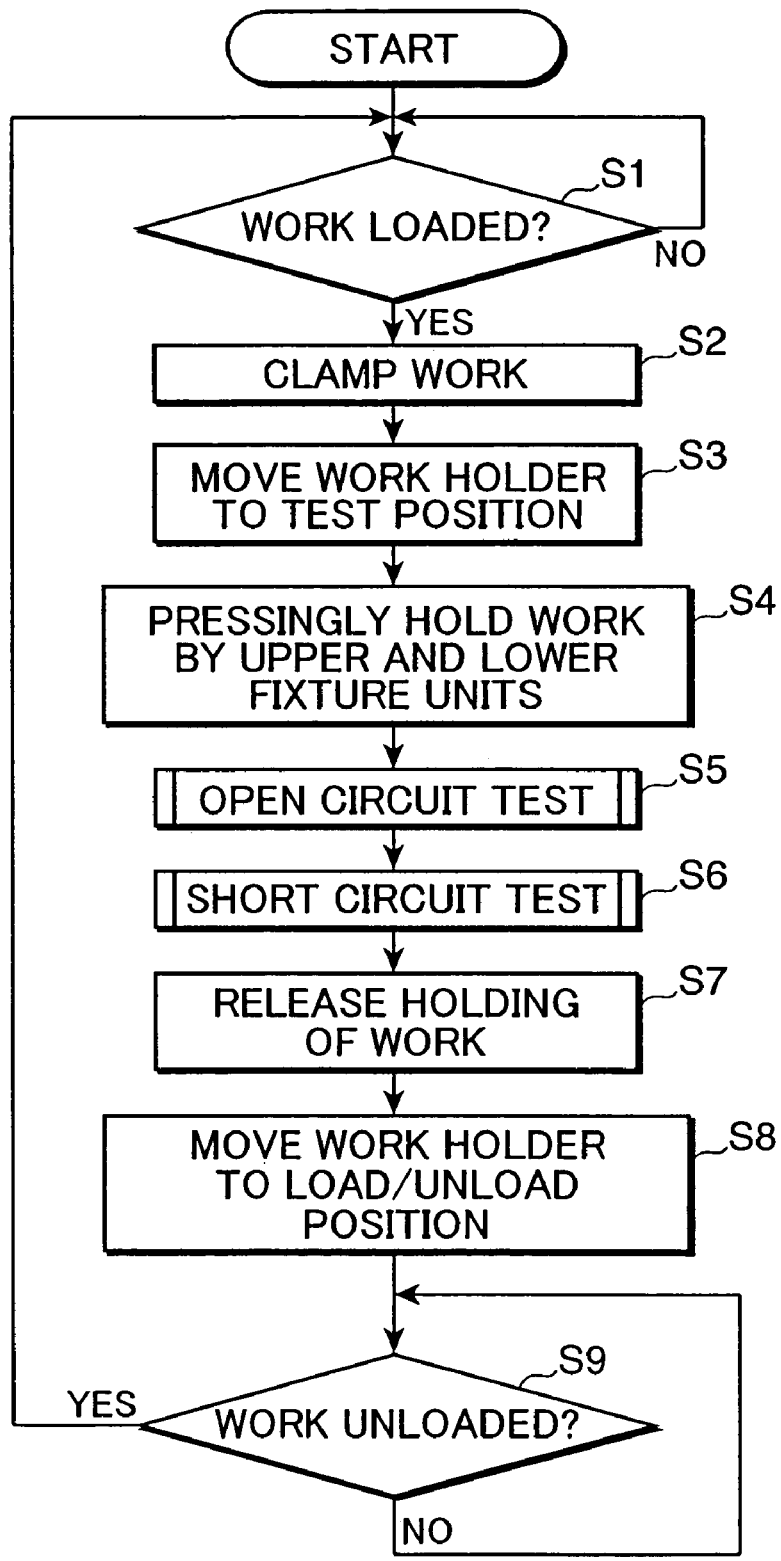
FIG. 3 is a flowchart showing operations of the testing apparatus shown in FIG. 1.

FIG. 3 is a flowchart showing an operation of the circuit board testing apparatus shown in FIG. 1. First, an untested work (circuit board) 10 is loaded onto the work holder 21 at the load/unload position by a handling device (not shown) provided in the testing apparatus or a manual operation by an operator (in Step S1). Then, the controller 30 starts to control operations of the various parts of the apparatus to execute the following steps S2 to S9 so as to test shorts and open-circuits in the work 10.

First, at Step S2, the work holder 21 clamps the work 10. The work holder 21 holding the work 10 thereon is moved to the test position (position shown in FIG. 1) where the work 10 is to be tested (Step S3). Thus, the work 10 is positioned at the test position.

Subsequently, the upper fixture unit 50 and the lower fixture unit 40 are moved to the work 10 to pressingly hold the work 10 therebetween (in Step S4). As shown in FIG. 1, when the lower fixture unit 40 is moved to the work 10 at the test position, a lead end of each of the conductive spring probes 41 is brought into pressing contact with the corresponding ball grid portion 12b of the wiring 12 to thereby electrically connect the work 10 to the lower fixture unit 40. Simultaneously, as the upper fixture unit 50 is moved to the work 10 at the test position, the housing 51 and the work 11 form an airtight closed space SP as shown in FIG. 1.

Thus, when the apparatus is set up for testing the work 10, an open circuit test (Step S5) and a short circuit test (Step S6) are implemented to test a continuity of the wirings of the work 10. These tests will be described in detail later.

Upon completion of the tests, the lower fixture unit 40 and the upper fixture unit 50 are moved away from the work 10 to release the work 10 from the fixtures (in Step S7). The work holder 21 is moved to the load/unload position to release clamping of the work 10 (in Step S8). At a final stage, upon verifying that the work 10 after the tests has been unloaded from the work holder 21 in Step S9, the routine returns to Step S1 to execute the aforementioned series of operations with another work.

Figure 4:
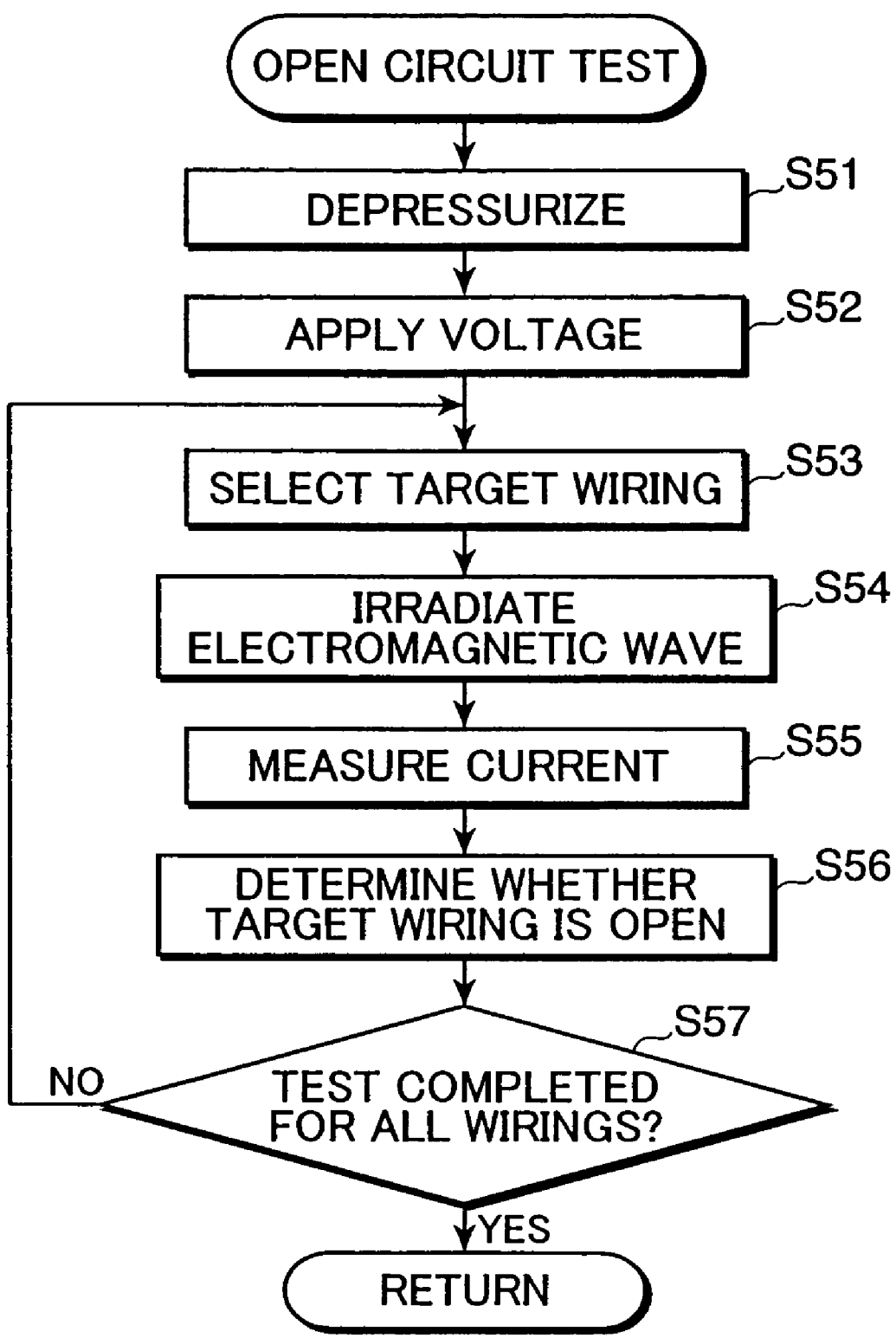
FIG. 4 is a flowchart showing operations of an open circuit testing by the testing apparatus shown in FIG. 1.
Figure 5:
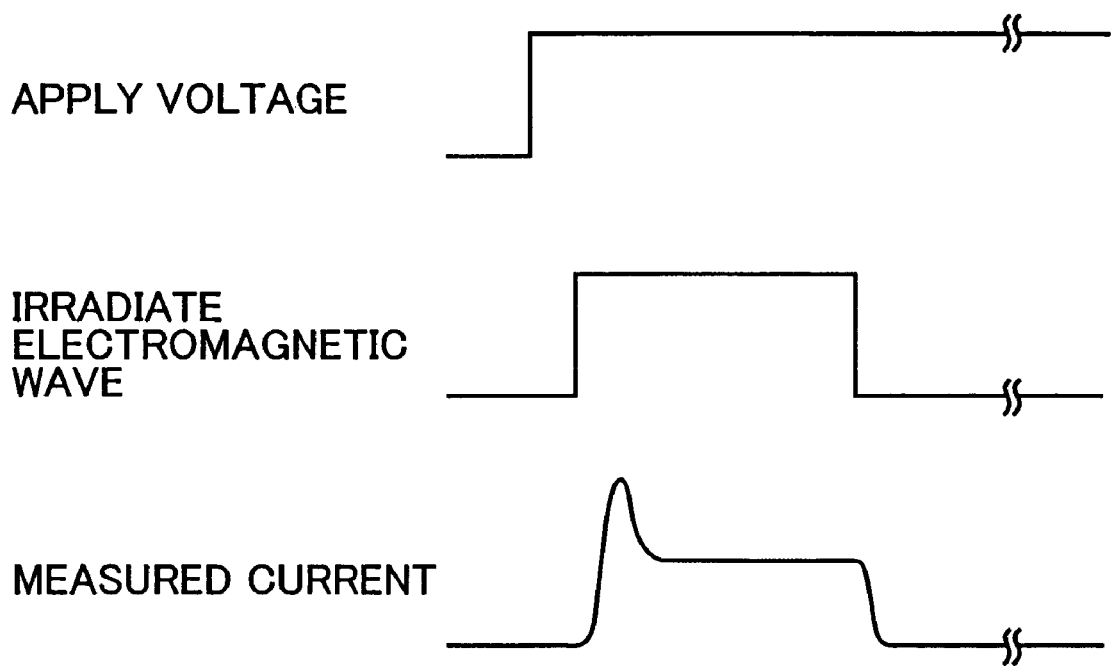
FIG. 5 is a timing chart in the open circuit test.

Next, the open circuit test (Step S5) is described in detail with reference to FIGS. 4 and 5. FIG. 4 is a flowchart showing an open circuit test to be implemented by the apparatus. FIG. 5 is a timing chart for the open circuit test.

The closed space SP secured in Step S4 is filled with air containing oxygen. If an electromagnetic wave is irradiated onto the pad portion 12*a* in the closed space SP in this state, it is highly likely that molecules in the air obstruct electrons generated by photoelectric effect from being properly discharged from the surface of the pad portion, which makes it difficult to stably measure a current due to the electrons. To avoid such a drawback, in this embodiment, the atmosphere controller 70 is activated to depressurize the interior of the housing 50 to approximately $10^{-2}$ atm in response to an operation command from the controller 30 (in Step S51).

Upon completion of depressurization, as shown in FIG. 5, the multiplexer 42 is activated in accordance with a selection command from the controller 30, and one wiring 12 (target wiring) is electrically connected to the minus output terminal of the power source 80 (in Step S53). Thus, the first target wiring is selected with the voltage of the power source 80 being applied between the electrode 51 and the ball grid of the selected wiring. Then, ultraviolet laser light in the form of pulses or another type of electromagnetic wave is irradiated onto the pad portion 12*a* of the selected wiring at a predetermined timing shown in FIG. 5 (in Step S54).

During irradiation, the current detecting section 90 measures the current which changes as shown in FIG. 5 (in Step S55). It is judged whether the target wiring is in an open circuit state or not based on the measured current value (in Step S56). A judgment regarding an open circuit can be performed merely based on presence or absence of a detected output. Preferably, however, an open circuit may be judged by comparison of a current value measured with a reference circuit board, with a current measured with the circuit board under test. A series of operations from selection of the target wiring (Step S53) to judgment regarding open circuit (Step S56) are repeated until it is judged that all the wirings have been tested in Step S57.

As mentioned above, in the testing apparatus in accordance with the first embodiment, an electric field is generated between the plate electrode 51 and the pad portion 121*a* by application of a voltage to the plate electrode 51 and the ball grid portion (opposite terminal) 121*b* of the target wiring 121. Electrons which have been discharged from one terminal of the target wiring 121 by photoelectric effect due to electromagnetic wave irradiation are electrically attracted by the plate electrode 51 aided by the existence of the electric field. With this arrangement, in the case where the target wiring 121 is in continuity, a conductive pathway is established through which a current runs from the power source 80 and returns thereto via the plate electrode 51 and the target wiring 121, and a current running through the target wiring 121 can be stably measured by the current detector.

On the other hand, in the case where the target wiring 121 is in discontinuity, the aforementioned conductive pathway is not established, and the current value detected by the current detecting section 90 is zero or exceedingly lower than the current value detected in the case where the target wiring 121 is in continuity. In this arrangement, there can be determined precisely and stably whether the target wiring 121 is in continuity by detecting a current running through the target wiring 121.

In this embodiment, the closed space SP enclosing the pad portion to be irradiated is depressurized, and molecules in the air inside the closed space SP which are liable to hinder discharge of electrons generated by photoelectric effect can be reduced. Thereby, electrons are efficiently discharged, and a stable current measurement is enabled. Further, since the housing 50 defining the closed space SP is so configured as to cover a minimal area on the work 10, the space for depressurization can be minimized, which contributes to production of a small-sized apparatus and shortening of a time required for depressurization.

In this embodiment, a conductive pathway through which a current runs from the plus terminal of the power source 80 to the minus terminal of the power source 80 via the plate electrode 51, the target wiring 12, the probe 41, the multiplexer 42, and the current detecting section 90 is established, and a judgment as to whether the target wiring is in an open circuit state is made by measuring a change of current running through the conductive pathway. In other words, since the testing apparatus is so constructed as to establish a conductive circuit pathway, a current value can be measured stably.

Further, in this embodiment, a transparent electrode is used as the plate electrode 51. This arrangement is advantageous in the following point. An electromagnetic wave can be irradiated onto the pad portion of the target wiring even if the plate electrode 51 is provided high above the target wiring because the electromagnetic wave passes through the transparent electrode 51 and is irradiated onto the pad portion. In view of the above, in this embodiment, the plate electrode 51 can be disposed closer to the pad portion 121*a* of the target wiring 121, and electrons discharged from the pad portion 121*a* upon irradiation can be securely trapped by the plate electrode 51 to thereby secure a more stable test.

Furthermore, in this embodiment, since the plate electrode 51 has such a shape as to cover a group of wirings to be tested, the following effects can be obtained. Specifically, this arrangement does not need to transversely move the plate electrode 51 to match with the location of the target wiring, and allows an electromagnetic wave to pass through the plate electrode 51 and irradiate onto the target wiring while fixing the plate electrode 51. This arrangement enables one to simplify the construction of the upper fixture unit 50 and the upper fixture unit driving mechanism 55 and shorten a test time. Further, since the plate electrode 51 constitutes a portion of the housing 50, the number of parts constituting the apparatus can be lessened.

Figure 6:
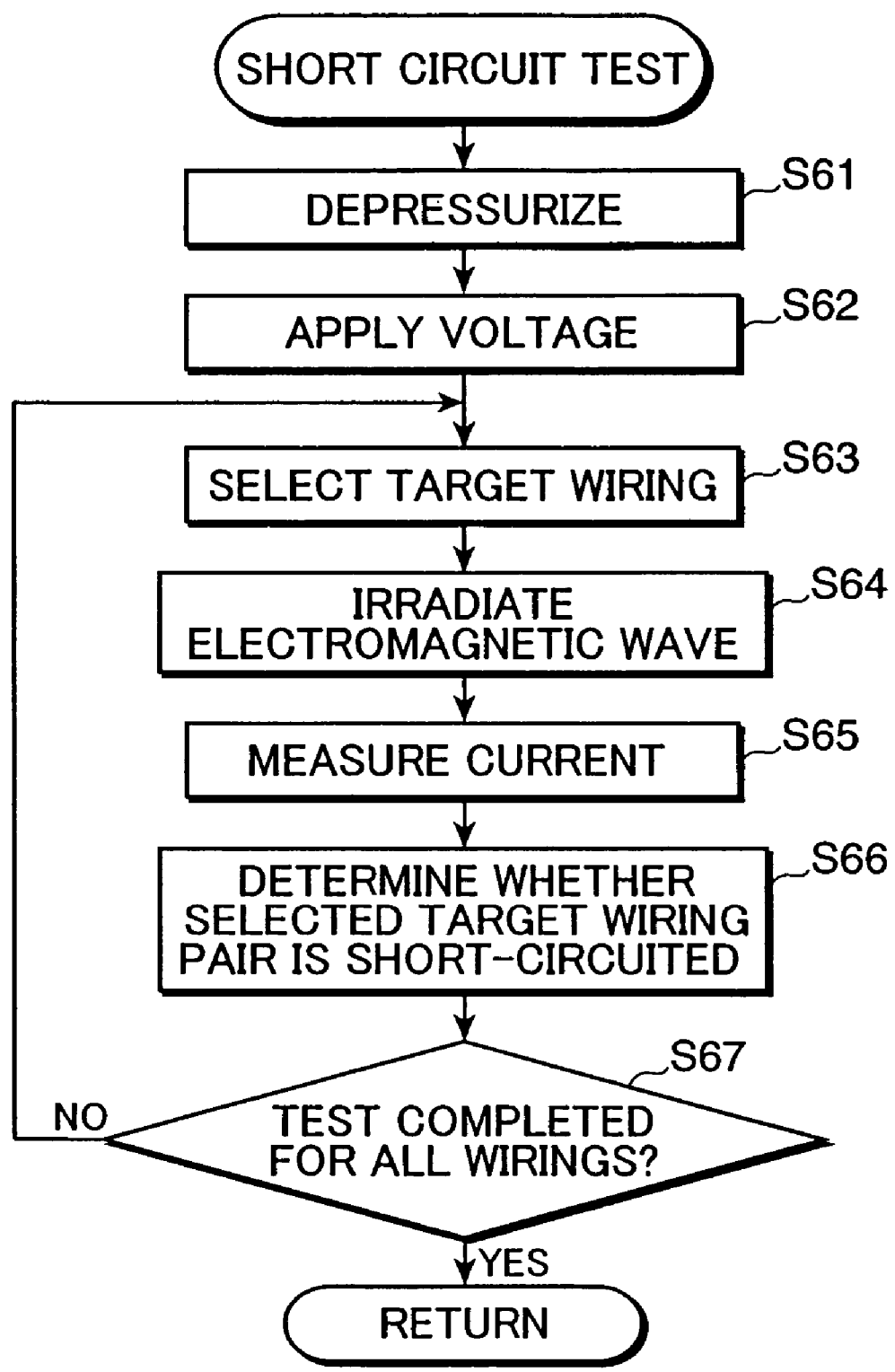
FIG. 6 is a flowchart showing operations for a short circuit testing by the testing apparatus shown in FIG. 1.

Next, the short circuit test (Step S6) is described with reference to FIG. 6. FIG. 6 is a flowchart showing a short circuit test by the apparatus. An overall flow of the short circuit test is basically the same as the open circuit test (Step S5) except that the short circuit test includes switch-over control of the multiplexer 42 in association with irradiation onto the pad portion. Hereinafter, merely the differences between the short circuit test and the open circuit test are described primarily focusing on the short circuit test.

Similar to the open circuit test, in the short circuit test, after depressurization is performed (in Step S61), a pair of target wirings are selected in accordance with a selection command from the controller 30 (in Step S63) with a voltage being applied between the electrode 51 and one of the selected wiring (in Step S62). At this time, the multiplexer 42 is activated in response to a selection command from the controller 30 in such a manner that the minus output terminal of the power source 80 is not electrically connected to the first target wiring constituting the target wiring pair but is connected to the second target wiring constituting the target wiring pair. On the other hand, the scanner 62 is controlled to direct the laser light beam to the pad or end terminal of the first target wiring.

After the target wiring pair is selected in Step S63, an electromagnetic wave is irradiated onto the pad portion of the first target wiring in response to an operation command from the controller 30 (in Step S64). Thereupon, electrons are discharged from the pad portion, and an electric field is generated between the plate electrode 51 and the pad portion (one terminal) of the first target wiring by application of a voltage to the plate electrode 51 and the second target wiring if the target wiring pair is in a short circuit state. As a result, the electrons discharged from the first target wiring due to photoelectric effect by electromagnetic wave irradiation are electrically attracted by the plate electrode 51 aided by the existence of the electric field, and a conductive pathway is established through which a current runs from the power source 80 and returns thereto via the plate electrode 51, the first target wiring, the short-circuited portion, and the second target wiring to thereby securely measure a current running through the target wiring pair.

On the other hand, in the case where the target wiring pair is not in a short circuit state, the aforementioned conductive pathway is not established, and a current value detected by the current detecting section 90 is zero or exceedingly lower than a current value detected in the case where the target wiring pair is in a short circuit state. Thus, this arrangement enables one to precisely and stably determine whether the target wiring pair is in a short circuit state by detecting a current running through the target wiring pair.

In this embodiment, during irradiation, the current detecting section 90 measures a current and outputs a signal corresponding to the current as a detected output (in Step S65). It is judged whether the target wiring pair is in a short circuit state based on the measured current value (in Step S66). A judgment regarding short circuit can be performed simply based on presence or absence of a detected output. Preferably, however, it is judged whether the target wiring pair is in a short circuit state by comparing a current value measured with a reference circuit board with a current value measured with the circuit board under test. A series of operations from selection of the target wiring pair (Step S63) to judgment regarding short circuit (Step S66) are repeated until it is judged that all the wirings on the work 10 has been tested in Step S67.

In the above mentioned first embodiment, a transparent electrode is used as the plate electrode 51. This invention is not limited to that arrangement. Alternatively, a mesh electrode may be provided in place of the plate electrode. In the altered arrangement, it is preferable that a housing is made of a transparent glass material or the like and a mesh electrode is attached on an inner surface of the housing. In such an altered arrangement, an electromagnetic wave L passes through the housing and clearances between the mesh electrodes to be irradiated onto a target wiring. This altered arrangement enables one to obtain a similar effect as the first embodiment.

Further, it would be appreciated to provide an electrode on the side of a housing defining a closed space SP instead of the provision of an electrode in a top of the housing. Specifically, a side wall of the housing may be made of conductive metallic material to function as shield and electrode while a top of the housing is made of transparent glass. This construction makes connection of the electrode with an external power source easier.

Figure 7:
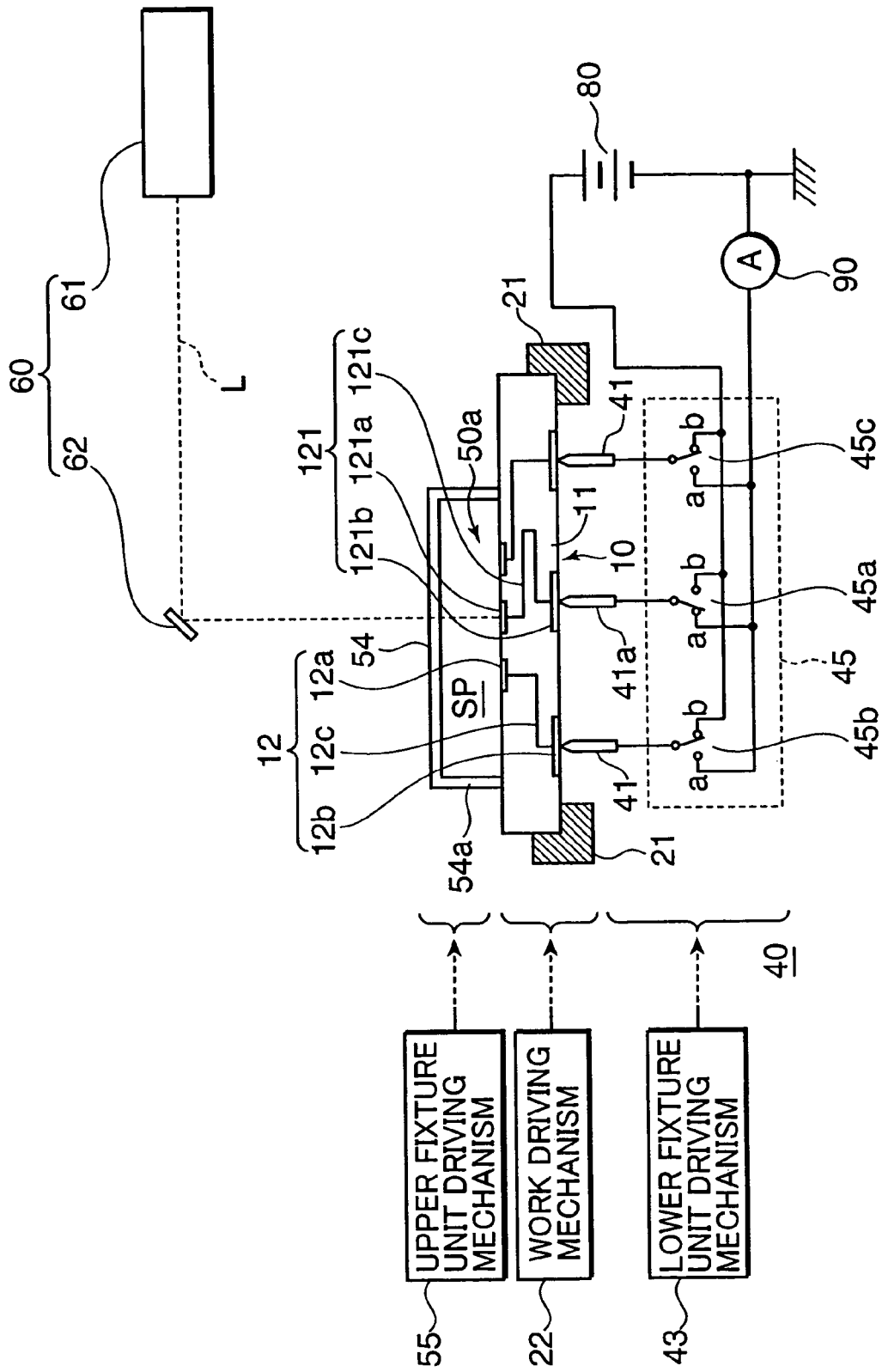
FIG. 7 is a diagram showing a circuit board testing apparatus as a modification of the first embodiment.

Next, a modification of the first embodiment is described. FIG. 7 is a diagram showing the modified circuit board testing apparatus. The basic principle of the modified apparatus is similar to that of the apparatus in accordance with the first embodiment. The modification differs from the first embodiment in the manner of applying a voltage from a power source and in the arrangement in association therewith. In view of this, constituent elements in the modification which are identical to those in the first embodiment are denoted by the same reference numerals, and the modification is described primarily focusing on the difference of the modification from the first embodiment.

The modified apparatus is not provided with a plate electrode for applying a voltage. In the modified apparatus, a voltage is applied to all or part of the wirings arranged in the vicinity of a target wiring such that the wirings may efficiently capture the electrons discharged from the target wiring upon irradiation of an electromagnetic wave. To provide this arrangement, in the modification, the plus terminal of a power source 80 is connected to one terminal of a multiplexer 45, whereas the minus terminal of the power source 80 is connected to the opposite terminal of the multiplexer 45 via a current detecting section 90.

An upper fixture unit includes a housing 54 having the shape of a cap to cover a certain area on one surface of a work 10. An optical window is formed in the housing 54 at a position above a target wiring. The optical window constitutes an irradiation path for guiding an electromagnetic wave L.

More specifically, the optical window may be formed through which an electromagnetic wave L is irradiated, or the entirety of the housing 54 is made of a glass which is optically transparent or its equivalent. The housing 54 constituting the upper fixture unit is movable toward and away from the work 10. An upper fixture unit driving mechanism 55 is activated in response to a drive command from a controller 30. The housing 54 is moved to the work 10 until its bottom edge 54a of the housing 54 comes into contact with a surface of the work. Then, the end portion or bottom edge 54a is deformed and pressed against the surface of the work due to counter pressure. The end portion 52a serves as a tight closure or seal. In this way, an airtight closed space SP is defined by the work 10 and the housing 54.

Described is a case, as shown in FIG. 7 for example, in which a switch portion 45a is connected to a terminal a, and switch portions 45b and 45c which are remaining switch portions of the multiplexer 45 are connected to a terminal b. In this case, a wiring 121 connected to the switch portion 45a is a target wiring. A certain level of voltage is applied to wirings connected to the switch portions 45b, 45c from the power source 80, and an electromagnetic wave L is irradiated onto a pad portion 121a.

In the case where the wiring 121 is in a normal continuous state, an electric field is generated between pad portions 12a of the wirings connected to the switch portions 45*b*, 45*c* (hereinafter, referred to as "the other wirings") and the pad portion 121*a* of the target wiring 121 by applying a voltage to the opposite terminal of the target wiring 121 and the other wirings. Electrons which have been discharged from the pad portion 121*a* of the target wiring 121 by photoelectric effect due to electromagnetic wave irradiation are electrically attracted by the pad portions 12*a*.

At this time, in the case where the target wiring 121 is in continuity, a conductive pathway is established along which a current runs from the power source 80 and returns thereto via the other wirings and the target wiring 121 to thereby cause a current running through the target wiring 121, with the current being measured by the current detecting section 90.

On the other hand, in the case where the target wiring 121 is in discontinuity, the aforementioned conductive pathway is not established, and a current value detected by the current detecting section 90 is zero or exceedingly lower than a current value detected in the case where the wiring 121 is in continuity. This arrangement enables one to precisely and stably determine whether the target wiring is in continuity by detecting a current running through the target wiring 121, and enables the controller 30 to determine whether the target wiring 121 is in continuity or in discontinuity based on a measured current detected by the current detecting section 90.

When an open circuit test with respect to the target wiring 121 is completed, and the connecting state of the switch portions is switched over, a new target wiring is selected one after another. After the new target wiring is selected by switching over the switch portions, and an electromagnetic wave is irradiated onto a pad portion of the new target wiring, an open circuit test with respect to the new target wiring can be performed in the same manner as mentioned above. Thus, the open circuit test can be performed with respect to all the wirings of the work 10.

In the modification of the first embodiment, it is required to perform a short circuit test with respect to respective pairs of ball grid portions prior to an open circuit test when the open circuit test is to be performed with use of the modified apparatus. This is because in the case where there is a short-circuited portion between a pair of ball grid portions, it is highly likely that a current may erroneously run when the switch portions of the multiplexer are about to be switched over. Such short circuit testing may be made, for example, by connecting one terminal of the power source to one of the wiring and the other terminal of the power source to another wiring through a current measuring device, without the above mentioned irradiation of electromagnetic wave.

As mentioned above, in the modification, the pad portions 12*a* of the other wirings serve as the plate electrode in the first embodiment by selectively switching over the switch portions of the multiplexer 45. While generating an electric field between the pad portion 121*a* of the target wiring 121 and the pad portion(s) 12*a* of the other wiring(s), electrons generated from the pad portion 121*a* due to photoelectric effect by electromagnetic wave irradiation are trapped by the pad portion 121*a*. With the arrangement of this modification, continuity/discontinuity of the target wiring can be stably determined in the similar manner as in the first embodiment despite the fact that a plate electrode is not provided in the modification.

This invention is not limited to the aforementioned first embodiment and the modification thereof. For instance, in the apparatus in accordance with the first embodiment (or the modification), an open circuit test and a short circuit test are performed in this order to determine whether a work (circuit board) 10 is in continuity. The order of testing is not limited to the above. Further, this invention is applicable to any apparatus as far as the apparatus is capable of performing at least an open circuit test.

In the first embodiment and the modification thereof, the circuit board 10 capable of mounting a semiconductor chip according to C4 package method is used as a work to be tested. Alternatively, this invention is applicable to test a circuit board in which one surface of a base plate is formed with wirings or a circuit board formed with a cuffed wiring pattern.

In the first embodiment and the modification, an electromagnetic wave L is irradiated in the form of a pulse for one time. The number of times of irradiation is not limited to one, and the irradiation may be performed for a certain number of times. Further, in the first embodiment and the modification, depressurization of the interior of a housing is performed. Alternatively, as the case may be, depressurization may be omitted, or vacuum degree may be varied depending on performance of the electromagnetic wave irradiator.

As mentioned above, according to the first embodiment and the modification, an electric field is generated between an electrode portion and one terminal of a target wiring, and a conductive pathway is established by attracting electrons discharged from the one terminal of the target wiring by photoelectric effect due to electromagnetic wave irradiation onto the electrode portion aided by the existence of the electric field. Thereby, short and open-circuit of the target wiring can be accurately and stably tested.

Figure 8:
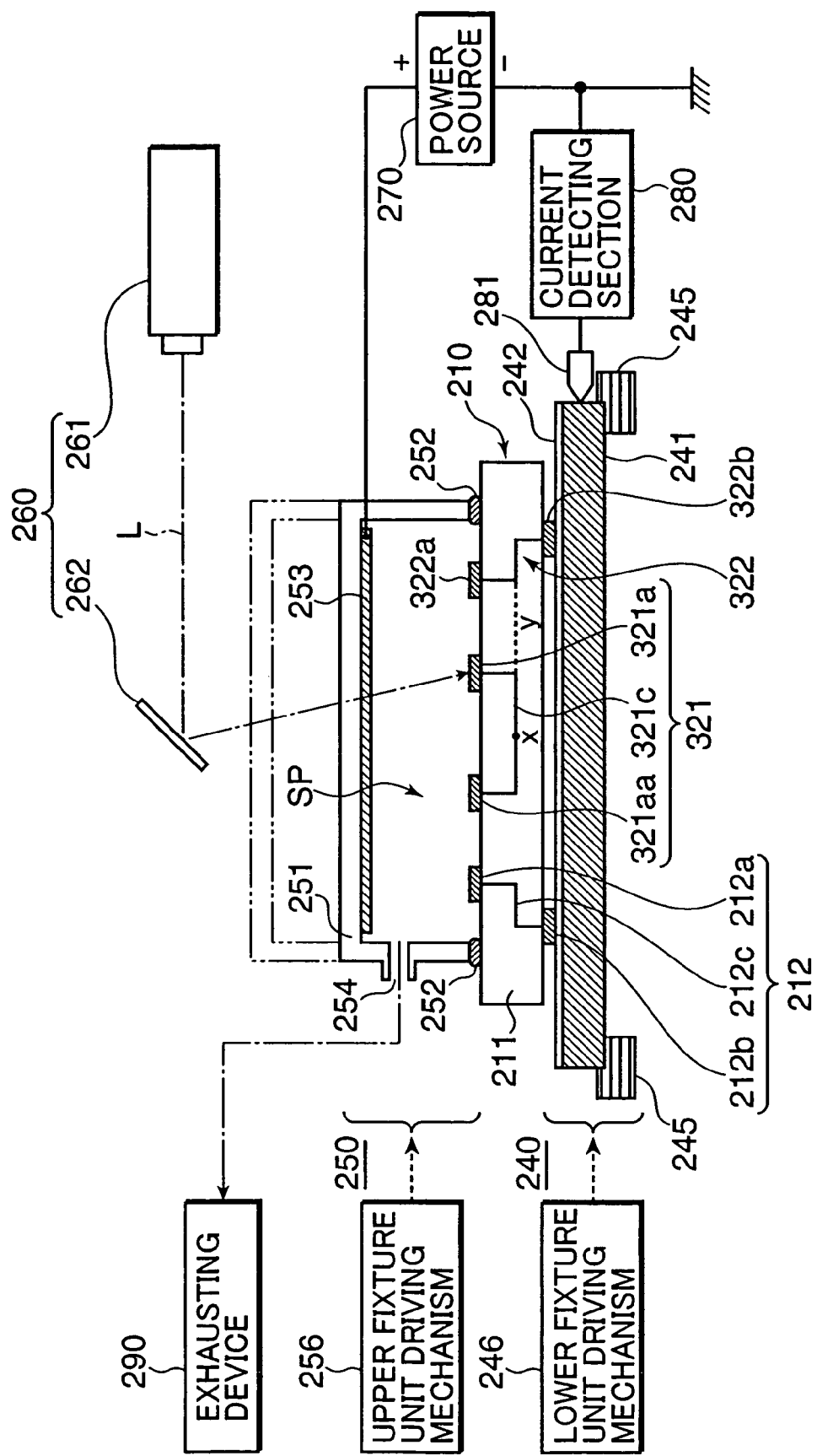
FIG. 8 is a diagram showing a circuit board testing apparatus in accordance with a second embodiment of the invention.
Figure 9:
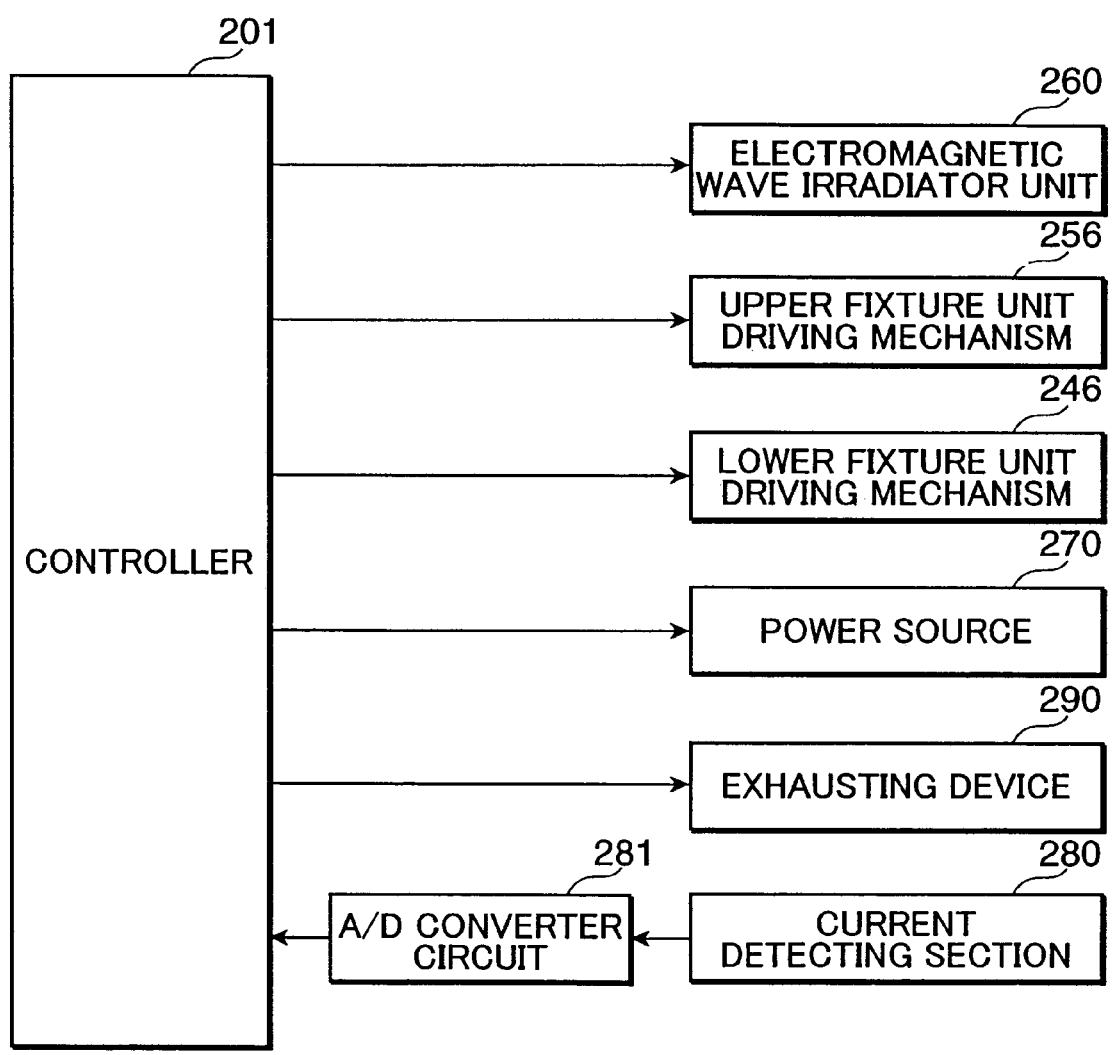
FIG. 9 is a block diagram showing an electric arrangement of the testing apparatus shown in FIG. 8.

FIG. 8 is a schematic illustration of a circuit board testing apparatus according to a second embodiment of the invention. FIG. 9 is a block diagram showing an electric configuration of the testing apparatus in FIG. 8. A circuit board testing apparatus in accordance with a second embodiment is adapted to test a circuit board 210. As shown in FIG. 8, the circuit board 210 is constructed in such a manner that a number of wirings 212, 321 and 322 are formed on a base plate 211. It is to be appreciated that the actual circuit board or substrate has many wirings formed thereon but that only three wirings are shown in the drawing. Description will be made hereinafter with reference to the wiring 210 as a representative of the other wirings, for convenience unless other wirings are required to be referred to for particular explanation.

Terminals 212*a* and 212*b* of the wiring 212 are formed on the circuit board 210 or substrate to be connected with an electronic component mounted on the circuit board 210 or external wirings. A conductive portion 212*c* is formed on the surface of or inside the circuit board 210 to electrically connect the terminals 212*a* and 212*b*. In this embodiment, described is a case where the circuit board 210 having the above construction is tested as a work. It is needless to say that the work to be tested by this embodiment is not limited to the aforementioned circuit board. In this embodiment, the terminals 212*a* and 212*b* are provided on the respective surfaces of the circuit board 210, and the conductive portion 212*c* which connects the terminals 212*a* and 212*b* is provided inside the base plate 211. Alternatively, terminals may be formed on either one of the surfaces of the circuit board, and a conductive portion for connecting the terminals may be formed on the same or opposite side surface of the circuit board.

The testing apparatus includes a lower fixture unit 240 which is provided with a holding section for holding a circuit board 210 as a work thereon. The lower fixture unit 240 includes a metallic plate 241, an insulating film 242 formed on the upper surface of the metallic plate 241, and a lower fixture base 245 which integrally holds the metallic plate 241 and the insulating film 242 thereon. The metallic plate 241 has such a dimension as to substantially cover the lower surface of the work 210 in order to maximize a capacity provided by a wiring 212 formed on the work 210 and the metallic plate 241. The metallic plate 241 is coated with an insulating film 242 on an upper surface thereof. With this arrangement, when the circuit board 210 is placed on the metallic plate 241, terminals 212b formed on the lower surface of the circuit board 210 are reliably kept from coming into contact with the metallic plate. The lower fixture base 245 is coupled to a lower fixture driving mechanism 246. The lower fixture unit driving mechanism 246 drivingly reciprocate the lower fixture unit 240 back and forth between a test position (position shown in FIG. 8) where the work 210 is tested and a load/unload position (not shown) where the work is loaded on and unloaded from the lower fixture unit 240.

A conductive probe 281 is provided at the test position. When the lower fixture unit 240 is moved to the test position, the metallic plate 241 provided on the lower fixture unit 240 is rendered into contact with the conductive probe 281. Thus, the metallic plate 241 is electrically communicable with a power source 270 which is described later.

It should be noted that the insulating film 242 is not a material element. The metallic plate 241 is not required to be coated with the insulating film 242 in the case of the apparatus being applied for a circuit board formed with a wiring pattern only on a top surface or a circuit board formed with an insulating layer over wiring patterns. In that case, the metallic plate 241 may be in direct contact with such a circuit board without the insulating film 242. Also, even if the work 210 is a circuit board formed with a wiring pattern on both surfaces thereof, as will be described later, a test may be performed for such a circuit board by an apparatus which is not provided with an insulating film.

An upper fixture unit 250 is arranged above the work 210. The upper fixture unit 250 is provided with a housing 251 in the form of a cap so as to cover terminals 212a, 321a, 321aa and 322a formed on the upper surface of the work 210. The housing 251 is formed with an exhaust port 254 on a side wall thereof, and is made of, e.g., a transparent silica glass. Also, the housing 251 is provided with a seal member 252 made of, e.g., rubber on a free end of a side wall of the housing 251. Further, a transparent plate electrode 253 is attached or deposited on an inner upper surface of the housing 251.

Further, the side wall of the housing 251 may be formed by a metallic material with its top wall being formed by a transparent glass. In this case, the metallic side wall may be used as electrode. A unit comprised of these constituent elements 251 through 254 is operatively connected with an upper fixture driving mechanism 256, and is movable toward and away from the work 210.

The upper fixture unit 250 is moved to the work 210 until the seal member 252 on the end portion of the side wall of the housing 251 comes into contact with the surface of the work 210. The seal member 252 is resiliently deformed against the surface of the work 210. As a result, an airtight enclosure or closed space SP is defined by the work 210, the seal member 252 and the housing 251.

The exhaust port 254 formed on the housing 251 is communicated with an exhausting device 290 via exhaust pipe (not shown). When the exhausting device 290 is activated based on a control signal from the controller 201, the air inside the closed space SP is drawn out to depressurize the interior of the closed space SP to about $10^{-2}$ atm.

It is preferable to hold the closed space SP at a vacuum degree of about $10^{-2}$ atm when a test is performed. In the case of a vacuum degree lower than $10^{-2}$ atm, the electron discharge rate decreases. On the other hands, higher vacuum degree increases the electron discharge rate. However, a longer time is required until the closed space SP reaches a desired higher vacuum degree, consequently increasing the test time. According to experiments of the inventors of the present invention, it was confirmed that a sufficient amount of electrons are discharged under the pressure of $10^{-2}$ atm which can be attained in a relatively short time.

An electromagnetic wave irradiator 260 is provided in the apparatus to irradiate an electromagnetic wave to a terminal connected to one wiring (target wiring) alternatively selected from a plurality of wirings 212 for the test. The electromagnetic wave irradiator 260 includes an electromagnetic wave emitting section 261 which emits an electromagnetic wave L in response to an operation command from the controller 201. An electromagnetic wave scanning section 262 directs the electromagnetic wave L to a desired location on the work 210 in response to an operation command from the controller 201.

The electromagnetic wave emitting section 261 is constructed so as to emit ultraviolet laser light beams having a wavelength of 266 nm. Also, the electromagnetic wave emitting section 261 is provided with an optical system to focus the laser light beams on the pad portion 212a of a target wiring 212.

In this embodiment, the electromagnetic wave emitting section 261 emits ultraviolet laser light beams for the purpose of causing photoelectric effect. However, this invention is not limited to the arrangement of the embodiment, and visible light beams, infrared light beams or its equivalent may be used. The electromagnetic wave emitting section 261 is so constructed as to be driven based on a pulse signal with use of a Q switching element and the like. The electromagnetic wave scanning section 262 includes a galvanometer for changing the angle of a mirror for directing the laser light beam. The electromagnetic wave irradiator 260 in accordance with this embodiment is constructed in such a manner that the galvanometer is driven based on an operation command from the controller 201 to project the electromagnetic wave L onto a desired location on the surface of the work 210 accurately and speedily.

A direct current power source 270 is provided in the apparatus to apply an electric potential difference or voltage between the plate electrode 253 and the metallic plate 241. The DC power source 270 outputs a certain voltage.

Further, a current detecting section 280 is provided at a position in a conductive circuit pathway through which a current runs from one terminal of the power source 270 to the opposite terminal thereof via the plate electrode 253, a target wiring, and the capacitive coupling of the metallic plate 241 and the target wiring to detect the current running in the conductive pathway. Specifically, the plus terminal of the power source 270 is electrically connected to the plate electrode 253, and the minus terminal of the power source 270 is connected to the conductive probe 281 via the current detecting section 280. The conductive probe 281 is in contact with the metallic plate 241 when the lower fixture unit 240 and the work 210 are set at the test position. Thus, the aforementioned conductive pathway is established.

In this embodiment, an electric field of which electric potential is higher at the plate electrode 253 than at the metallic plate 241 is generated when the power source 270 applies a voltage between the plate electrode 253 and the metallic plate 241. When an electromagnetic wave L is irradiated onto the terminal 212a of the wiring 212 in this state, electrons are discharged from the terminal 212a due to photoelectric effect. The electrons discharged from the terminal 212a are electrically attracted by the plate electrode 253 aided by the existence of the electric field.

Further, in this embodiment, since a certain capacity is secured by the wiring 212 and the metallic plate 241, the following effect is obtained. When electrons discharged from the wiring 212 due to photoelectric effect are trapped by the plate electrode 253 and travel toward the plus terminal of the power source 270, the same amount of electrons as the discharged electrons run through the metallic plate 241 from the minus terminal of the power source 270 via the current detecting section 280 and the conductive probe 281. Thus, a conductive pathway along which a current runs from the plus terminal of the power source 270 and returns thereto via the plate electrode 253, the wiring 212, the metallic plate 241, the conductive probe 281, and the current detecting section 280 is established, and the current running through the conductive pathway is detected by the current detecting section 280. The current value detected by the current detecting section 280 is converted into a digital signal by an A/D converter circuit 281 and sent to the controller 201. In this embodiment, the plate electrode 253, the metallic plate 241, and the current detecting section 280 respectively serve as a first electrode portion, a second electrode portion, and a current detector.

In this embodiment, the current detecting section 280 is provided between the minus terminal of the power source 270 and the conductive probe 281. Alternatively, as far as a current running through the aforementioned conductive pathway is detectable, the current detecting section may be provided, for example, between the plus terminal of the power source 270 and the plate electrode 253.

Described is a case where an electromagnetic wave L is irradiated onto a terminal 321a of a wiring 321 as shown, e.g., in FIG. 8. In this case, the wiring 321 is a target wiring to be tested. When the target wiring 321 is in a normal continuous state, the wiring 321 and the metallic plate 241 constitute a capacitor in which the terminals 321a, 321aa, 322b, and 321c constitute an electrode having one polarity while the metallic plate 241 constitutes an electrode having the opposite polarity.

When an electromagnetic wave L is irradiated onto the terminal 321a, electrons are discharged from the terminal 321a due to photoelectric effect. The discharged electrons are electrically attracted and trapped by the plate electrode 253 and run to the plus terminal of the power source 270. As a result of the electron discharge, the wiring 321 is charged positively. On the other hand, the opposite electrode of the capacitor, namely, the metallic plate 241 is charged negatively with electrons being supplied from the minus terminal of the power source 270. In this way, a current runs through the aforementioned conductive pathway due to irradiation of an electromagnetic wave onto the terminal 321a. Thus, the capacitor comprised of the wiring 321 and the metallic plate 241 is charged.

The waveforms a in respective graphs of FIG. 10 show changes of a potential at the wiring 321, a current running through the current detecting section 280 and detected thereby, and an amount of electric charges as an integration of the currents running through the current detecting section 280 while the electromagnetic wave is being irradiated. Specifically, the diagrams in FIG. 10 are graphs showing changes of a potential at a target wiring, a current running through the aforementioned conductive pathway, and an amount of electric charges which have been charged at the capacitor, before irradiation of electromagnetic wave and while the electromagnetic wave is being radiated. When irradiation of an electromagnetic wave L is initiated, electrons discharged from the terminal 321a are electrically attracted toward the plate electrode 253 and a current runs through the aforementioned conductive pathway. As electrons are discharged from the wiring 321, the potential of the wiring 321 is raised. As a result, the current running through the conductive pathway is gradually decreased. When the potential of the wiring 321 reaches the same level as the plate electrode 253, the electrons discharged from the terminal 321a are no longer electrically attracted toward the plate electrode 253, and running of current through the conductive pathway ceases. At this time, if it is assumed that a charged amount charged at the capacitor is $Q_0$, the capacity of the capacitor comprised of the wiring 321 and the metallic plate 241 is $C_0$, and an output voltage of the power source 270 is V, the following equation is established:

$$Q_0 = C_0 \cdot V$$

On the other hand, in the case where the wiring 321 is in an open circuit state, e.g., where there is an open circuit portion at point x in FIG. 8, one electrode of the capacitor covering the area corresponding to the terminal 321a and a portion of the conductive portion 321c extending up to point x, is smaller than the electrode of the capacitor formed by the entire length of the wiring 321 in a normal continuous state. As a result, the capacity of the capacitor in the open circuit state is smaller than the reference capacity $C_0$ of the capacitor in the aforementioned normal continuous state. When the terminal 321a is irradiated with an electromagnetic wave L in the open circuit state, changes of a potential at the wiring 321, a current detected by the current detecting section 280, and a charged amount charged at the capacitor for a time upon irradiation of electromagnetic wave are, for example, as shown by respective waveforms b in the graphs of FIG. 10.

In the case where the wiring 321 is in a short circuit state, e.g., where there is a short-circuited portion at point y between the target wiring 321 and the other wiring 322 in FIG. 8, the wiring 321 and the other wiring 322 constitute one electrode of the capacitor, and the capacitance of the capacitor in the short circuit state is larger than the reference capacity $C_0$ of the wiring 321 in the aforementioned normal continuous state. When the terminal 321a is irradiated with an electromagnetic wave L in the short circuit state, changes of a potential at the wiring 321, a current detected by the current detecting section 280, and an amount of electric charges that have been charged at the capacitor for a time upon irradiation of electromagnetic wave are, for example, as shown by respective waveforms c in the graphs of FIG. 10. In the case where the target wiring is in an open circuit state, the amount of electric charges corresponding to integration of the currents that have run through the current detecting section 280 is smaller than the reference charged amount $Q_0$, whereas in the case where the target wiring is short-circuited with other wiring, the amount of electric charges corresponding to integration of the currents that have run through the current detecting section 280 is larger than the reference charged amount $Q_0$.

The controller 201 calculates the amount of the electricity Q actually charged at the capacitor which is calculated by integrating current values measured by the current detecting section 280 while electromagnetic wave is being irradiated.

Then, the controller determines the continuity of the wiring 321 by comparing the actually charged amount Q with the reference charged amount $Q_0$ which is calculated in advance with the wiring 321 at a normal continuous state. In this embodiment, the controller 201 has a function of determinator.

Figure 11:
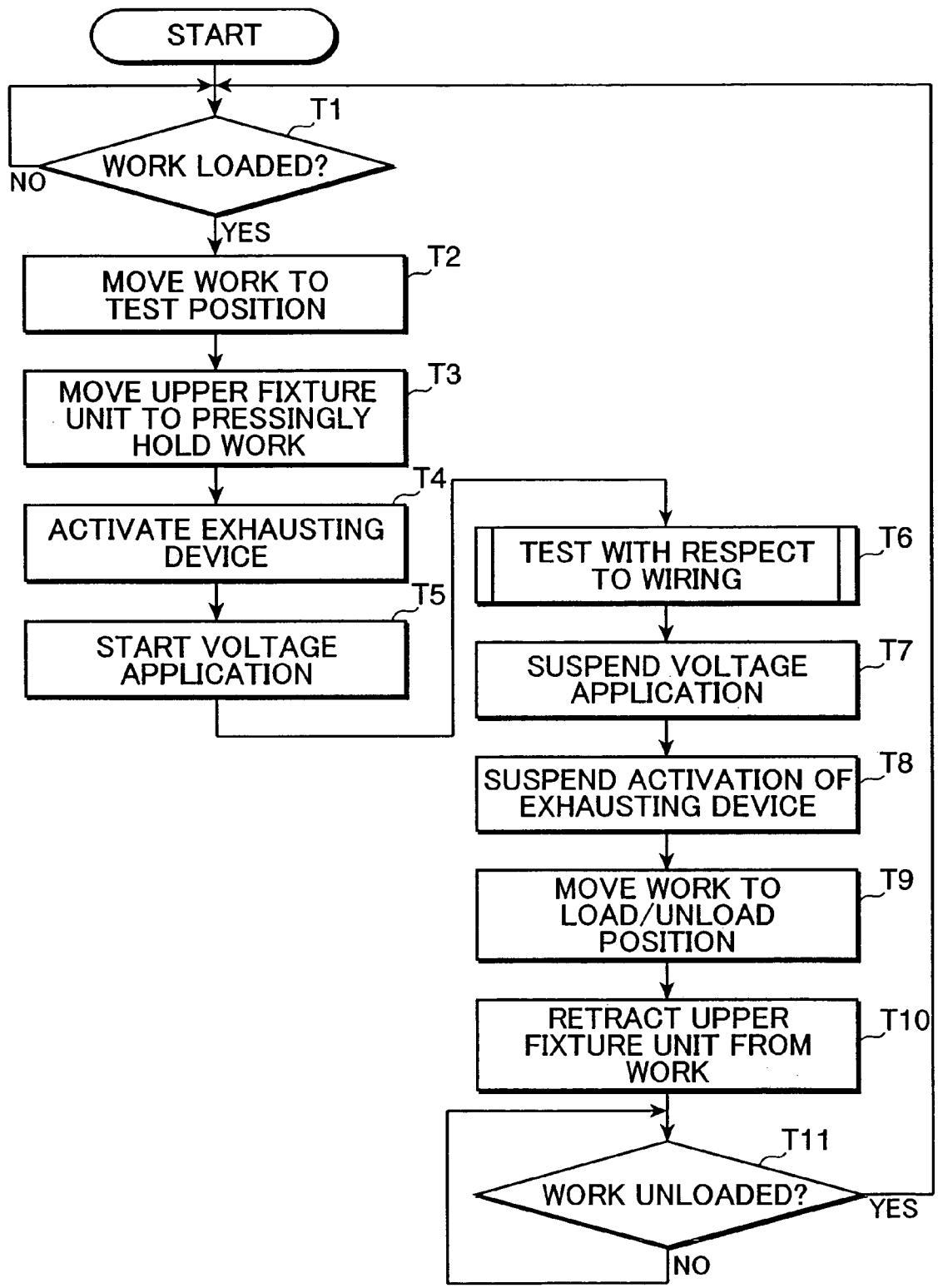
FIG. 11 is a flowchart showing operations of the testing apparatus shown in FIG. 8.

Next, an operation of the circuit board testing apparatus in accordance with the second embodiment is described with reference to FIG. 11. FIG. 11 is a flowchart showing operations of the testing apparatus shown in FIG. 8. When an untested work (circuit board) 210 is loaded on the lower fixture unit 240 positioned at a load/unload position by a handling device (not shown) incorporated in the testing apparatus or a manual operation by an operator (in Step T1), the controller 201 start to control operations of the various parts of the apparatus to execute the following steps T2 to T11 so as to test shorts and open-circuits in the work 210.

When the work 210 is loaded on the lower fixture unit 240, the lower fixture unit 240 is moved to the test position while carrying the work 210 thereon (in Step T2). Thus, the work 210 is positioned at the test position. Then, the metallic plate 241 is brought into contact with the conductive probe 281 to be connected to the current detecting section 280.

Subsequently, the upper fixture unit 250 is moved to the work 210, and fixedly sandwiches the work 210 between the upper fixture unit 250 and the lower fixture unit 240 (in Step T3). As a result, an airtight closed space SP is defined by the housing 251, the seal member 252 and the work 210. Then, the exhausting device 290 is activated to depressurize the interior of the closed space SP to a predetermined pressure of about $10^{-2}$ atm (in Step T4). The power source 270 outputs a certain DC voltage to be applied between the plate electrode 253 and the metallic plate 241 (in Step T5).

Thus, when the apparatus is set up for testing the work 210, a test as to whether a target wiring is in a normal continuous state is implemented (in Step T6). The contents of the wiring test are described in detail later.

Upon completion of the wiring test, the power source 270 suspends its voltage output (in Step T7). After suspending activation of the exhausting device 290, the air outside the apparatus is drawn into the closed space SP (in Step T8), and the upper fixture unit 250 is retracted away from the work 210 (in Step T9), and the lower fixture unit 240 is moved to the load/unload position (in Step T10). At a final stage, upon verifying that the work 210 after the wiring test has been unloaded in Step T11, the routine returns to Step T1 to execute the aforementioned series of operations.

Figure 12:
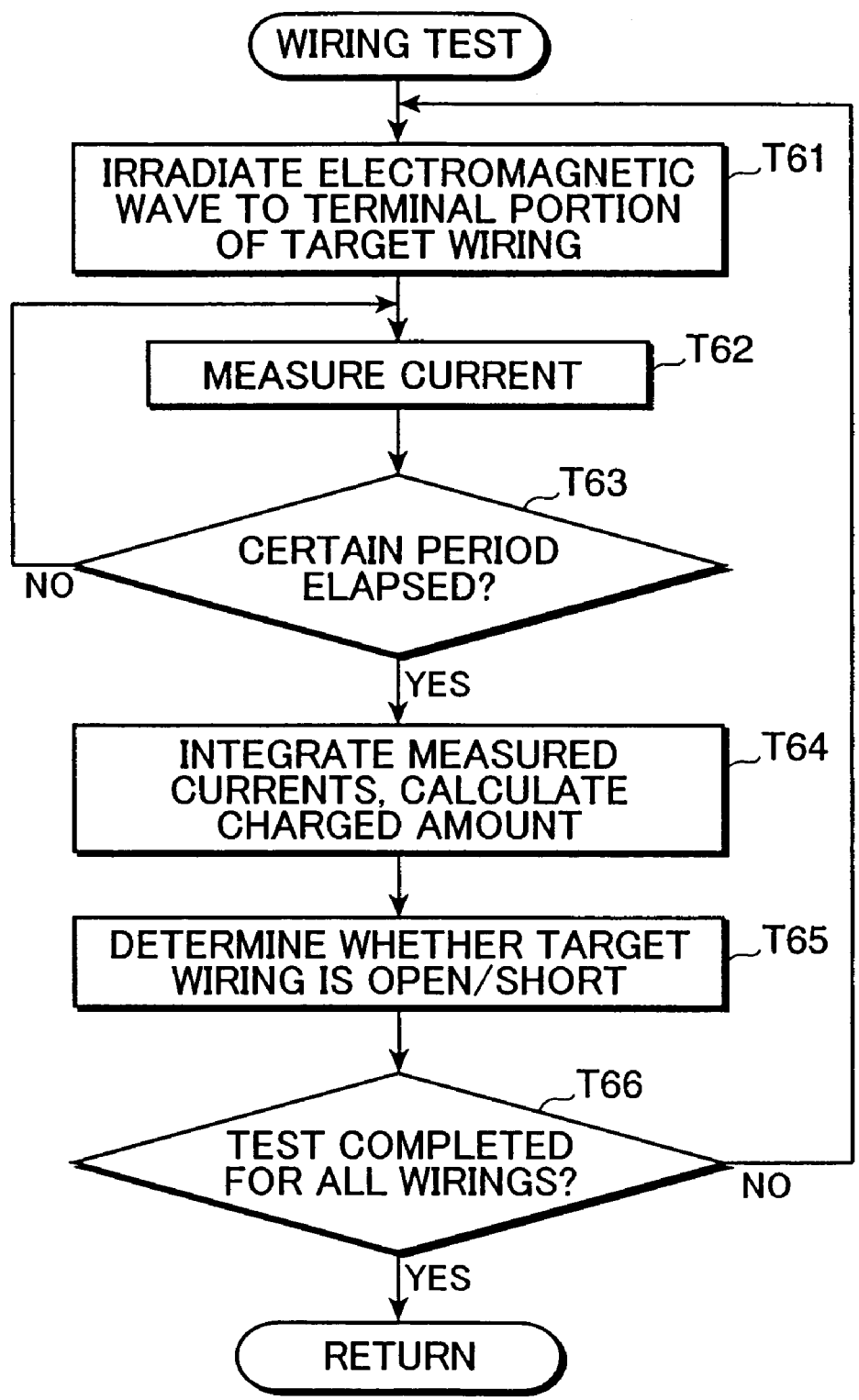
FIG. 12 is a flowchart showing operations for a wiring test by the apparatus in accordance shown in FIG. 8.

Next, the wiring test (Step T6) is described in detail with reference to FIG. 12. FIG. 12 is a flowchart showing procedures of the wiring test to be implemented by the apparatus.

When the routine is progressed to Step T5, the closed space SP defined by the housing 251 and the work 210 has been depressurized to a predetermined pressure of about $10^{-2}$ atm. In this state, the controller 201 controls the operative angle of the galvanometer 262 so that laser beam is focused on the terminal 321a of a target wiring 321 (in Step T61). The laser beam emitted from the electromagnetic wave irradiator 260 is an ultraviolet laser beam having a wavelength of 266 nm. Electrons discharged from the terminal 321a due to photoelectric effect are electrically attracted by the plate electrode 253 aided by the existence of the electric field, and a current runs through the conductive pathway. The current is measured by the current detecting section 280 (in Step T62). The current measurement is continued for a time (in Step T63). Next, the controller 201 calculates a charged amount of electricity based on the current values detected by the current detecting section 280 (in Step T64). Specifically, the charged amount Q is calculated by integrating the measured current values on time-basis. Then, the controller 201 determines whether the target wiring 321 is in a normal continuous state or other state based on the calculated charged amount Q (in Step T65).

In other words, in the case where the charged amount Q which has been measured by actual measurement falls in a predetermined allowable range including the predetermined reference charged amount $Q_0$ which has been calculated in advance with respect to a wiring in a normal continuous state as a mean value, it is judged that the target wiring 321 is in a normal continuous state. If the charged amount Q is lower than a lower limit of the predetermined allowable range, it is judged that the wiring 321 is in an open circuit state. If the charged amount Q exceeds an upper limit of the predetermined allowable range, it is judged that the wiring 321 is in a short circuit state with respect to the other wiring.

Thus, a test with respect to a target wiring is completed. In this way, the aforementioned series of operations with respect to a wiring test is repeated with other wirings until the test is completed with all the wirings of the work 210 (in Step T66).

As mentioned above, in the apparatus in accordance with the second embodiment, the metallic plate 241 provides a capacitive coupling of the metallic plate 241 with the wiring or wirings to be tested. The capacity provided by the capacitive coupling of the metallic plate 241 and the target wiring varies depending on whether the target wiring is in continuity or in another state. Accordingly, the amount of electricity charged at the capacitor comprised of the metallic plate 241 and the target wiring varies as the capacity varies. According to the second embodiment, currents running through the predetermined conductive pathway via the capacitor are detected, an amount of electric charges that have been charged at the capacitor is calculated, and it is judged whether the target wiring is in a short circuit state or an open circuit state based on the calculated charged amount. This arrangement enables precise and stable test of the wirings formed on a circuit board in a contactless manner.

Figure 13:
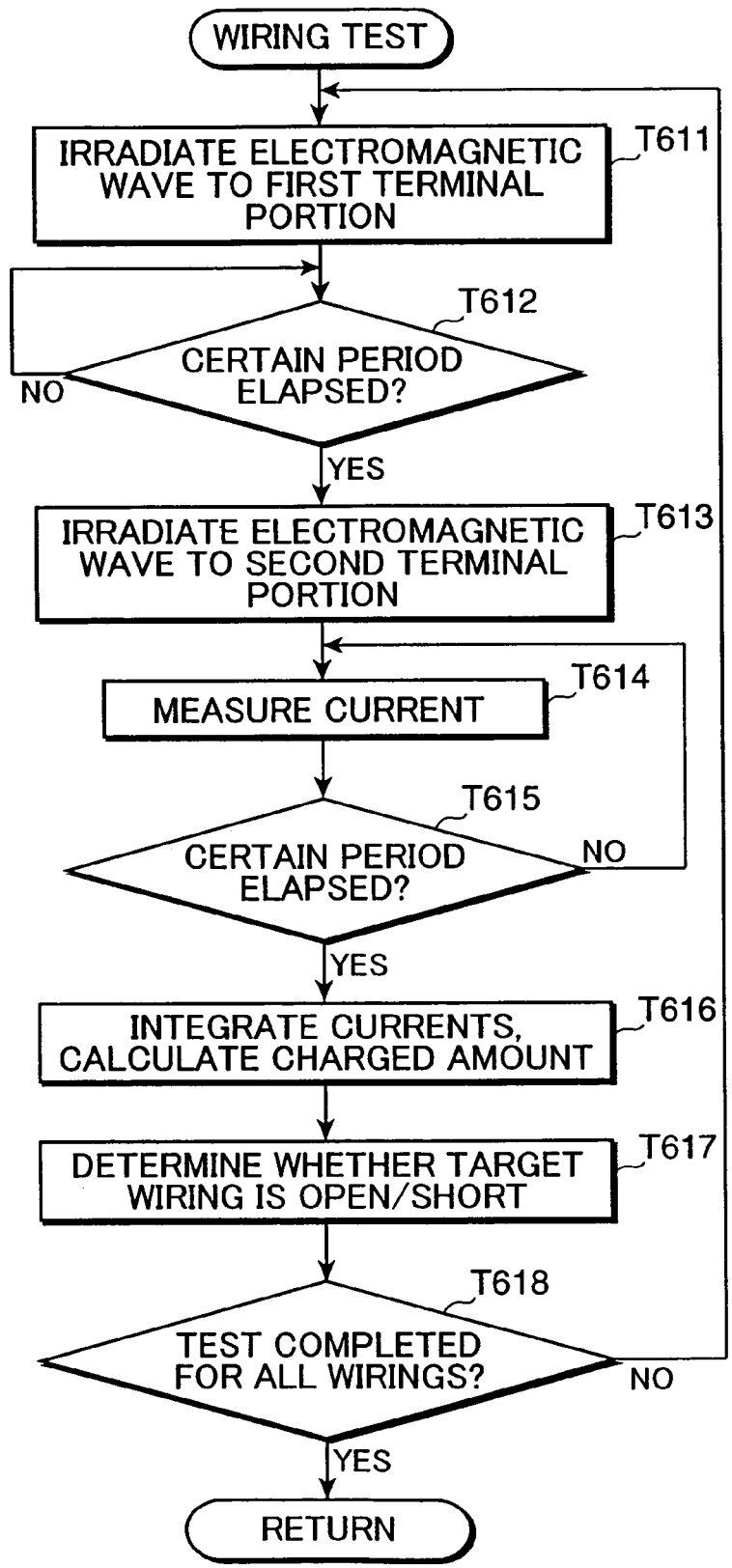
FIG. 13 is a flowchart showing a wiring test operation by the apparatus shown in FIG. 8, altered from the operation shown in FIG. 12.
Figure 14A:
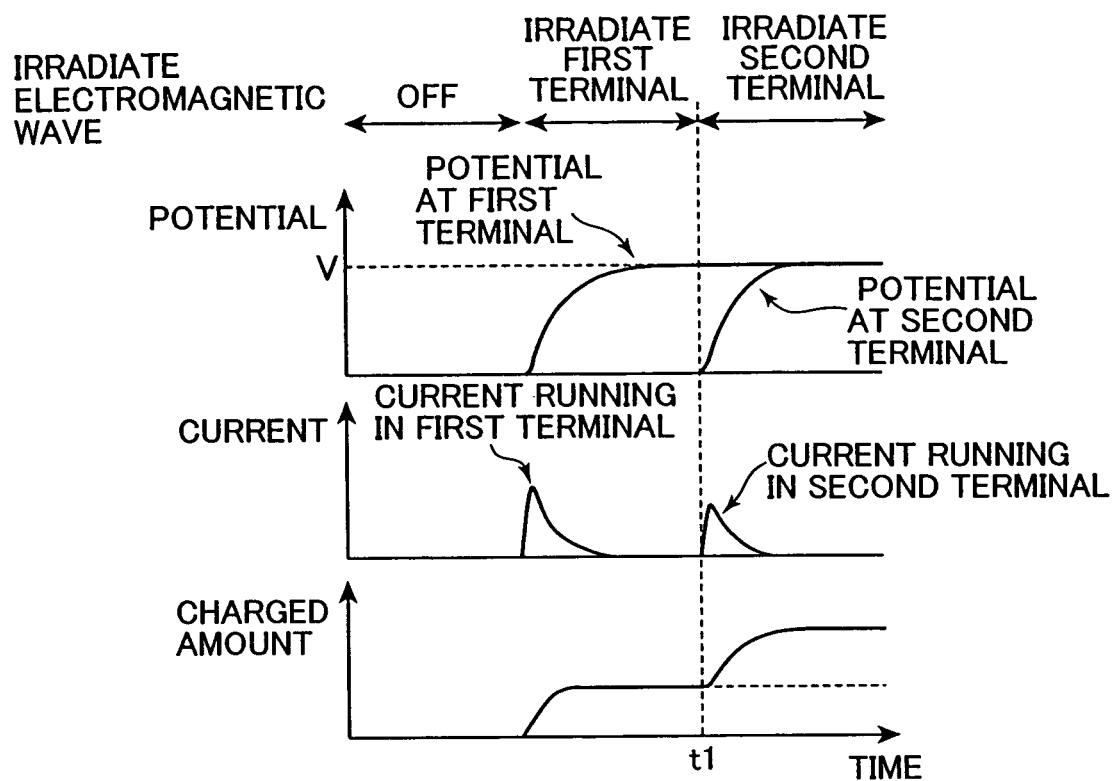
FIGS. 14A and 14B are sets of graphs each set showing changes of a potential at a wiring, a current detected by a current detecting section, and an amount of electric charges as the integration of the currents detected by the current detecting section while the electromagnetic wave is being irradiated with the irradiation is switched from one terminal to another.
Figure 14B:
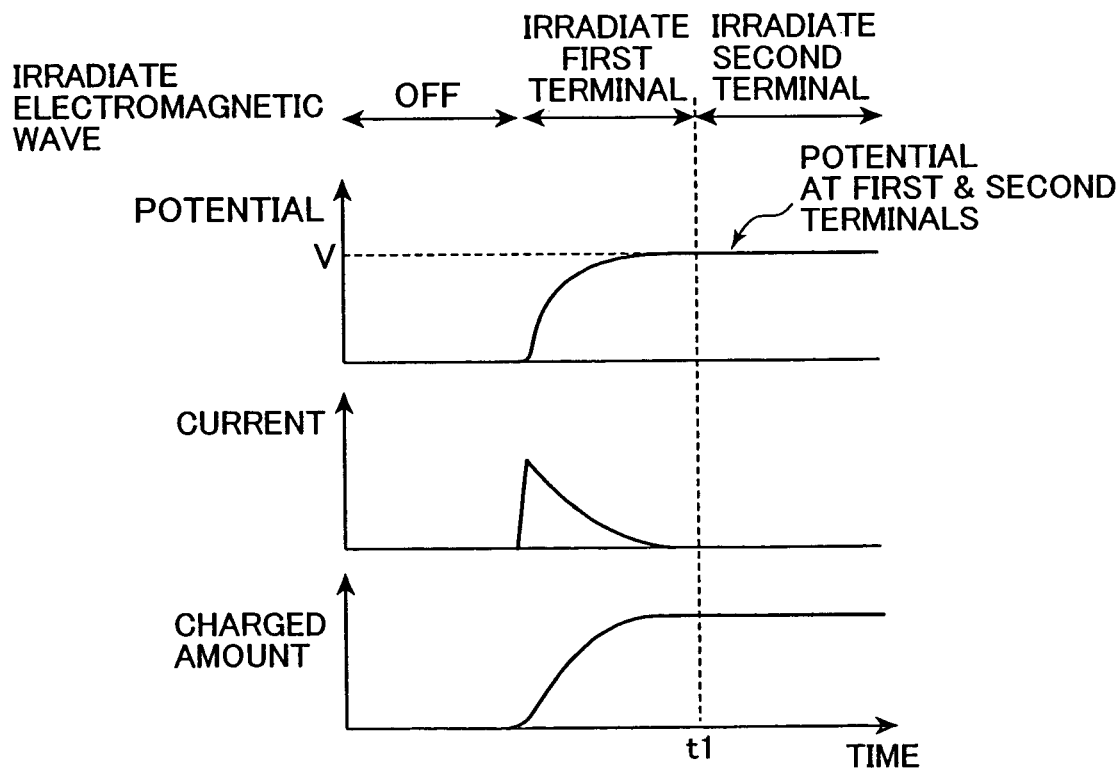

As an alternative of the second embodiment, the testing apparatus is applicable to testing of continuity between two terminals or two wirings by changing a part of the aforementioned test procedures. FIG. 13 is a flowchart showing steps of the altered test executable by the testing apparatus in accordance with the second embodiment. FIGS. 14A and 14B are sets of graphs each set showing changes of a potential at first and second terminals when the first and second terminals are irradiated with an electromagnetic wave, a current running through the current detecting section 280 when the first and second terminals are irradiated, and an amount of electricity that have been charged at a capacitor for a time while electromagnetic wave is being irradiated and with the irradiation of electromagnetic wave being switched over from the first terminal to the second terminal.

Since the arrangement of the testing apparatus for implementing the altered test is identical to that of the testing apparatus in accordance with the second embodiment, steps of the altered test are described with reference to the flowchart of FIG. 13.

In this altered test, a terminal (first terminal) 321a, for example, is selected, and an electromagnetic wave L is irradiated onto the selected terminal 321a (in Step T611). Upon lapse of a time after irradiation of the electromagnetic wave L, for example, at a timing t1 (in Step T612), irradiation of the electromagnetic wave L is switched over to a second terminal, for example, to a terminal 321*aa* shown in FIG. 8 (in Step T613). At the same time, current values due to irradiation onto the first terminal 321*a* and the second terminal 321*aa* for respective times are measured (in Step T614), and the measured current values are integrated to calculate charged amounts with respect to irradiation onto the first terminal 321*a* and the second terminal 321*aa* for the respective times (in Step T615). At this stage, if the first terminal 321*a* and the second terminal 321*aa* are not in continuity, the electrons discharged from the first terminal 321*a* due to irradiation of electromagnetic wave onto the first terminal 321*a* in Step T611 run toward the plate electrode 253 at a high potential, whereby a current runs through the plate electrode 253 along with potential rise of the first terminal 321*a*. Thereafter, when irradiation of an electromagnetic wave is switched over to the second terminal 321*aa* in Step T613, electrons run from the second terminal 321*aa* which is in a low potential toward the plate electrode 253 which is in a high potential. Changes of the potentials at the first terminal 321*a* and the second terminal 321*aa*, the currents detected by the current detecting section 280, and the charged amounts calculated by integrating the detected current values with respect to the first terminal 321*a* and the second terminal 321*aa* in this state are, for example, as shown in respective graphs of FIG. 14A.

On the other hand, in the case where the potential of the first terminal 321*a* is raised by irradiation of electromagnetic wave onto the first terminal 321*a* in Step T611 when the first terminal 321*a* and the second terminal 321*aa* are in continuity, the potential of the second terminal 321*aa* which is in continuity with respect to the first terminal 321*a* is also raised. In this state, even if the second terminal 321*aa* is irradiated with an electromagnetic wave in Step T613, electrons discharged from the second terminal 321*aa* are not electrically attracted toward the plate electrode 253, and an electric field resulting from attraction of electrons is not generated. As a result, the electrons do not travel toward the plate electrode 253, and the current value detected by the current detecting section 280 is zero or exceedingly lower than the current value detected in the case where the first terminal 321*a* and the second terminal 321*aa* are in continuity. The potentials at the first terminal 321*a* and the second terminal 321*aa*, the currents detected by the current detecting section 280 with respect to the first terminal 321*a* and the second terminal 321*aa*, and the charged amounts obtained by integrating the detected currents when irradiation is switched over from the first terminal 321*a* to the second terminal 321*aa* in this state are, for example, as shown in respective graphs of FIG. 14B.

Upon completion of current measurements, the controller 201 calculates a change of the charged amount Q on a time-basis by integrating the current values detected by the current detecting section 280 (in Step T616), and determines whether the first terminal 321*a* and the second terminal 321*aa* are in continuity based on the result of calculation (in Step T617) Specifically, in the case where the actually measured charged amount Q varies before and after the timing t1, as shown in FIG. 14A, it is judged that the first terminal 321*a* and the second terminal 321*aa* are not connected with each other. On the other hand, in the case where the changed amount Q does not vary before and after the timing t1, as shown in FIG. 14B, it is judged that the first terminal 321*a* and the second terminal 321*aa* are connected with each other. Thus, a test with respect to one target wiring is completed. The aforementioned series of operations with respect to the wiring test are repeated until the test is completed with respect to all the wirings of the work 210 (in Step T618).

In the above embodiment, described is the case where the test is performed between the first terminal 321*a* and the second terminal 321*aa* which are designed to be continuous with each other as shown in FIG. 8. In this case, if the terminals 321*a* and 321*aa* are in continuity, it is judged that the wiring test between the terminals 321*a* and 321*aa* has "PASSED", whereas if the terminals 321*a* and 321*aa* are discontinuous, it is judged that the terminals 321*a* and 321*aa* are in an open circuit state.

On the other hand, in the case where the test is performed by selecting terminals which are not designed to be continuous, e.g., in the case of the terminals 321*a* and 322*a*, if the terminals 321*a* and 322*a* are in discontinuity, it is judged that the wiring test between the terminals 321*a* and 322*a* has "PASSED", whereas if the terminals 321*a* and 322*a* are in continuity, it is judged that the terminals 321*a* and 322*a* are in a short circuit state. Thus, in the testing apparatus in accordance with the second embodiment, a judgment as to whether an arbitrary combination of terminals of wirings formed on a circuit board is in continuity or discontinuity enables one to test open-circuits and shorts in the wirings.

As mentioned above, in the second embodiment, an electromagnetic wave is selectively irradiated on a plurality of terminals one after another, and it is judged whether the selected pair of terminals is in continuity or not based on a change of an amount of electric charges that have run through and detected by the current detecting section 280 before and after the irradiation is switched over between the pairs of terminals. In this embodiment, a high potential is applied to the plate electrode 253 which is provided in the vicinity of the terminals to securely allow the plate electrode 253 to trap electrons discharged from the terminals. This arrangement enables to precisely and stably test opens and shorts-circuit of the selected pairs of terminals.

In this embodiment, measured is a current that has run through the current detecting section 280 with the irradiation being switched over from the first terminal to the second terminal. Alternatively, it may be possible to allow the current detecting section 280 to keep on measuring a current for some time before the selected first terminal is irradiated so as to integrate the charged amount.

In this embodiment, it is required to monitor the current for a time period from the start of current flow until the current flow is suspended so as to calculate a charged amount Q for the monitored time by integrating the monitored current values. In view of this, this embodiment adopts a technique of securely detecting travel of electric charges by continuously measuring currents for a time being while the electromagnetic wave is being irradiated. Alternatively, change of currents may be monitored until the current falls down to a predetermined level, current may be measured continuously until the current or its integration becomes lowered than a predetermined value.

In the second embodiment, the amount of charge Q is calculated by integrating current values on time-basis to judge whether the target wiring is in continuity based on the calculated charged amount Q. Alternatively, a peak value of current may be detected to judge whether the detected peak value is lower than a reference value or to count a time until the detected current falls to a predetermined level so as to determine whether the target wiring is in continuity.

Alternatively, a test may be performed by combining the test made in the second embodiment and any of the above mentioned alternative tests. As an example, the following arrangement is appreciated. An electromagnetic wave is irradiated onto the first terminal to perform a test with respect to a wiring (target wiring) connected to the first terminal. When the target wiring is judged to be in an open or short circuit state, it is subsequently tested whether the target wiring relative to the other wirings are in continuity. This arrangement enables detection of the portion and the nature of the defect of the tested circuit board.

As mentioned above, there is a case that a test by a testing apparatus which is not provided with an insulating film 242 is advantageous even if a work 210 is a circuit board having wirings on the opposite sides thereof. This is because a wiring 212 connected to a terminal 212b functions as part of the second electrode portion by allowing the terminal 212b which is formed on the lower surface of the circuit board, to be electrically connected to a metallic plate 241 in the case where such a circuit board is rendered into direct contact with the metallic plate 241. In view of this, in the case where the work 210 is, for example, a circuit board having a lower surface formed with a ground layer, or a circuit board in which a terminal to be connected to a ground layer formed inside the circuit board is provided on the lower surface of the circuit board, it is possible to function the ground layer as part of the second electrode portion by rendering the work 210 into direct contact with the metallic plate 241. At this time, the capacity of the capacitor comprised of the target wiring and the second electrode portion can be raised, and the current running through the capacitor can be increased with the result that detection of the current by the current detecting section 280 is facilitated.

Further, since the position of the target wiring relative to the second electrode portion is clearly determined, a variation of capacity of the capacitor comprised of the target wiring and the second electrode portion is lessened. As a result, a precise and stable test can be performed.

In the second embodiment, providing the metallic plate 241 on the lower fixture unit 240 to oppose the metallic plate 241 to the work 210 and connecting the metallic plate 241 to the power source 270 enables the metallic plate 241 to function as the second electrode portion. For example, in the case where the work 210 is a multi-layered substrate in which each of a plurality of layers formed with a wiring pattern are placed one over another, it is impossible to secure a sufficient capacity between a target wiring and the metallic plate 241 because the other wirings, a power source, or a ground layer may intervene between the target wiring and the metallic plate 241. As a result, it is highly likely that a precise and stable test cannot be performed. In such a case, functioning the wiring formed in the circuit board, e.g., the ground layer as the second electrode portion enables one to perform a wiring test precisely and stably.

FIG. 15 is a diagram showing a testing apparatus as a first modification of the second embodiment in which a ground layer formed in a circuit board functions as the second electrode portion.

The testing apparatus as the first modification is adapted to test the electric state of a circuit board 220. As shown in FIG. 15, the circuit board 220 is formed with a plurality of wirings 222 on a base plate 221. Each wiring 222 includes terminals 222a and 222b which are formed on the respective opposite surfaces of the circuit board 220, and a conductive portion 222c which is formed on the surface or inside the circuit board 220 and is electrically connected to the terminals 222a and 222b. A ground layer 223 is provided inside the base plate 221 to apply a reference potential to an electronic circuit established on the circuit board 220 to implement predetermined operations of the apparatus. The ground layer 223 extends substantially over the entire surface of the circuit board 220 except portions allowing passage of the conductive portions such as 222c, and is connected to a terminal 223a which is formed on the upper surface of the circuit board 220 so as to be electrically connected to an external ground. In this modification, described is a case where the circuit board 220 having the above construction is used as a work to be tested by the testing apparatus of the first modification. It is needless to say that the work to be tested by the apparatus is not limited to the aforementioned circuit board. The inventive apparatus may test a circuit board, for example, in which a ground layer 223 is a conductive member in the form of a mesh.

In this modification, a lower fixture unit 240 includes a non-conductive support block 243, whereas in the arrangement of the second embodiment, the lower fixture unit 240 includes the metallic plate 241 and the insulating film 242 as shown in FIG. 8. The arrangement of the modification is advantageous in that the modification does not require an electrode having a large surface area in the lower fixture unit 240 since the ground layer 223 formed inside the circuit board 220 serves as the second electrode portion. It should be appreciated that the arrangement of the second embodiment shown in FIG. 8 also enables one to perform the same test as in this modification.

Similar to the testing apparatus in accordance with the second embodiment, the modified apparatus is constructed in such a manner that an upper fixture unit 250 is moved toward the work 220 to securely hold the work 220 between the upper fixture unit 250 and the lower fixture unit 240, whereby an airtight closed space SP is defined by a housing 251, seal member 252 and the work 220. The housing 251 is so constructed as to expose the terminal 223a connected to the ground layer 223, outside the closed space SP. A conductive probe 257 is provided on the upper fixture unit 250 to be connected to a current detecting section 280. The conductive probe 257 is rendered into contact with the terminal 223a connected to the ground layer 223 of the work 220 as the upper fixture unit 250 is moved to the work 220 positioned at a test position, thereby securing electric connection between the ground layer 223 and the current detecting section 280. In this modification, since it is not required to provide electric connection between the lower fixture unit 240 and the current detecting section 280, a conductive probe 281 which is provided in the apparatus of the second embodiment as shown in FIG. 8 is omitted. Since the arrangement of the first modification of the second embodiment is substantially identical to the arrangement of the second embodiment shown in FIG. 8 except the above mentioned configuration, the elements of the first modification which are identical to those of the second embodiment are denoted with the same reference numerals, and a description thereof is omitted herein.

In this modification, the ground layer 223 is electrically connected to the current detecting section 280 via the conductive probe 257. Each of the wirings 222 formed on the circuit board is capacitively coupled to the ground layer 223. In this way, the ground layer 223 satisfies a requirement as the second electrode portion, namely, the requirement that the second electrode should be connected to an external power source and capacitively coupled to a target wiring inside the circuit board. Thus, the ground layer 223 can function as the second electrode portion in the first modification.

Operations of the testing apparatus as the first modification are the same as those of the testing apparatus in accordance with the second embodiment as shown in FIG. 8 except the following.

Specifically, in the first modification, a current due to photoelectric effect runs through the current detecting section 280 from the ground layer 223 via the conductive probe 257, whereas in the second embodiment, a current runs through the current detecting section 280 from the metallic plate 241 via the conductive probe 281. The other operations of the testing apparatus in the first modification are the same as the testing apparatus in accordance with the second embodiment shown in FIG. 8. The first modified testing apparatus enables one to precisely and stably test whether a target wiring is in a short circuit state or an open circuit state, and test as to whether there is a continuity between a selected pair of terminals.

In the first modification, it is judged whether each wiring is in a short circuit state or an open circuit state based on an amount of electric charges that have been charged in a capacitor comprised of the ground layer 223 and each wiring. Thus, since the target wiring and the second electrode portion are provided on the same circuit board, there is no likelihood that the capacity may vary due to a positional displacement of the circuit board relative to the lower fixture unit when placing the circuit board to a test position, a warp or a variation of thickness over the entirety of the circuit board. As a result, this arrangement enables to perform a wiring test precisely and stably.

In this modification, described is the case where the terminal 223a connected to the ground layer 223 is formed on the upper surface of the circuit board 220. This invention is applicable to a modification other than the aforementioned modification. For instance, as far as the circuit board 220 has a ground terminal on the lower surface thereof, it may be possible to electrically connect a ground layer 223 to a power source 270 or allow a conductive probe 257 to come into contact with the ground terminal through the lower surface of the work 220 by constructing a lower fixture unit with a metallic plate 241 which is not formed with an insulating film and rendering the ground terminal into contact with the metallic plate 241.

In this modification, the ground layer formed inside the circuit board 220 serves as the second electrode portion. Alternatively, a ground plane which is so formed as to cover generally an entirety of one surface of a circuit board, or a wiring other than the ground layer formed in the circuit board, e.g., a wiring serving as a power line may be used as the second electrode portion.

FIG. 16 is a diagram showing a testing apparatus as a second modification of the second embodiment of the invention. The arrangement and operations of the testing apparatus in the second modification are basically the same as those of the testing apparatus in accordance with the second embodiment shown in FIG. 8. However, the manner of capturing the photoelectron is different between the second modification and the second embodiment, and part of the arrangement of the second modification differs from the second embodiment in association with the difference in the manner of photoelectron capturing. Accordingly, only the differences between the second modification and the second embodiment are described herein. Elements of the second modification which are identical to those of the second embodiment are denoted with the same reference numerals, and a description thereof is omitted herein.

The testing apparatus as the second modification of the second embodiment is adapted for testing an electric state of a circuit board 230. As shown in FIG. 16, the circuit board 230 is constructed in such a manner that a plurality of wirings 232 are formed on a base plate 231. Each wiring 232 includes terminals 232a and 232b which are formed on the respective opposite surfaces of the circuit board 230 to be connected to an electronic component mounted on the circuit board or an external wiring, and a conductive portion 232c which is formed on the surface or inside the circuit board 230 to be connected to the terminals 232a, 232b. In this modification, described is a case where the circuit board 230 having the above construction is used as a work to be tested by the testing apparatus. It is needless to say that the work is not limited to the above circuit board.

In this modification, similar to the testing apparatus in accordance with the second embodiment shown in FIG. 8, an upper fixture unit 250 is moved toward the work 230 to securely hold the work 230 between the upper fixture unit 250 and the lower fixture unit 240, whereby an airtight closed space SP is defined by a housing 251, a seal member 252 and the work 230. The housing 251 is so constructed as to expose a terminal 233b-1 of a wiring 233b including the terminal 233b-1 and a terminal 233b-2, outside the closed space SP and accommodate the terminal 233b-2 inside the closed space SP. The upper fixture unit 250 is provided with a conductive probe 258, and is connected to the plus terminal of a power source 270. The conductive probe 258 is adapted to electrically connect the terminal 233b-1 and the plus terminal of the power source 270 as the upper fixture unit 250 is moved to the work 230 positioned at the test position. Thereby, a voltage of the power source 270 is applied between the wiring 233b connected to the terminal 233b-1 and a metallic plate 241 serving as the second electrode portion of this invention. When the voltage is applied, an electric field is generated in the vicinity of the terminal 233b-2 which is connected to the wiring 233b and is accommodated in the closed space SP. Then, when a controller 201 selects a wiring 233a as a target wiring, and an electromagnetic wave irradiator 260 irradiates an electromagnetic wave L onto a terminal potion 233a-1 of the target wiring 233a, electrons are discharged from the terminal 233a-1 and electrically attracted and captured on the terminal 233b-2 aided by the existence of the electric field. As a result, a current runs through the power source 270 via the conductive probe 258. At this time, electrons run through the metallic plate 241 which is capacitively coupled to the target wiring 233a, from the power source 270 via the current detecting section 280 and the conductive probe 281. As a result, a current is detected by the current detecting section 280. Thus, a wiring test can be performed by the testing apparatus of the second modification in the similar manner as the testing apparatus in accordance with the second embodiment of the invention.

As mentioned above, in the second modification of the second embodiment, the upper fixture unit 250 is constructed in such a manner that the terminal 233b-1 of the wiring 233b formed on the circuit board 230 is exposed outside the closed space SP, and the opposite terminal 233b-2 of the wiring 233b is housed inside the closed space SP. Electrically connecting the terminal 233b-1 to the power source 270 via the conductive probe 258 in the above arrangement enables the wiring 233b to function as the first electrode portion to capture the photoelectron discharged from the terminal irradiated by electromagnetic wave. As a result, this modification does not require a plate electrode 253 which is provided in the testing apparatus in accordance with the second embodiment shown in FIG. 8, and the housing 251 is so configured as to secure a minimal surface area for covering the terminal of a wiring to be tested with respect to the work 230. Accordingly, this arrangement enables a smaller testing apparatus while reducing a volume of the closed space SP which is subjected to depressurization. Thus, a wiring test can be performed in a shorter time because a time required for depressurization is shortened due to the reduced volume of the closed space SP.

This invention is not limited to the aforementioned embodiments and modifications. Various modifications and alterations can be provided. For instance, in the second embodiment and its modifications, described is the case where the interior of the housing is depressurized. Alternatively, a depressurization may not be required or the vacuum degree may be varied as the case may be. Further, in the second embodiment and its modifications, the housing is so configured as to cover the terminal of the target wiring formed on the surface of the circuit board so as to irradiate an electromagnetic wave onto the terminal. Alternatively, there may be provided an arrangement in which a closed space is defined by fitting contact of an outer circumferential portion of a housing with an outer circumferential portion of a lower fixture unit and the entirety of a circuit board is housed in the closed space for depressurization. As a further altered form, a housing may be so configured as to house a circuit board and a lower fixture unit as a whole so as to depressurize the entire interior of the housing.

Further, combination of the modifications of the second embodiment may be applicable. For instance, combining the first modification and the second modification enables a wiring formed on a circuit board (i.e., work) which is connected to a power source to function as the first electrode portion and a ground layer formed on the circuit board to function as the second electrode portion so as to perform a wiring test.

As mentioned above, in the second embodiment and its modifications, since a high potential is applied to the first electrode portion which is disposed in the vicinity of the terminal to be connected to the target wiring, electrons discharged from the terminal due to photoelectric effect upon irradiation of an electromagnetic wave are securely attracted and trapped on the first electrode portion. Furthermore, since the second electrode portion is so arranged as to be capacitively coupled to the target wiring, the electrons that have run through the first electrode portion are securely detected as a current running through a closed circuit via the capacitor comprises of the target wiring and the second electrode portion. Thus, a wiring test is performed based on the detected current. This arrangement enables testing of open circuits and short circuits in the target wiring without electric contact of both surfaces of the circuit board with the upper and lower fixtures.

Figure 17:
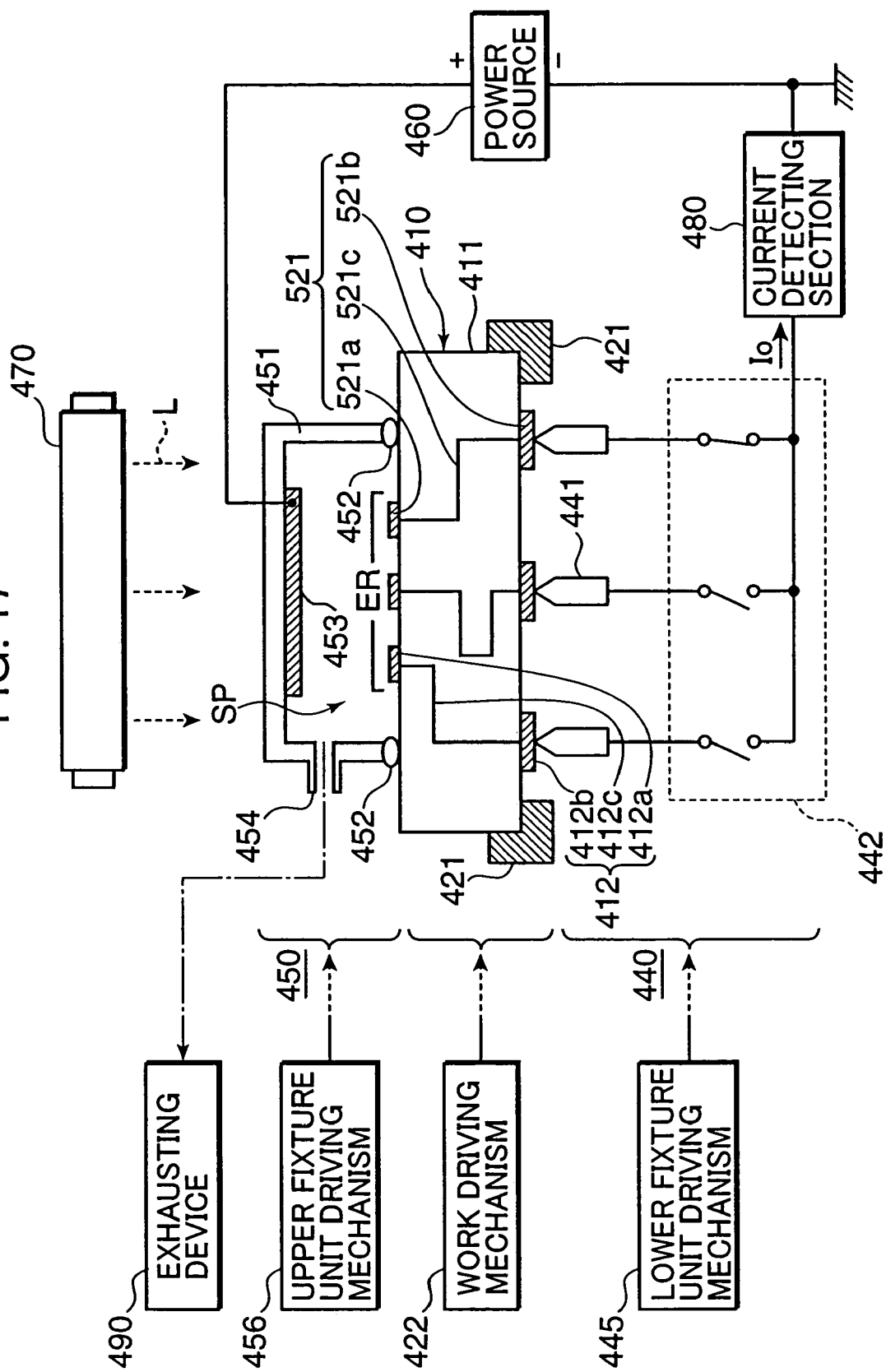
FIG. 17 is a diagram showing a circuit board testing apparatus in accordance with a third embodiment of the invention.
Figure 18:
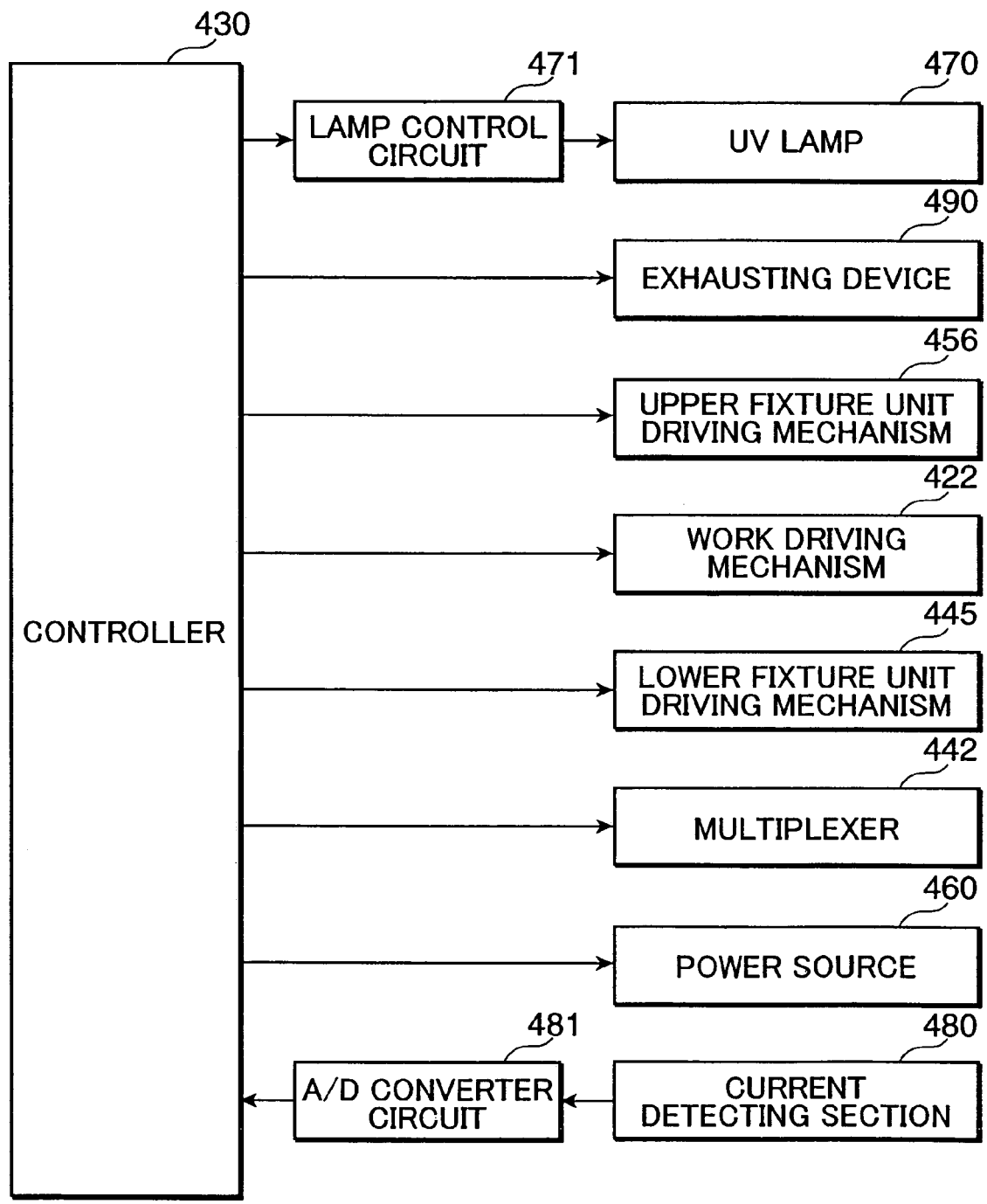
FIG. 18 is a block diagram showing an electric arrangement of the testing apparatus shown in FIG. 17.

FIG. 17 is a diagram showing a circuit board testing apparatus in accordance with a third embodiment of the invention. FIG. 18 is a block diagram showing an electric configuration of the testing apparatus in FIG. 17. A circuit board testing apparatus is adapted to test a circuit board 410 which is capable of mounting thereon a semiconductor chip according to C4 (Controlled Collapse Chip Connection) package method.

As shown in FIG. 17, the circuit board 410 is constructed in such a manner that a plurality of wirings as represented by the wiring 412 are formed on a base plate 411. Each wiring 412 includes a pad portion 412a formed on one surface of the base plate 411 to be connected with a pad on a semiconductor chip, a ball grid portion 412b formed on the opposite surface of the base plate 411, and a conductive portion 412c arranged on or in the base plate 411 to electrically connect the pad portion 412a and the ball grid portion 412b. The pad portions 412a are arranged at small pitches to correspond to the pitches of the pads of semiconductor chips, whereas the ball grid portions 412b are arranged at larger pitches as compared to the pitches of the pad portions 412a. The pad portions 412a are gathered in a region ER on one surface of the circuit board 410. The region ER is a wiring end exposure area. In this embodiment, the circuit board 410 having the above construction is referred to as a work to be tested by the apparatus. However, it is needless to say that a circuit board to be tested by the present embodiment is not limited to the above.

The apparatus includes a work holder 421 to carry a piece of circuit board as a work 410. The work holder 421 is movable between a test position (position shown in FIG. 17) where the work 410 is tested and a load/unload position (not shown) where the work 410 is loadable to the work holder 421 or unloadable from the work holder 421. A work driving mechanism 422 drivingly reciprocate the work holder 421 back and forth between the test position and the load/unload position in response to a control signal from a controller 430 which controls an overall operation of the apparatus.

A lower fixture unit 440 is provided below the work 410 at the test position. The lower fixture unit 440 includes a plurality of conductive spring probes 441 which are arranged to respectively connected with the corresponding ball grid portions 412b of the respective wirings 412. The lower fixture is further provided with a multiplexer 442, and a lower fixture base (not shown) which is movable toward and away from the work 410 while holding the probes 441 and the multiplexer 442 thereon. The lower fixture base is coupled to a lower fixture unit driving mechanism 445. The lower fixture unit driving mechanism 445 drivingly moves the lower fixture base toward and away from the work 410 in accordance with a control signal from the controller 430.

An upper fixture unit 450 is arranged above the work 410 at the test position. The upper fixture unit 450 includes a cap-like housing of a transparent glass which is formed with an exhaust port 454, and is so configured as to cover the wiring exposure area ER on the work 410. The upper fixture 450 further includes a seal member 452 mounted on an end portion of a side wall of the housing 451, and a transparent electrode 453 mounted on an inner upper surface of the housing 451. The transparent electrode 453 extends in two dimensions to substantially cover the wiring exposure area ER. These elements 451 through 454 are integrally movable toward and away from the work 410. An upper fixture unit driving mechanism 456 is coupled to the upper fixture unit 450. The upper fixture unit 450 is moved toward and away from the work 410 in response to a control signal from the controller 430.

The upper fixture unit 450 is moved to the work 410 until the seal member 452 of the housing 451 comes into contact with the surface of the work 410. As a result, the seal member 452 is resiliently deformed while being pressingly sandwiched between the bottom edge of the side wall of the housing 451 and the surface of the work 410. Consequently, an airtight closed space SP is defined by the work 410, the seal member 452, and the housing 451.

The exhaust port 454 formed in the housing 451 is communicated with an exhausting device 490 via an exhaust pipe (not shown). When the exhausting device 490 is activated based on a control signal from the controller 430, the air inside the closed space SP is exhausted to thereby render the interior of the closed space SP to a depressurized state. When a test is performed, the closed space SP is preferably held at a vacuum degree of about $10^{-2}$ atm as is the same as in the above described embodiments.

A power source 460 is provided in the apparatus to apply a certain DC voltage to a target wiring. The plus terminal of the power source 460 is electrically connected to the transparent electrode 453, and the minus terminal thereof is connected to the multiplexer 442 via a current detecting section 480. The multiplexer 442 is operated to select a ball grid portion of a wiring in response to a selection command from the controller 430. In this configuration, when, for example, as shown in FIG. 17, a ball grid portion 521b of a wiring 521 is selected based on a selection command from the controller 430, a DC voltage of the power source 460 is applied between the ball grid portion 521b and the transparent electrode 453. In this case, the wiring 521 is a target wiring to be tested. A current value measured by the current detecting section 480 is converted into a digital signal by an A/D converter circuit 481, and sent to the controller 430. Thereupon, the controller 430 determines whether the target wiring is in continuity or not based on the measured current value while controlling an overall operation of the apparatus.

A UV lamp 470 is provided above the upper fixture unit 450. A lamp control circuit 471 controls the UV lamp 470 to turn on and off based on a control signal from the controller 430. The UV lamp 470 emits an ultraviolet laser light beam L toward the upper surface of the housing 451. An ultraviolet laser light beam L emitted from the UV lamp 470 passes through the upper surface of the housing 451 and the transparent electrode 453, and is incident upon the wiring exposure area ER on the work 410.

In this embodiment, the UV lamp 470 is used as an electromagnetic wave irradiator. Alternatively, as far as an element is capable of causing a conductive member of a wiring on a circuit board to exhibit a photoelectric effect, such an element is usable as an electromagnetic wave irradiator. The UV lamp 470 is operable to emit ultraviolet laser light beams having a wavelength of 266 nm.

In this embodiment, ultraviolet laser light beams are emitted using the UV lamp 470 for the purpose of raising the photoelectric effect. However, this invention is not limited to a UV lamp, and visible light beams, infrared light beams or its equivalent may be used.

Figure 20:
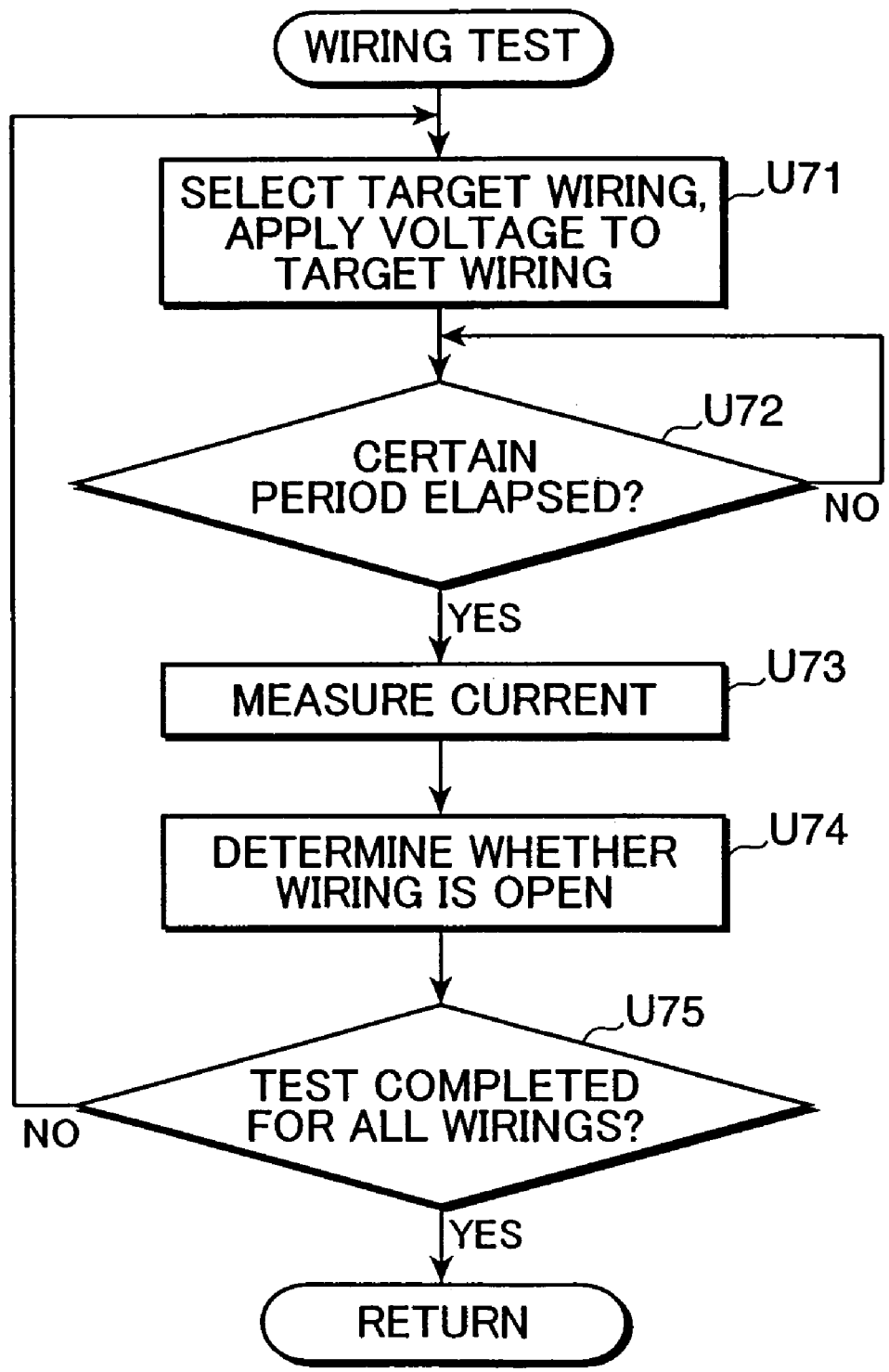
FIG. 20 is a flowchart showing operations of an open circuit testing by the testing apparatus shown in FIG. 17.

Next, an open circuit test with respect to a wiring by the testing apparatus in accordance with the third embodiment is described with reference to FIGS. 20 and 21. FIG. 20 is a flowchart showing operations of the circuit board testing apparatus shown in FIG. 17. When an untested work (circuit board) 410 is loaded on the work holder 421 at the load/unload position by a handling device (not shown) incorporated in the testing apparatus or a manual operation by an operator (in Step U1), the controller 430 starts to control operations of the various parts of the apparatus to execute the following steps U2 to U12 so as to test open-circuit of the wirings on the work 410.

First, the work holder 421 clamps the work 410 thereon in Step U2. Then, while holding the work 410 thereon, the work holder 421 is moved to the test position (position shown in FIG. 17) where the work 410 is tested (in Step U3). Thus, the work 410 is positioned at the test position.

Subsequently, the upper fixture unit 450 and the lower fixture unit 440 are moved to the work 410 (in Step U4). As the lower fixture unit 440 is moved to the work 410, as shown in FIG. 17, lead ends of conductive spring probes 441 are pressed against respective corresponding ones of the ball grid portions 412b of the wirings 412 to be electrically connected thereto. Simultaneously, the upper fixture unit 450 is moved to the test position, as shown in FIG. 17 to securely holds the work 410 between the upper fixture unit 450 and the lower fixture unit 440. Next, an exhausting device 490 is activated to depressurize the interior of the closed space SP defined by the housing 451, the seal member 452 and the work 410 (in Step U5).

Thus, when the apparatus is set up for testing the work 410, the UV lamp 470 is turned on to irradiate an ultraviolet laser light beam L onto the wiring exposure area ER (in Step U6). Then, the apparatus implements an open circuit test with respect to the target wiring (in Step U7) to test the work 410. The open circuit test are described later in detail.

Upon completion of the open circuit test, the UV lamp 470 is turned off (in Step U8). Then, the activation of the exhausting device 490 is suspended, and the air outside the apparatus is drawn into the closed space SP (in Step U9). Subsequently, the lower fixture unit 440 and the upper fixture unit 450 are moved away from the work 410 (in Step U10), and the work holder 421 releases clamping the work 410 and is retracted to the load/unload position (in Step U11). Lastly, when it is verified that the work 410 after the open circuit test is unloaded from the work holder 421 (in Step U12), the routine returns to Step U1 to implement the aforementioned series of operations.

Next, the open circuit test with respect to a wiring to be implemented by the apparatus in accordance with the third embodiment (Step U7) is described in detail with reference to FIG. 20. FIG. 20 is a flowchart showing an open circuit test with respect to a wiring to be implemented by the circuit board testing apparatus in accordance with the third embodiment. After the UV lamp 470 is turned on in Step U6, the multiplexer 442 selects an arbitrary wiring 521 as a target wiring in accordance with a selection command from the controller 430 to electrically connect the target wiring 521 to the power source 460, and a voltage is applied between the ball grid portion 521b of the target wiring 521 and the transparent electrode 453 (in Step U71). Upon lapse of a time until the power supply is stabilized (in Step U72), the current detecting section 480 measures a current running therethrough (in Step U73). When a voltage is applied between the ball grid portion 521b and the transparent electrode 453 in a state that the target wiring 521 is in continuity, an electric field is generated between the transparent electrode 453 and the pad portion 521a. At this time, electrons discharged from the pad portion 521a due to photoelectric effect are electrically attracted and captured by the transparent electrode 453 aided by the existence of the electric field. As a result, a photocurrent $I_0$ runs through a conductive pathway which is established from the plus terminal of the power source 460 to the minus terminal thereof via the transparent electrode 453, the target wiring 521, the multiplexer 442, and the current detecting section 480, and is detected by the current detecting section 480. On the other hand, in the case where the target wiring 521 is in an open circuit state, the aforementioned conductive pathway is not established, and the current value detected by the current detecting section 480 is zero or exceedingly lower than a current detected in the case where the target wiring 521 is in continuity.

In this way, the controller 430 determines, as mentioned below, whether the target wiring is in an open circuit state or not based on the current value detected by the current detecting section 480 (in Step U74). Specifically, in the case where the photoelectric current $I_0$ detected by the current detecting section 480 is equal to or greater than a predetermined threshold value I1, it is judged that the target wiring is continuous. On the other hand, if the photocurrent $I_0$ is lower than the threshold value I1, it is judged that the target wiring is discontinuous. In this way, in the third embodiment, the controller 430 has a function of a determinator as well as other function of controlling the operation of the apparatus. The threshold value I1 is determined as follows. Since the magnitude of photoelectric current is determined by multiplying intensity of irradiated electromagnetic wave i.e. light by the surface area of a conductive member irradiated with the light, the threshold value I1 is selected from a range smaller than a minimal current value which is theoretically calculated based on intensity of an ultraviolet laser light beam L and the surface area of the pad portion 412a and larger than a noise current value in order to securely distinguish the photoelectric current from the other noise currents.

In this way, when an open circuit test with respect to one wiring is completed, the routine returns to Step U71 to implement the open circuit test of another wiring. Thus, the aforementioned series of operations are repeated until the test is completed with respect to all the wirings of the circuit board.

As mentioned above, the apparatus shown in FIG. 17 is similar to the prior art arrangement in the aspect of testing whether a wiring is in an open circuit state by utilizing photoelectric effect. However, the apparatus of the third embodiment has the feature that a plurality of pad portions 412a formed on the upper plane of the work 410 are irradiated with ultraviolet laser light beams. The apparatus is advantageous in that an open circuit test can be performed with a simplified apparatus and within a short time without requiring an arrangement of focusing or scanning ultraviolet laser light beams.

Generally, a wiring formed on a circuit board defines a capacitor having a floating capacity between the wiring and a GND pad or between the wiring and the other wiring. Consequently, when a voltage is applied, a transient current runs through the wirings in an attempt to charge the capacitor. As a result, it is highly likely that an erroneous judgment is made resulting from erroneous detection of a transient current by the current detecting section 480. In view of this, this embodiment employs an arrangement in which a current is measured after implementing Step U72, namely, upon lapse of a certain stand-by time from application of a voltage until a current is stabilized. The additionally provided stand-by time, however, may extend a time required for a test. In view of this, the following first modification of the third embodiment is devised in order to shorten the test time.

Figure 21:
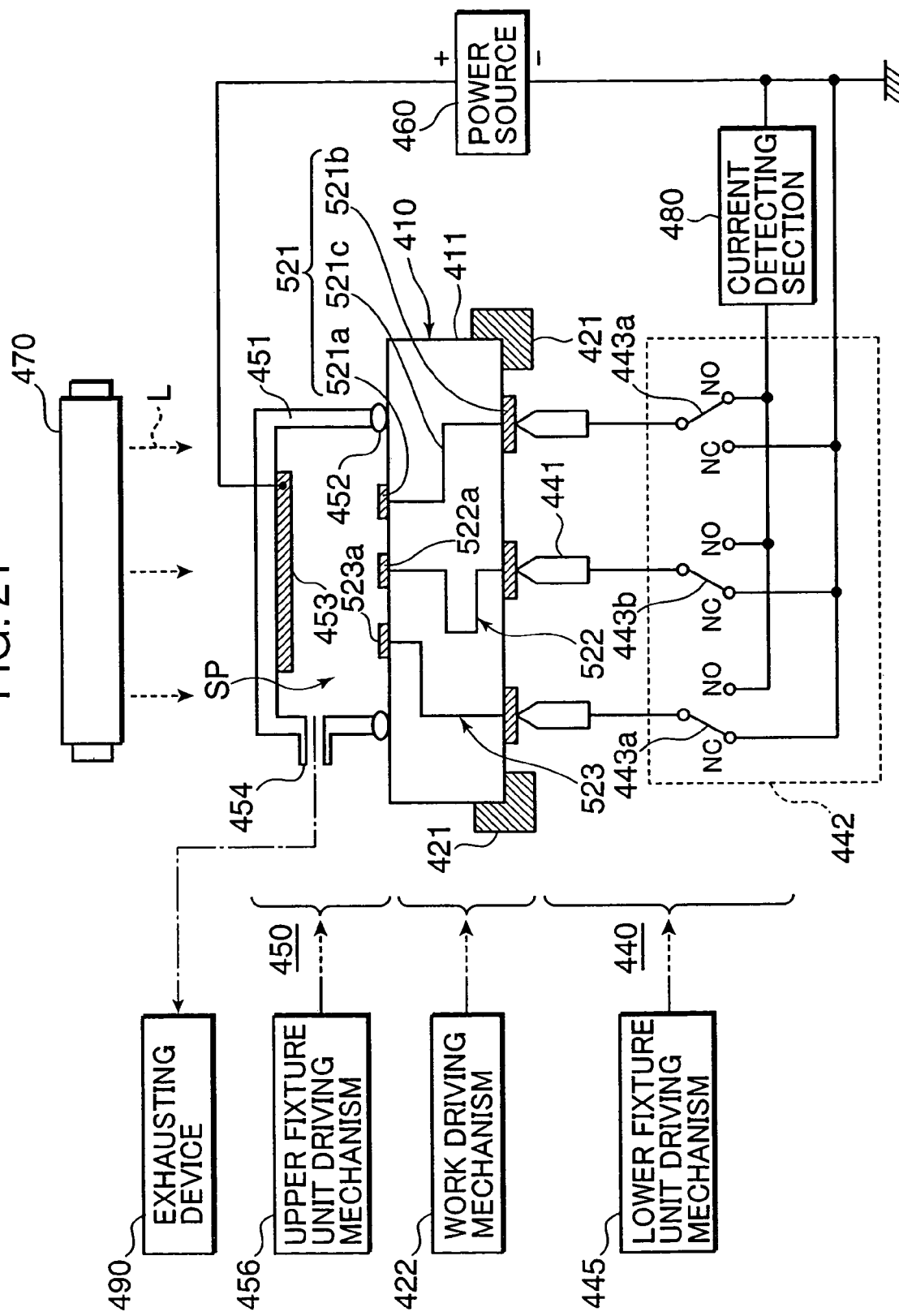
FIG. 21 is a diagram showing a testing apparatus as a first modification of the third embodiment.

FIG. 21 is a diagram showing a testing apparatus as the first modification of the third embodiment to suppress a transient current so as to shorten the stand-by time. The first modification is different from the third embodiment in that in the first modification, respective switch portions of a multiplexer 442 include normal close (NC) contacts and that the wirings other than a target wiring are connected to the minus terminal of a power source 460 bypassing a current detecting section 480 through the NC contacts. The first modification is similar to the third embodiment in that a wiring 521 selected as a target wiring is connected to the current detecting section 480 through a normal open (NO) contact. Since an arrangement of the first modification is identical to that of the third embodiment except the above points, elements of the first modification which are identical to those of the third embodiment are denoted at the same reference numerals, and a description thereof is omitted herein.

Figure 19:
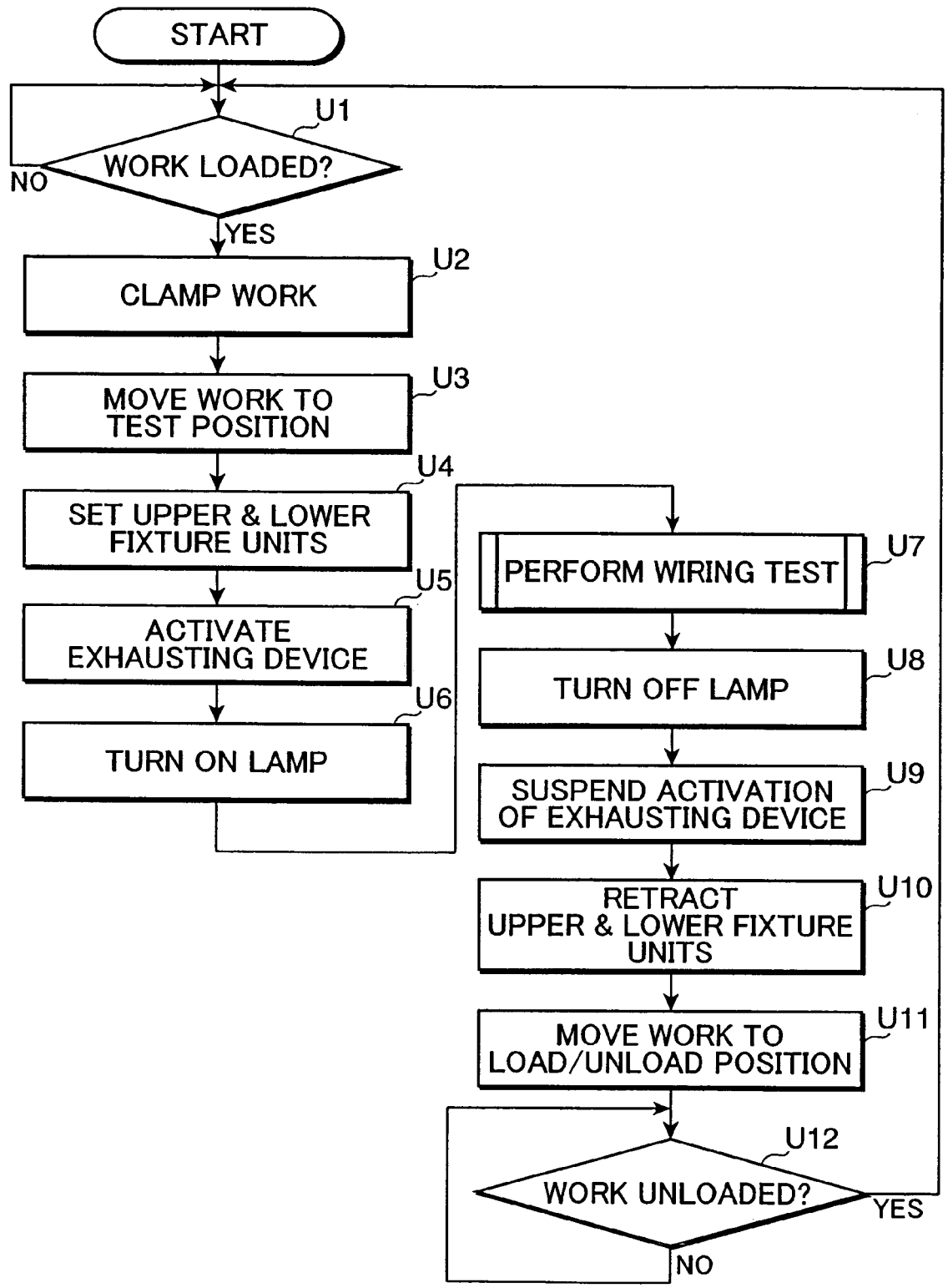
FIG. 19 is a flowchart showing operations of the testing apparatus shown in FIG. 17.

Operations of the first modification are substantially the same as those of the testing apparatus shown in FIG. 17 (as shown in the flowcharts of FIGS. 19 and 20) except the following points. Specifically, in the first modification, when a voltage is applied between a ball grid portion 521b of a target wiring 521 and a transparent electrode 453, an electric field is generated between pad portions 522a, 523a of the other wirings to which a GND potential or ground potential is applied, and the transparent electrode 453. As a result, electrons discharged from the pad portions 521a, 522a and 523a due to photoelectric effect are electrically attracted and captured by the transparent electrode 453, whereby a current runs through the wirings. The current running through the target wiring 521 is guided to the current detecting section 480 via the NO contact of the switch portion 443a of the multiplexer 442. On the other hand, the currents running through the other wirings 522, 523 are guided to the minus terminal of the power source 460 via the respective NC contacts of the switch portions 443b and 443c of the multiplexer 442. This arrangement enables to eliminate a drawback that a transient current which has undesirably run through the other wirings 522 and 523 may run through the current detecting section 480, and eliminates a likelihood that the transient current may adversely affect current detection by the current detecting section 480.

As mentioned above, the testing apparatus shown in FIG. 21 is so constructed as to keep a current running through the wirings other than the target wiring from running through the current detecting section 480. This arrangement eliminates an erroneous judgment resulting from running of a transient current through the current detecting section 480 even if the stand-by time is shortened, and consequently shortens a time required for a test as a whole.

The manner of suppressing running of a transient current described in the above first modification can be modified as shown in the following second and third modifications.

In the above, description is made about the open circuit test of a wiring, implemented by the circuit board testing apparatus according to the third embodiment. The apparatus according to the third embodiment can perform a short circuit test of the wirings by supplying test signals through the ball grid portions. For example, if the plus terminal of the power source 460 is connected to the ball grid connected to the wiring 523 and the minus terminal of the power source is connected to the ball grid connected to the wiring 522, then, the short circuit between the wirings 523 and 522 is detected. According to the second and third modifications of the third embodiment, an open circuit test with respect to a target wiring, and a short circuit test with respect to the target wiring relative to the other wiring can be performed simultaneously.

Figure 22:
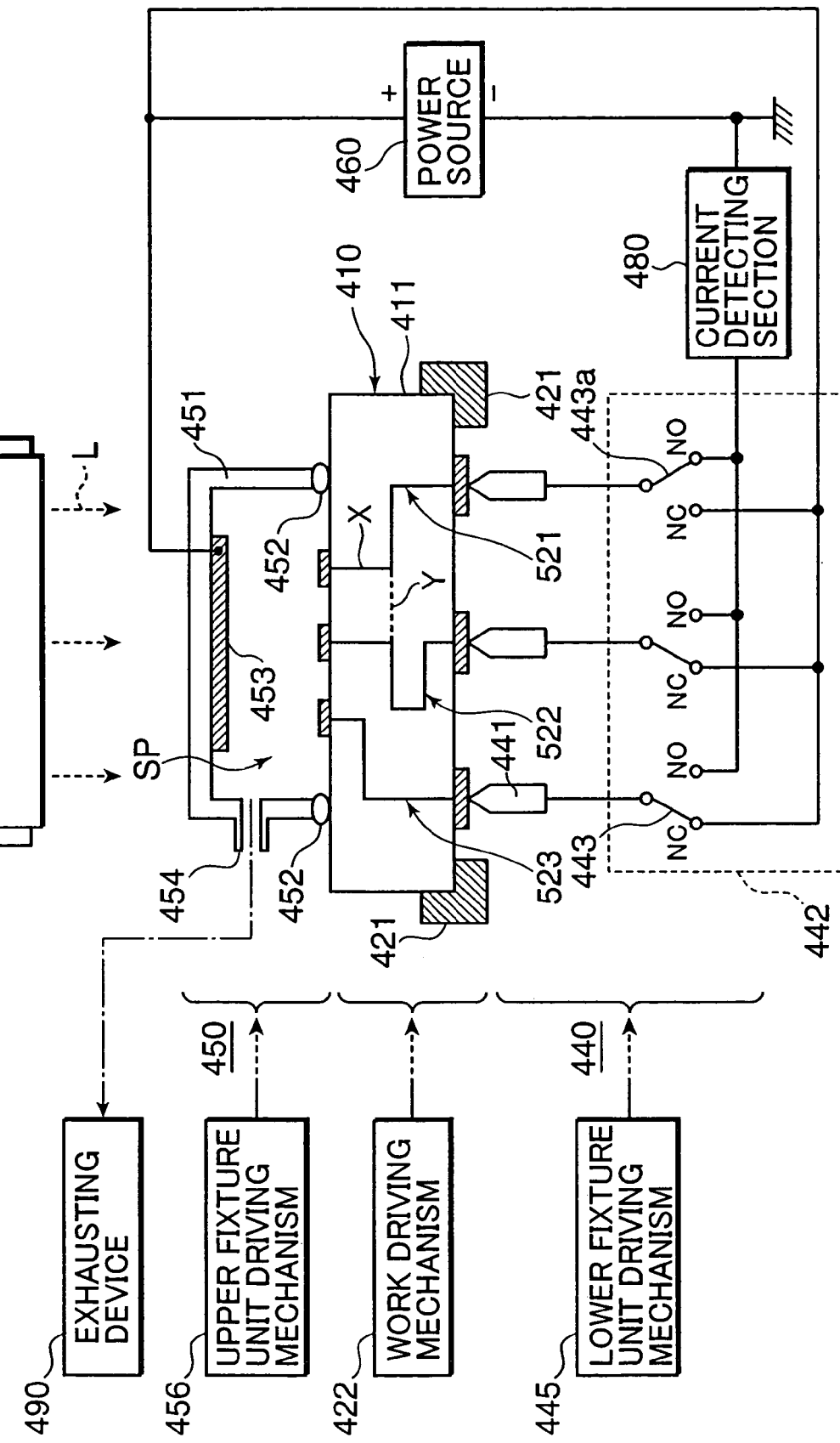
FIG. 22 is a diagram showing a testing apparatus as a second modification of the third embodiment.
Figure 23:
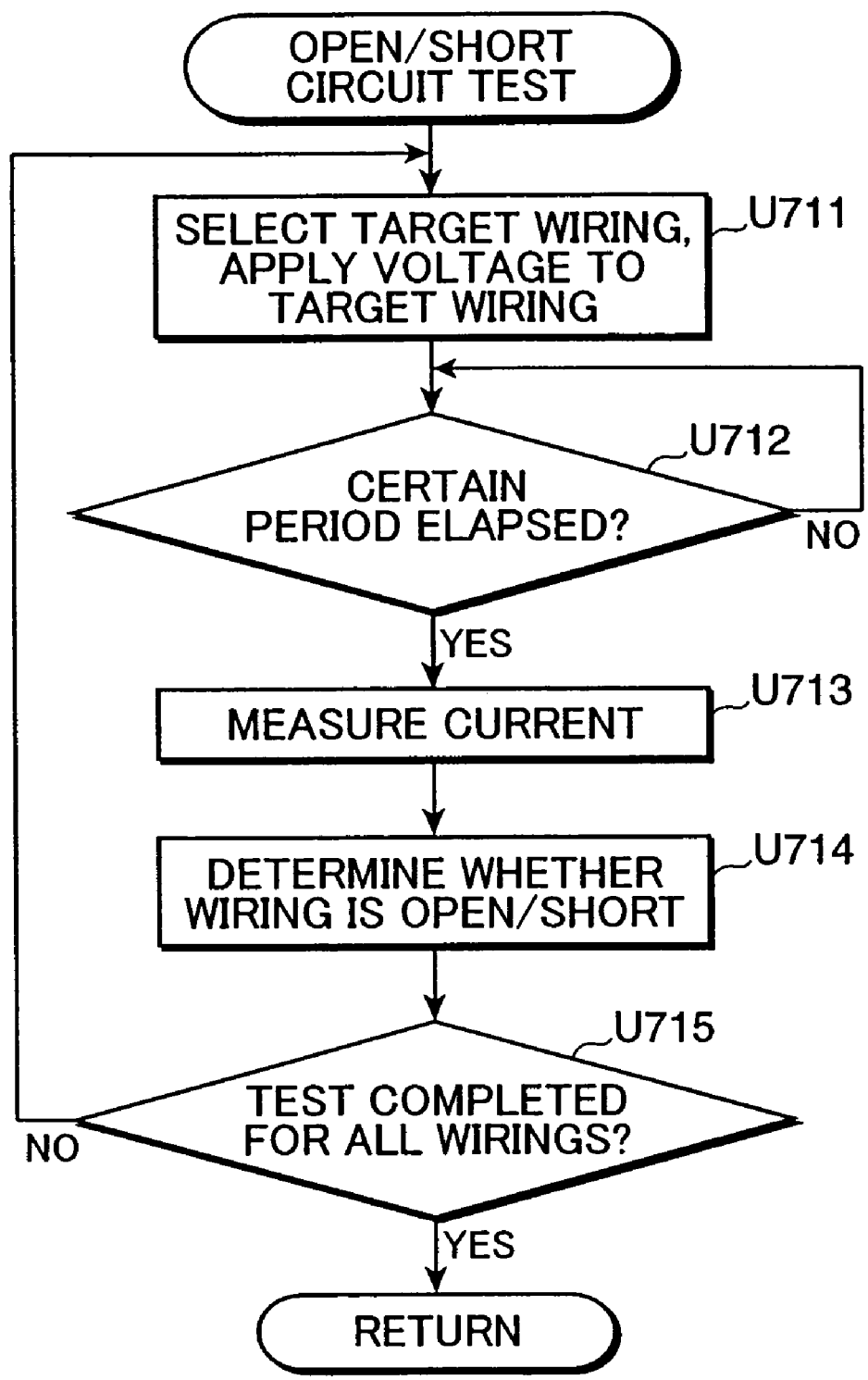
FIG. 23 is a flowchart showing operations of an open/short circuit testing by the apparatus shown in FIG. 22.

FIG. 22 is a diagram showing a circuit board testing apparatus as a second modification of the third embodiment, and FIG. 23 is a flowchart showing operations of an open/short circuit test by the apparatus shown in FIG. 22. The second modification is different from the third embodiment in that in the second modification, respective switch portions 443 of a multiplexer 442 have normal close (NC) contacts, and that wirings other than a target wiring are connected to the plus terminal of a power source 460 via the NC contacts. The second modification is similar to the third embodiment in that the wiring selected as the target wiring is connected to a current detecting section 480 via a normal open (NO) contact. Since the arrangement of the second modification is identical to that of the third embodiment except the above points, elements of the second modification which are identical to those of the third embodiment are denoted with the same reference numerals, and a description thereof is omitted herein.

Operations of the second modification are substantially the same as those of the testing apparatus shown in FIG. 17 (as shown in the flowchart of FIG. 19) except that the open/short circuit test operation shown in FIG. 23 is executed in the second modification in place of the open circuit test implemented in Step U7 of FIG. 19. The operations of the second modification are described with reference to FIGS. 19, 22, and 23.

When a UV lamp 470 is turned on in Step U6 of FIG. 19, each wiring is connected to the plus terminal of the power source 460 via each NC contact of each switch portion 443 of the multiplexer 442 to apply the same potential thereto as the transparent electrode 453. Next, the multiplexer 442 selects one wiring 521 in response to a selection command from a controller 430 in Step U711 (namely, the switch portion 443a is switched over to the NO contact) to connect the wiring 521 to the current detecting section 480. As a result, merely the wiring 521 is set to a low potential. Upon lapse of a time until a fluctuation of current detection due to a transient current becomes negligible (in Step U712), the current detecting section 480 measures a current running therethrough (in Step U713).

Here, described is a case where the wiring 521 is short-circuited with one of the other wirings 521 and 523. For instance, in the case where the wiring 521 is short-circuited with the wiring 522 at a portion y shown by the dotted line in FIG. 22, a conductive pathway is established through which a current runs from the power source 460 and is returned thereto via the wiring 522, the short-circuited portion y, the target wiring 521 and the current detecting section 480. As a result, a short-circuit current $I_s$ runs through the conductive pathway, and the current value is measured by the current detecting section 480.

On the other hand, in the case where the wiring 521 is not short-circuited with the other wiring, a current value measured by the current detecting section 480 is determined based on presence or absence of an open circuit portion in the wiring 521 as in the case of the apparatus shown in FIG. 17. If the wiring 521 is in a normal continuous state (namely, there is no open circuit portion in the wiring 521 and no short circuit portion in the wiring 521 relative to the other wiring), a photoelectric current $I_0$ runs through the current detecting section 480. On the other hand, if there is a short-circuited portion between the wiring 521 and at least one of the other wirings, a short circuit current $I_s$ runs through the current detecting section 480. Further, if there is an open circuit portion in the wiring 521, the current measured by the current detecting section 480 is zero or exceedingly lower than the current due to the photoelectric current $I_0$.

As mentioned above, generally, a short circuit current $I_s$ is distinguishably larger than the photoelectric current $I_0$. Accordingly, the controller 430 determines whether the target wiring is in an open circuit state or a short circuit state based on the current in Step U714. Specifically, if the current value detected by the current detecting section 480 is lower than a threshold value I1, it is judged that the wiring 521 is in an open circuit state. If the current value detected by the current detecting section 480 is not smaller than the threshold value I1 and smaller than a threshold value I2, it is judged that the wiring 521 is in a normal continuous state. On the other hand, if the current value detected by the current detecting section 480 is not smaller than the threshold value I2, it is judged that the wiring 521 is short-circuited with at least one of the other wirings. The threshold value I1 is determined in the similar manner as in the third embodiment.

The threshold value I2 is selected from a range larger than a possible maximal value of the photoelectric current and smaller than a possible minimal value of the short-circuit current in order to distinguish the photoelectric current from the short circuit current without fail. The maximal value of the photoelectric current may be estimated theoretically from the multiplication of an intensity of ultraviolet laser light beam L by a surface area of the pad portion 412a irradiated by the light. The minimal value of the short circuit current is theoretically estimated from the multiplication of a dimension of a short-circuited portion of the wirings by an applied voltage, with the dimension of the short-circuited portion being inferred from the design and production of the circuit board under test.

In this way, when an open/short circuit test of a wiring is completed, the routine returns to Step U711, and the aforementioned series of operations are implemented with respect to another wiring. Thus, the aforementioned series of operations are repeated until the test is completed with respect to all the wirings on the circuit board. The other operations implemented by the apparatus in the second modification are the same as those implemented by the apparatus shown in FIG. 17.

As mentioned above, the apparatus shown in FIG. 22 is operated to judge whether the target wiring is in continuity based on a difference between a photoelectric current $I_0$ running in the case where the target wiring is in a normal continuous state and a short circuit current $I_s$ running in the case where the target wire is in a short circuit state with the other wiring. This arrangement enables an open circuit test of the target wiring and a short circuit test of the target wiring relative to the other wiring simultaneously.

In the apparatus shown in FIG. 22, in the case where the target wiring has an open circuit portion x and a short circuit portion y at the same time, the current value detected by the current detecting section 480 is about the level of a short circuit current $I_s$. Therefore, the controller 430 may prioritize the judgment that there is a short circuit portion in the target wiring, and resultantly misjudge that there is no open circuit portion. Further, if the short circuit current $I_s$ is about the same level as that of the photoelectric current $I_0$ due to a large electric resistance at the short circuit portion, the controller 430 may misjudge that the target wiring is in a normal continuous state despite the fact that there is a short circuit portion.

Figure 24:
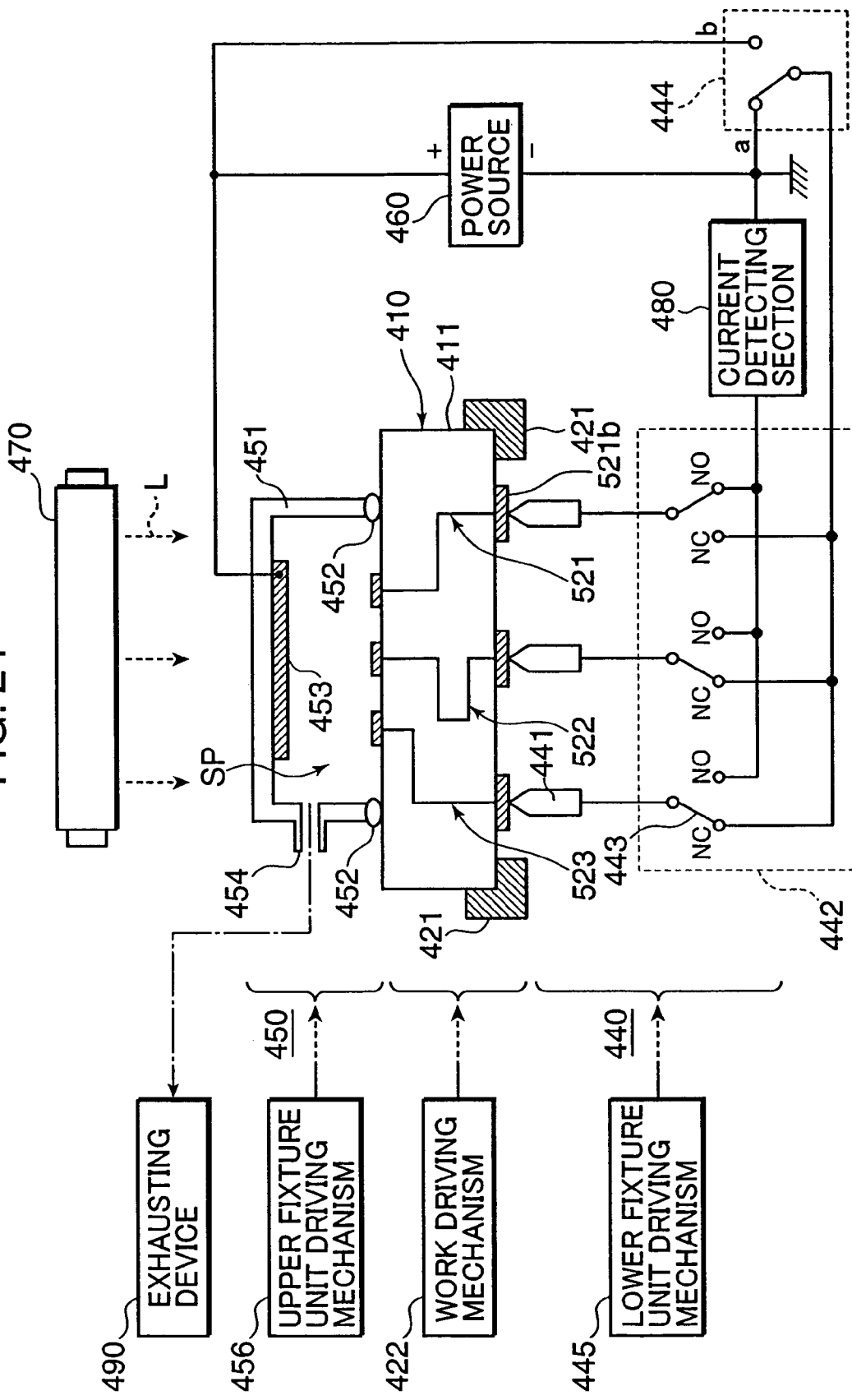
FIG. 24 is a diagram showing a testing apparatus as a third modification of the third embodiment.
Figure 25:
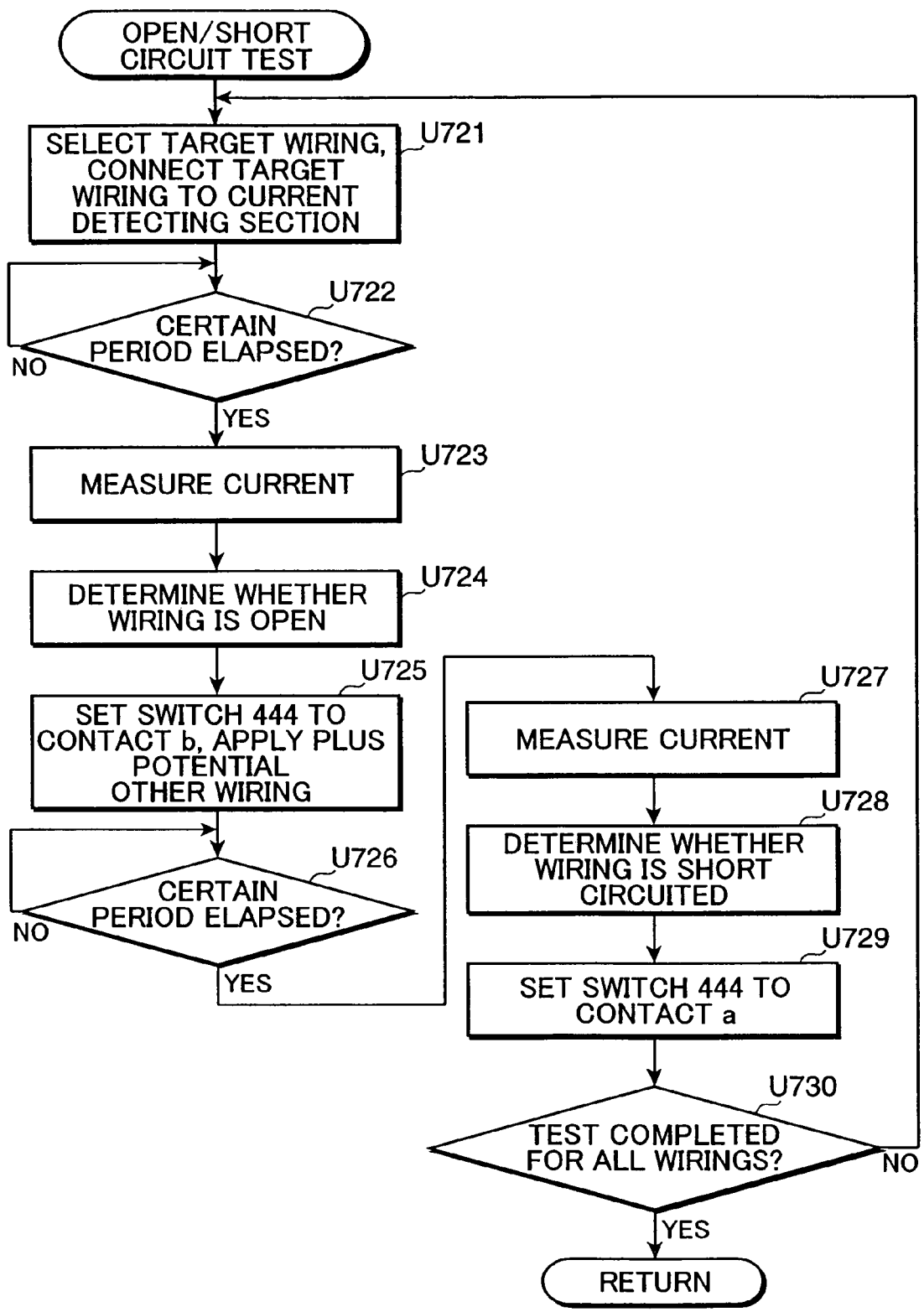
FIG. 25 is a flowchart showing operations of an open/short circuit test by the apparatus shown in FIG. 24.

In view of the above, a third modification of the third embodiment is proposed to solve the aforementioned drawback. FIG. 24 is a diagram showing an apparatus as the third modification, and FIG. 25 is a flowchart showing operations of an open/short circuit test to be implemented by the apparatus shown in FIG. 24. The apparatus of the third modification enables detection of both open circuit and short circuit by implementing short circuit test after the test of continuity of a target in the manner as is done by the second modification of the third embodiment. The arrangement of the third modification is identical to that of the second modification except the following points. In the third modification, a changeover switch 444 is additionally provided to switch over the NC contacts of switch portions 443 of a multiplexer 442 between the plus terminal and the minus terminal of a power source 460 to render each switch portion 443 to be selectively connected to both terminals or poles of the power source 460. Since the other arrangement of the third modification is identical to that of the second modification, elements of the third modification which are identical to those of the second modification are denoted with the same reference numerals, and a description thereof is omitted herein.

An open/short circuit test to be implemented by the apparatus of the third modification is described with reference to FIGS. 24 and 25. First, at an initial stage of the test, the changeover switch 444 is set to a contact a with all the switches of multiplexer 442 being set to NC terminals to connect all the wirings on a circuit board 410 to the minus terminal of the power source 460 bypassing the a current detecting section 480. Then, in Step U721, the multiplexer 442 is operated to select one wiring 521 in response to a selection command from a controller 430 to connect the wiring 521 to a current detecting section 480. Upon lapse of a time until a fluctuation of current detection due to a transient current becomes negligible (in Step U722), the current detecting section 480 measures a current running therethrough (in Step U723). Then, the controller 430 judges whether the wiring 521 is in an open circuit state or not based on the measured current value.

Subsequently, the changeover switch 444 is switched over to a contact b, and a plus potential is applied to wirings 522 and 523 which are the wirings other than the target wiring 521 selected for the testing (in Step U725). Thereafter, upon lapse of a time (in Step U726), the current detecting section 480 measures a current running therethrough in substantially the same manner as that of the open/short circuit test implemented by the apparatus shown in FIG. 22, (in Step U727). Similar to the apparatus shown in FIG. 22, the controller 430 judges whether there is a short circuited portion between the wiring 521 and the other wirings, based on the measured current value. Thus, upon completion of the open circuit test with respect to the wiring 521 and the short circuit test between the wiring 521 and the other wirings, the changeover switch 444 is switched over to the contact a again (in Step U729). The aforementioned series of operations are repeated until the open/short circuit test is completed with respect to all the wirings on the circuit board 410 (in Step U739).

As mentioned above, the apparatus shown in FIG. 24 is arranged to perform an open circuit test and then a short circuit test by utilizing photoelectric effect. This arrangement enables to perform an open circuit test with respect to a target wiring and a short circuit test between the target wiring and the other wirings without the drawbacks that an open circuit portion is neglected due to the presence of a short-circuited portion and that an erroneous judgment that the target wiring is in a normal continuous state is made despite the fact that there is a short-circuited portion in the target wiring.

In the third embodiments, the ultraviolet laser light is not necessary in the short circuit test. In view of this, the arrangement of the third modification may be so configured as to turn off the UV lamp 470 after the open circuit test. However, it is preferable to stabilize the intensity of ultraviolet laser light beam in order to perform a precise test. To this end, it is practically desirable to keep turning the UV lamp 470 on until the open circuit test is completed with respect to all the wirings formed on at least one work 410.

In the third modification, the changeover switch 444 is provided to selectively connect both terminals of the power source to the wirings other than the target wiring. Another arrangement is available to selectively connect both terminals of the power source to the wirings other than the target wiring. For instance, it may be possible to provide an additional contact for each switch portion 443 of the multiplexer 442 in the apparatus shown in FIG. 22, connecting the additional contact to the minus terminal of the power source 460. Switching over of the switch portions 443 enables selective switch over of the voltages applied to the other wirings while selecting the target wiring.

FIG. 26 is a diagram showing a fourth modification of the third embodiment. The basic principle of the testing according to the fourth modification is the same as the third embodiment except the manner of applying a voltage from a power source and the manner of collecting or capturing the electrons discharged by the photoelectric effect. Accordingly, elements of the fourth modification that are identical to those of the third embodiment are denoted at the same reference numerals, and the fourth modification is described primarily focusing on differences between the fourth modification and the third embodiment.

The testing apparatus as the fourth modification is not provided with an electrode on the housing 451 for trapping or capturing photoelectrons and is so configured as to trap or capture electrons discharged from a target wiring, by applying a voltage to all or part of wirings formed around the target wiring. To this end, in the fourth modification, the plus terminal of a power source 460 is connected to each NC contact of each switch portion 443 of a multiplexer 442, and the minus terminal thereof is connected to each NO contact of each switch portion 443 of the multiplexer 442 via a current detecting section 480.

Here, described is a case where, as shown in FIG. 26, a switch portion 443a connected to a wiring 521 of the multiplexer 442 is connected to the NO contact to make the wiring 521 a target wiring to be tested. In this case, if the wiring 521 is in a normal continuous state, an electric field is generated between pad portions 412a of the wirings other than the target wiring 521, and a pad portion 521a of the target wiring 521 when a voltage is applied between the target wiring 521 and the other wirings. Electrons discharged from the pad portion 521a of the target wiring 521 due to photoelectric effect by irradiation of ultraviolet laser light beam are electrically attracted by the pad portion 512a aided by the existence of the electric field or potential. In the above state, if the target wiring 521 is in continuity, a conductive circuit pathway is established through which a current runs from the power source 460 and returns thereto via the other wirings and the target wiring 521. Thus, a current running through the target wiring 521 is measured by the current detecting section 480.

On the other hand, if the target wiring 521 is not in continuity i.e. open circuited, the aforementioned conductive pathway is not established, and a current value detected by the current detecting section 480 is zero or exceedingly lower than a current value detected in the case where the wiring 521 is in continuity.

As mentioned above, the testing apparatus shown in FIG. 26 performs an open circuit test of wirings in the similar manner as that of the apparatus shown in FIG. 17. In the fourth modification, it is not required to provide an electrode inside a housing 451. Therefore, the housing 451 may be configured to have such a dimension as to cover a wiring terminal or pad espousing area ER on a work 410 and to enclose a minimal space above the area ER. This arrangement enables a compact size of the apparatus while simplifying the construction of the apparatus. Further, since the volume of a closed space SP defined by the housing 451, seal member 452, and the work 410 is reduced, a time required for depressurizing the interior of the closed space SP is shortened with the result that a test by the apparatus can be implemented in a short time.

In the fourth modification, it is required to perform a short circuit test between ball grid portions prior to an open circuit test. This is because if there is a short-circuited portion between the ball grid portions, a short circuit current may run through the current detecting section 480 and the current detecting section 480 may make a misjudgment that there is no open circuit portion in the target wiring.

In the fourth modification, it is preferable to use a plurality of wirings formed around a target wiring as the wirings serving as an electrode. This is because if a single wiring is used as the electrode, and the wiring has an open circuit portion, accurate test cannot be performed with such a testing apparatus.

In the fourth modification, it is possible to reverse the polarities of the power source 460 and to perform an open circuit test with respect to a target wiring by setting the target wiring at a high potential and setting the other wirings serving as an electrode at a low potential. Specifically, in this altered case, an electric field having a direction of electron flow which is opposite to that of the fourth modification is generated between the pad portions 421*a* of the other wirings and the pad portion 521*a* of the target wiring 521. In this altered case, if there is an open circuit portion in the target wiring 521, the aforementioned conductive pathway is not established, and accordingly, the open circuit test with respect to the target wiring 521 can be performed in the similar manner as the fourth modification.

This invention is not limited to the aforementioned embodiments and modifications. Various modifications and alterations can be provided. For instance, in the third embodiment and its modifications, the circuit board 410 to be tested as a work is of the type on which a semiconductor chip is mounted by C4 package method. Alternatively, this invention is applicable to test a circuit board in which one surface of a base plate is formed with wirings or a circuit board formed with a cuffed wiring pattern.

In the third embodiment and its modifications, as described is the case where the interior of the housing is depressurized. Alternatively, a depressurization may not be required or the vacuum degree may be varied according to needs. This application is based on patent application Nos. 2001-42356, 2001-111132, and 2001-111133 filed in Japan, the contents of which are hereby incorporated by reference.

Although the present invention has been fully described by way of example with reference to the accompanying drawings, it is to be understood that various changes and modifications will be apparent to those skilled in the art. Therefore, unless otherwise such change and modifications depart from the scope or spirit of the invention, they should be construed as being included therein.

What is claimed is:

1. A circuit board testing apparatus for testing a plurality of wirings of a circuit board, each wiring including a terminal formed on a surface of the circuit board and an electric conductor, which is formed on at least one of the surface of the circuit board and inside of the circuit board, and the electric conductor electrically connected to the terminal formed on the surface, the apparatus comprising:

an electromagnetic wave irradiator which irradiates an electromagnetic wave onto a terminal of a selected wiring which is formed on the surface, to discharge electrons from the irradiated terminal by photoelectric effect;

a first electrode disposed to trap the electrons discharged from the irradiated terminal;

a second electrode capacitively coupled to conductors of the plurality of wirings;

a DC power source connected between the first electrode and the second electrode to cause a difference of an electric potential in such a manner that the first electrode has a higher potential than that of the second electrode, wherein the first electrode, the DC power source, the second electrode and at least one of the conductors of the wirings form a closed loop circuit;

a current detector provided in the closed loop circuit to detect an electric current that passes through the closed loop circuit; and a judger which judges whether the electric conductor of the selected wiring is continuous, based on a current value detected by the current detector when the first terminal is irradiated by the electromagnetic wave and another current value detected by the current detector when another terminal is irradiated by the electromagnetic wave;

wherein the closed loop circuit is arranged such that the electric current, due to electrons discharged by the photoelectric effect and trapped by the first electrode, flows through the closed loop circuit including the DC power source, the second electrode and the capacitive coupling, and returns to at least one of the plurality of wirings.

2. A circuit board testing apparatus for testing a plurality of wirings formed on a circuit board, at least one of the wirings including a first terminal and a second terminal formed on a surface of the circuit board and a conductive portion, which is formed at least one of the surface of the circuit board and inside of the circuit board, and the conductive portion electrically connected to the first and second terminals, the apparatus comprising:

an electromagnetic wave irradiator which irradiates an electromagnetic wave onto a terminal of a selected wiring to discharge electrons from an irradiated terminal by photoelectric effect;

a first electrode disposed at such a position as to trap the electrons discharged from the irradiated terminal;

a second electrode capacitively coupled to the plurality of wirings;

a DC power source connected between the first electrode and the second electrode to cause a difference of electric potential in such a manner that the first electrode has a higher potential than that of the second electrode, wherein the first electrode, the DC power source, the second electrode and at least one of the conductors of the wirings form a closed loop circuit;

a current detector provided in the closed loop circuit to detect an electric current that passes through the closed loop circuit; and a judger which judges whether a conductive portion of the selected wiring between the first terminal and the second terminal is continuous based on a current value detected by the current detector when the electromagnetic wave is irradiated onto the first terminal of the target wiring and another current value detected by the current detector when the electromagnetic wave is irradiated onto the second terminal of the target wiring;

wherein the closed loop circuit is arranged such that the electric current, due to electrons discharged by the photoelectric effect and trapped by the first electrode, flows through the closed loop circuit including the DC power source, the second electrode and the capacitive coupling, and returns to at least one of the plurality of wirings.

3. A circuit board testing apparatus for testing a circuit board formed with a plurality of wirings, each wiring including a terminal formed on a surface of the circuit board and a conductive portion, which is formed on at least one of surfaces of the circuit board and inside of the circuit board, and the conductive portion electrically connected to the terminal, the apparatus comprising:
- an electromagnetic wave irradiator which selectively irradiates an electromagnetic wave onto the terminal of a selected wiring to discharge electrons from the terminal by photoelectric effect;
- a first electrode disposed at such a position as to trap the electrons discharged from the irradiated terminal;
- a second electrode capacitively coupled to at least a part of the selected wiring;
- a DC power source connected between the first electrode and the second electrode to apply a voltage in such a manner that the first electrode has a higher potential than that of the second electrode, wherein the first electrode, the DC power source, the second electrode and at least one of the wirings form a closed loop circuit;
- a current detector provided in the closed loop circuit to detect an electric current that passes through the closed loop circuit; and
- a judger which determines at least one of existence of open-circuit and short-circuit based on the electric current detected by the current detector;
- wherein the closed loop circuit is arranged such that the electric current, due to electrons discharged by the photoelectric effect and trapped by the first electrode, flows through the closed loop circuit including the DC power source, the second electrode and the capacitive coupling, and returns to at least one of the plurality of wirings.

4. The circuit board testing apparatus according to claim 3, further comprising a housing which encloses terminals of the plurality of wirings to comprise an airtight closed space, and a depressurizer which depressurizes the airtight closed space.

5. The circuit board testing apparatus according to claim 3, wherein the circuit board to be tested includes a ground layer which is capacitively coupled with at least a part of the wirings, and the power source is connected to the ground layer so that the ground layer serves as the second electrode portion.

6. The circuit board testing apparatus according to claim 3, further comprising a connector which connects the DC power source to a terminal connected with one of the plurality of wirings of the circuit board to be tested so that the terminal serves as the first electrode for trapping the discharged electrons.

7. The circuit board testing apparatus according to claim 3, wherein the circuit board to be tested includes a ground layer which is capacitively coupled with at least a part of the wirings, and the apparatus further comprising a connector which connects the DC power source to a terminal connected with one of the plurality of wirings of the circuit board to be tested so that the terminal serves as the first electrode for trapping the discharged electrons, and connects the DC power source to the ground layer so that the ground layer is capacitively coupled to at least a part of the selected wiring to thereby serve as the second electrode.

8. A circuit board testing apparatus for testing a plurality of wirings formed on a circuit board, the plurality of wirings including wirings having first terminals and second terminals and the first terminals of the wirings being exposed on one surface of the circuit board, comprising:
- an electromagnetic wave irradiator which collectively irradiates an electromagnetic wave onto the first terminals of the wirings to discharge electrons from the first terminals by photoelectric effect;
- a power source having a first pole and a second pole, a potential at the first pole being higher than another potential at the second pole;
- a switch arrangement for normally connecting the second terminals of all of the wirings with the first pole of the power source and connecting the second terminal of one of the wirings to the second pole of the power source while the electromagnetic wave irradiator irradiates the first terminals, and
- a current detector which detects an electric current that is caused by the electrons discharged from the first terminals trapped by the first terminals of the wirings other than a selected wiring connected with the second pole of the power source, and the electric current passes into the selected wiring; and
- a judger which judges at least one of continuity and short-circuit of the selected wiring based on a detected current.

9. The circuit board testing apparatus according to claim 8, further comprising a housing which encloses the first terminals of the plurality of wirings to comprise an airtight closed space, and a depressurizer which depressurizes the airtight closed space.

10. A method for testing a plurality of wirings formed on a circuit board, each wiring including a terminal formed on a surface of the circuit board and a conductive portion, which is formed on at least one surface of the circuit board and inside of the circuit board, and the conductive portion electrically connected to the terminal, the method comprising the steps:
- irradiating an electromagnetic wave onto the terminal of a wiring to discharge electrons from the terminal into a space by photoelectric effect;
- trapping the electrons discharged from the terminal by a first electrode having a higher electrical potential than that of the wiring and forming an electric current and allowing the electric current to pass into the wiring via a capacitive coupling formed by the wiring and a second electrode connected to the first electrode; and
- judging at least one of continuity and a short-circuit of the wiring based on the electric current flowing into the wiring;
- wherein a closed loop circuit is arranged that a current, due to electrons discharged by the photoelectric effect and trapped by the first electrode, flows through the closed loop circuit including a DC power source, the second electrode and the capacitive coupling, and returns to at least one of the plurality of wirings.

11. The method for testing a plurality of wirings on a circuit board as claimed in claim 10, wherein said step of irradiating the electromagnetic wave onto the terminal of the wiring to discharge the electrons from the terminal into the space which the electrons discharged from the terminal are air-tightly enclosed, and the method further comprising the step of depressurizing the closed space.

12. The method for testing a plurality of wirings on a circuit board as claimed in claim 10, further comprising the step of: passing an electric current into the circuit board including a ground layer capacitively coupled with the conductor of the target wiring, and connecting a power source to the ground layer to allow the electric current that passes into the conductive portion via the capacitive coupling to the ground layer.

13. A method for testing a plurality of wirings formed on a circuit board, the plurality of wirings including wirings having a first terminal and a second terminal formed on a surface of the circuit board and an electric conductor, which is formed on at least one of the surface of the circuit board and inside of the circuit board, and the electric conductor electrically connected to the first and second terminals, the method comprising the steps:

irradiating an electromagnetic wave onto the first terminal of a target wiring to discharge electrons from the first terminal into a space by photoelectric effect;

trapping the electrons discharged from the first terminal by a first electrode having a higher electric potential than that of the target wiring and forming a first electric current and allowing the first electric current into the electric conductor via a capacitive coupling of the electric conductor and a second electrode connected to the first electrode;

detecting the first electric current passing into the electric conductor while the first terminal is being irradiated;

irradiating an electromagnetic wave onto the second terminal of the target wiring to discharge electrons from the second terminal into the space by the photoelectric effect;

trapping the electrons discharged from the second terminal by the first electrode having a higher electrical potential than that of the target wiring and forming a second electric current and allowing the second electric current that passes into the electric conductor via capacitive coupling of the electric conductor and a second electrode;

detecting the second electric current passing into the electric conductor while the second terminal is being irradiated; and judging based on the first electric current and the second electric current the continuity between the first terminal and the second terminal;

wherein a closed loop circuit is arranged that a current, due to electrons discharged by the photoelectric effect and trapped by the first electrode, flows through the closed loop circuit including a DC power source, the second electrode and the capacitive coupling, and returns to at least one of the plurality of wirings.

14. The method for testing a plurality of wirings formed on a circuit board as claimed in claim 13, wherein said step of judging based on the first electric current includes integrating the second electric current and the first electric current and the second electric current, and judging the continuity between the first terminal and the second terminal based on a change of their respective integration for a time period.

15. A method for testing a circuit board formed with a plurality of wirings, each wiring including a terminal formed on a surface of the circuit board and an electric conductor, which is formed on the surface of the circuit board and inside of the circuit board, and the electric conductor electrically connected to the terminal, the electric conductor of all of the wirings being capacitively coupled with a second electrode, the method comprising the steps:

irradiating an electromagnetic wave onto the terminal of the first wiring to discharge electrons from the terminal into a space by photoelectric effect;

trapping the electrons discharged from the terminal of the first wiring by a first electrode having a higher electric potential than that of the target wiring and forming a first electric current and allowing the first electric current to pass into the electric conductor of the first wiring via a capacitive coupling of the electric conductors and the second electrode;

detecting the first electric current that passes through the electric conductor of the first wiring;

irradiating the electromagnetic wave onto the terminal of a second wiring to discharge electrons from the terminal of the second wiring into the space by the photoelectric effect;

trapping the electrons discharged from the terminal of the second wiring by the first electrode having a higher electrical potential than that of the second wiring and forming a second electric current and allowing the second electric current that passes through the electric conductor of the second wiring via capacitive coupling of electric conductors and the second electrode;

detecting the second electric current that passes through the electric conductor of the second wiring; and judging short-circuit between the first and second wirings based on the first electric current and second electric current;

wherein a closed loop circuit is arranged that a current, due to electrons discharged by the photoelectric effect and trapped by the first electrode, flows through the closed loop circuit including a DC power source, the second electrode and the capacitive coupling, and returns to at least one of the plurality of wirings.

16. A method for testing at least one of a continuity and short-circuit of a plurality of wirings formed on a circuit board, the plurality of wirings including wirings having a first terminal and a second terminal, and the first terminals of the wirings being exposed on one surface of the circuit board, the method comprising the steps of:

collectively irradiating an electromagnetic wave onto the first terminals of the wirings to discharge electrons from the first terminals by photoelectric effect;

selecting a wiring from the wirings;

trapping the electrons discharged from the first terminals by an electrode, while applying a voltage between the electrode and a selected wiring such that the voltage at the electrode is higher than that of the voltage at the selected wiring;

detecting an electric current passing through the selected wiring via the electrode; and judging at least one of continuity and a short-circuit of the selected wiring based on the electric current detected by said step of detecting an electric current;

wherein a closed loop circuit is arranged that a current, due to electrons discharged by the photoelectric effect and trapped by the first electrode, flows through the closed loop circuit including a DC power source, the second electrode and the capacitive coupling, and returns to at least one of the plurality of wirings.

17. The method for testing at least one of a continuity and a short-circuit of a plurality of wirings formed on a circuit board as claimed in claim 16, further comprising the step of enclosing the first terminals in an airtight closed space and depressurizing the closed space.

18. The method for testing at least one of a continuity and a short-circuit of a plurality of wirings formed on a circuit board as claimed in claim 16, further comprising the step of applying a voltage between the second terminal of the selected wiring and the second terminal of at least one of the wirings other than the selected wiring to detect a short-circuit between the selected wiring and the other wiring.

19. The method for testing at least one of a continuity and a short-circuit of a plurality of wirings formed on a circuit board as claimed in claim 16, further comprising the step of applying a voltage between the second terminal of a target wiring and the second terminal of at least one of the wirings other than the selected wiring to trap, by the first terminal of the other wiring, electrons discharged from the first terminal of the selected wiring.

* * * * *